United States Patent
Kim et al.

(10) Patent No.: US 12,426,243 B2
(45) Date of Patent: Sep. 23, 2025

(54) SEMICONDUCTOR MEMORY DEVICE AND METHOD OF FABRICATING THE SAME

(71) Applicant: Samsung Electronics Co., Ltd., Suwon-si (KR)

(72) Inventors: Eunjung Kim, Daegu (KR); Hyo-Sub Kim, Seoul (KR); Jay-Bok Choi, Yongin-si (KR); Yongseok Ahn, Seoul (KR); Junhyeok Ahn, Suwon-si (KR); Kiseok Lee, Hwaseong-si (KR); Myeong-Dong Lee, Seoul (KR); Yoonyoung Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 17/735,838

(22) Filed: May 3, 2022

(65) Prior Publication Data

US 2022/0384449 A1 Dec. 1, 2022

(30) Foreign Application Priority Data

May 27, 2021 (KR) .................. 10-2021-0068170
Aug. 25, 2021 (KR) .................. 10-2021-0112645

(51) Int. Cl.
*H10B 12/00* (2023.01)
(52) U.S. Cl.
CPC .......... *H10B 12/315* (2023.02); *H10B 12/34* (2023.02); *H10B 12/485* (2023.02)

(58) Field of Classification Search
CPC .. H10B 12/0335; H10B 12/05; H10B 12/315; H10B 12/34; H10B 12/485
See application file for complete search history.

(56) References Cited

U.S. PATENT DOCUMENTS

| | | | |
|---|---|---|---|
| 6,563,162 B2 | 5/2003 | Han et al. |
| 8,216,902 B2 | 7/2012 | Chang et al. |
| 8,309,460 B2 | 11/2012 | Kim et al. |
| 8,692,372 B2 | 4/2014 | Lee et al. |
| 8,916,447 B2 | 12/2014 | Park et al. |
| 8,964,442 B2 | 2/2015 | Lung |
| 9,018,691 B2 | 4/2015 | Chen et al. |
| 9,209,241 B2 | 12/2015 | Kim et al. |
| 9,214,382 B2 | 12/2015 | Lee et al. |
| 9,230,967 B2 | 1/2016 | Lee et al. |
| 9,293,336 B2 | 3/2016 | Yang et al. |
| 9,379,004 B1 | 6/2016 | Kwon et al. |

(Continued)

FOREIGN PATENT DOCUMENTS

| | | |
|---|---|---|
| KR | 100634167 B1 | 10/2006 |
| KR | 100750943 B1 | 8/2007 |

(Continued)

*Primary Examiner* — Meiya Li
(74) *Attorney, Agent, or Firm* — Muir Patent Law, PLLC

(57) ABSTRACT

A semiconductor memory device includes a device isolation pattern on a substrate and defining a first active section, a first storage node pad on the first active section, a word line in the substrate and extending across the first active section, a bit line on the first storage node pad and crossing over the word line, a storage node contact on one side of the bit line and adjacent to the first storage node pad, and an ohmic layer between the storage node contact and the first storage node pad. A bottom surface of the ohmic layer is rounded.

20 Claims, 78 Drawing Sheets

(56) References Cited

U.S. PATENT DOCUMENTS

| | | |
|---|---|---|
| 9,419,002 B2 | 8/2016 | Han et al. |
| 9,472,445 B2 | 10/2016 | Han et al. |
| 9,496,223 B2 | 11/2016 | Lee et al. |
| 10,304,680 B1 | 5/2019 | Lee et al. |
| 10,522,362 B2 | 12/2019 | Kim et al. |
| 10,566,332 B2 | 2/2020 | Wang et al. |
| 10,644,003 B2 | 5/2020 | Cho et al. |
| 10,790,150 B2 | 9/2020 | Kim et al. |
| 10,797,056 B2 | 10/2020 | Kim et al. |
| 10,978,397 B2 | 4/2021 | Kim et al. |
| 10,985,166 B2 | 4/2021 | Wang et al. |
| 11,349,069 B2 | 5/2022 | Chiang et al. |
| 2002/0110979 A1 | 8/2002 | Wang |
| 2005/0173753 A1 | 8/2005 | Kim et al. |
| 2008/0003866 A1* | 1/2008 | Bae .................. H01L 21/76831 439/417 |
| 2008/0093741 A1* | 4/2008 | Lee ...................... H10B 12/485 257/E23.141 |
| 2014/0061758 A1 | 3/2014 | Sim et al. |
| 2014/0112050 A1* | 4/2014 | Park ........................ H10B 12/48 365/72 |
| 2015/0035050 A1 | 2/2015 | Yeom et al. |
| 2015/0061134 A1* | 3/2015 | Lee ........................ H10B 12/34 257/751 |
| 2015/0124521 A1 | 5/2015 | Lim et al. |
| 2015/0333069 A1 | 11/2015 | Kim et al. |
| 2017/0271340 A1* | 9/2017 | Kim .................. H10B 12/0335 |
| 2019/0051654 A1 | 2/2019 | Chang et al. |
| 2019/0164975 A1 | 5/2019 | Song et al. |
| 2019/0198630 A1 | 6/2019 | Lee et al. |
| 2020/0203347 A1 | 6/2020 | Song et al. |
| 2020/0365537 A1 | 11/2020 | Choi et al. |
| 2020/0388618 A1 | 12/2020 | Ikeda |
| 2020/0395244 A1 | 12/2020 | Lee et al. |
| 2020/0395364 A1 | 12/2020 | Jung et al. |
| 2020/0402981 A1 | 12/2020 | Kim et al. |
| 2021/0035613 A1 | 2/2021 | Park et al. |
| 2021/0098460 A1 | 4/2021 | Lee et al. |

FOREIGN PATENT DOCUMENTS

| | | |
|---|---|---|
| KR | 1020140108951 A | 9/2014 |
| KR | 1020150015648 A | 2/2015 |
| KR | 1020150027363 A | 3/2015 |
| KR | 101753234 B1 | 7/2017 |
| KR | 101928310 B1 | 12/2018 |
| KR | 1020190109969 A | 9/2019 |
| TW | 201123429 A | 7/2011 |
| TW | 201426913 A | 7/2014 |
| TW | 201429014 A | 7/2014 |
| TW | 201432850 A | 8/2014 |
| TW | 201526159 A | 7/2015 |
| TW | 201740510 A | 11/2017 |
| TW | 201909341 A | 3/2019 |
| TW | 201928514 A | 7/2019 |
| TW | 201929199 A | 7/2019 |
| TW | 202125714 A | 7/2021 |

* cited by examiner

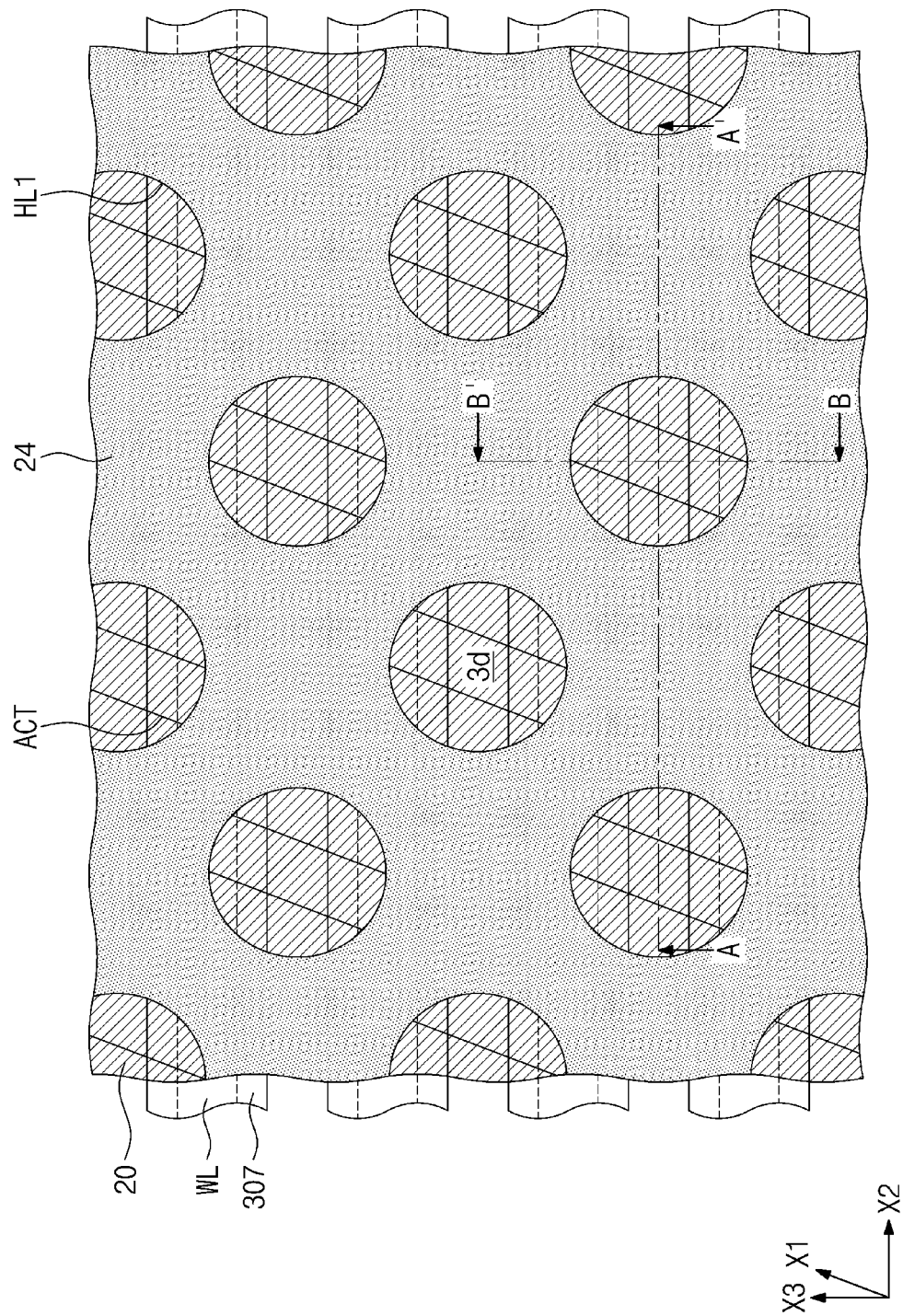

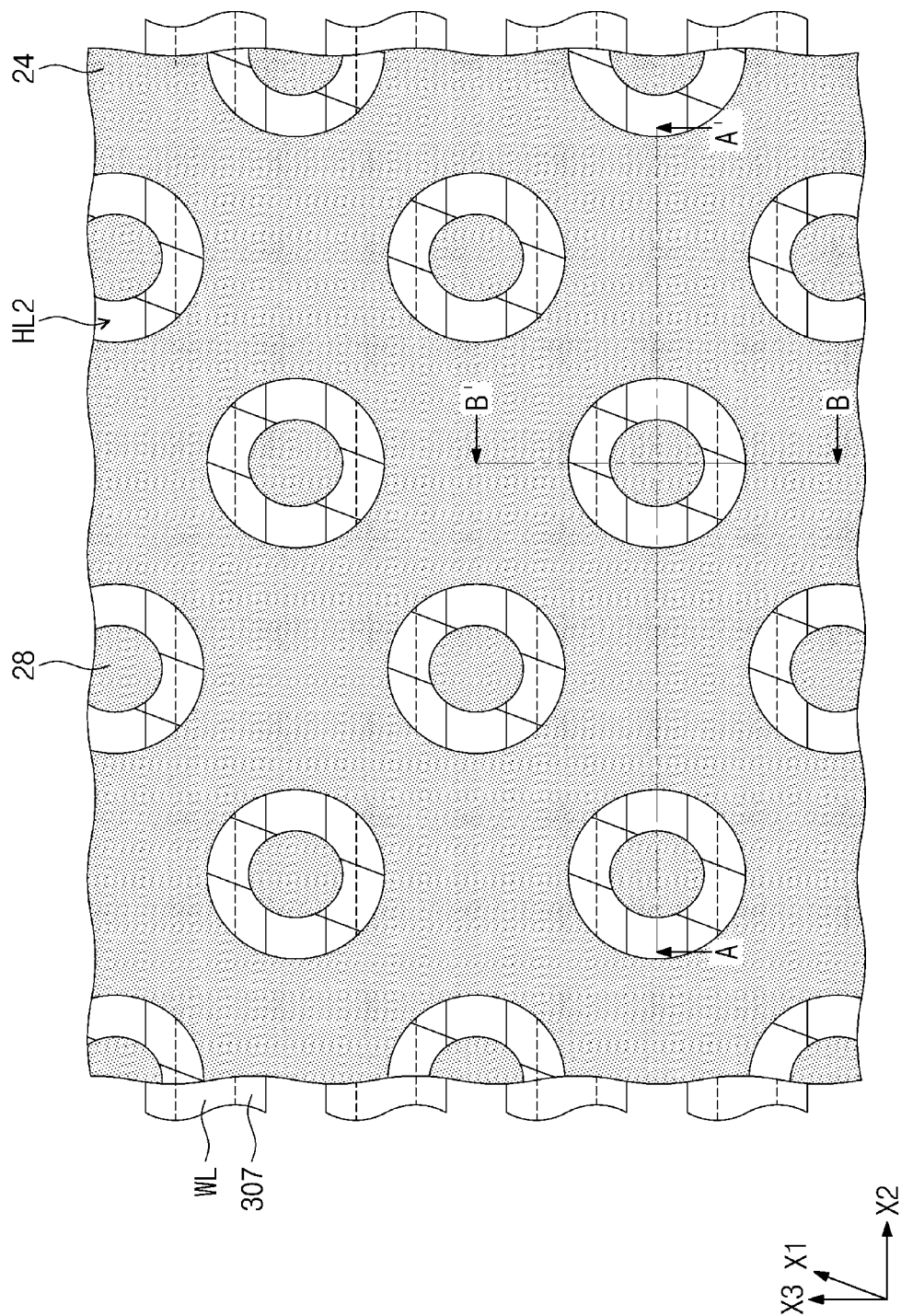

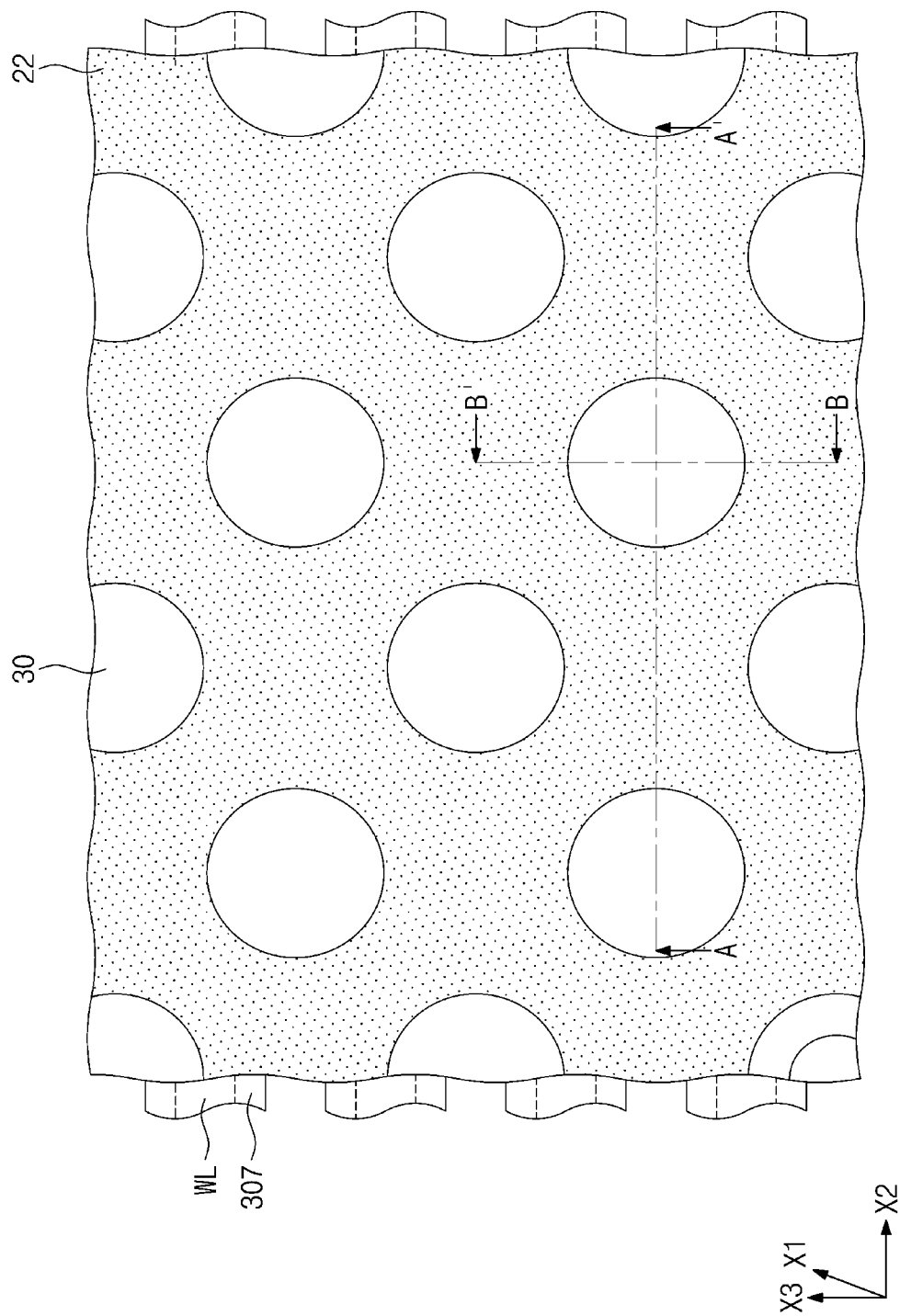

SEMICONDUCTOR MEMORY DEVICE AND METHOD OF FABRICATING THE SAME

CROSS-REFERENCE TO RELATED APPLICATIONS

This U.S. nonprovisional application claims priority under 35 U.S.C. § 119 to Korean Patent Application Nos. 10-2021-0068170 filed on May 27, 2021 and 10-2021-0112645 filed on Aug. 25, 2021 in the Korean Intellectual Property Office, the disclosures of each of which are hereby incorporated by reference in their entirety.

BACKGROUND

The present inventive concepts relate to a semiconductor memory device and a method of fabricating the same.

Semiconductor devices are beneficial in the electronic industry because of their small size, multi-functionality, and/or low fabrication cost. However, the semiconductor devices are being highly integrated with the remarkable development of the electronic industry. Line widths of patterns of semiconductor devices are being reduced for high integration. However, new exposure techniques and/or expensive exposure techniques are desirable for forming fine patterns of highly integrated semiconductor devices. Various studies have thus recently been conducted for new integration techniques.

SUMMARY

Some embodiments of the present inventive concepts provide a semiconductor memory device with increased reliability.

Some embodiments of the present inventive concepts provide a method of fabricating a semiconductor memory device, which method is capable of reducing defects.

According to some embodiments of the present inventive concepts, a semiconductor memory device may comprise: a device isolation pattern on a substrate and defining a first active section; a first storage node pad on the first active section; a word line in the substrate and extending across the first active section; a bit line on the first storage node pad and crossing over the word line; a storage node contact on one side of the bit line and adjacent to the first storage node pad; and an ohmic contact layer between the storage node contact and the first storage node pad. A bottom surface of the ohmic contact layer may be rounded.

According to some embodiments of the present inventive concepts, a semiconductor memory device may comprise: a device isolation pattern on a substrate and defining a first active section; a first storage node pad on the first active section; a word line in the substrate and extending across the first active section; a bit line on the first storage node pad and crossing over the word line; and a storage node contact on one side of the bit line and adjacent to the first storage node pad. The storage node contact may include a contact metal pattern and a contact diffusion barrier pattern that surrounds a sidewall of the contact metal pattern and a bottom surface of the contact metal pattern. A bottom surface of the contact diffusion barrier pattern may be rounded.

According to some embodiments of the present inventive concepts, a semiconductor memory device may comprise: a device isolation pattern on a substrate and defining first, second, and third active sections that are adjacent to each other side by side in a first direction; first, second, and third impurity regions on the first, second, and third active sections, respectively; a word line in the substrate and extending across the first and second active sections; a word-line capping pattern on the word line; a bit-line contact on the first active section; a bit line on the bit-line contact and crossing over the word line; a first storage node pad on the second active section; a second storage node pad on the third active section; a pad separation pattern between the first storage node pad and the second storage node pad; a buried dielectric pattern between the first storage node pad and an upper portion of the bit-line contact; and a contact dielectric pattern between the first storage node pad and a lower portion of the bit-line contact. The contact dielectric pattern may include or may be formed of a material whose dielectric constant is less than a dielectric constant of silicon nitride. The contact dielectric pattern may have a width between about 4 nm and about 10 nm.

According to some embodiments of the present inventive concepts, a method of fabricating a semiconductor memory device may comprise: forming on a substrate a device isolation pattern to define each of a plurality of active sections; removing an upper portion of the device isolation pattern to expose sidewalls of the plurality of active sections; forming in the active sections a plurality of first impurity regions and a plurality of second impurity regions; forming a conductive layer that covers the substrate; etching the conductive layer to form a plurality of first conducive patterns and a second conductive pattern, the plurality of first conductive patterns overlapping the plurality of first impurity regions, respectively, each first conductive pattern of the plurality of first conductive patterns being a circular shape, and the second conductive pattern overlapping the plurality of second impurity regions; forming a plurality of contact capping patterns that covers corresponding first conductive patterns; removing an upper portion of the second conductive pattern to reduce a thickness of the second conductive pattern; etching the second conductive pattern to form a plurality of storage node pads that overlap the plurality of second impurity regions, respectively; forming a pad separation pattern between two adjacent storage node pads of the plurality of storage node pads; forming a plurality of bit lines on the plurality of first conductive patterns; and etching the plurality of first conductive patterns below the bit lines to form a plurality of bit-line contacts.

According to some embodiments of the present inventive concepts, a method of fabricating a semiconductor memory device may comprise; forming on a substrate a device isolation pattern to define each of a plurality of active sections; forming in the plurality of active sections a plurality of first impurity regions and a plurality of second impurity regions; forming a conductive layer that covers an entire surface of the substrate; etching the conductive layer to form a plurality of conductive patterns that are spaced apart from each other, the plurality of conductive patterns overlapping the plurality of second impurity regions, the substrate and the device isolation pattern being partially exposed to a gap region between two adjacent conductive patterns of the plurality of conductive patterns; forming a pad separation pattern that fills the gap region, the pad separation pattern having a grid shape when viewed in a plan view and overlapping the plurality of first impurity regions; forming an interlayer dielectric layer on the conductive patterns and the pad separation pattern; partially etching the interlayer dielectric layer, the pad separation pattern, and the plurality of conductive patterns on the plurality of first impurity regions to form a contact hole that exposes the plurality of first impurity regions and to form a plurality of storage node pads; forming a contact dielectric pattern that covers an inner sidewall of the contact hole; forming a polysilicon layer that fills the contact hole; sequentially stacking a metal-containing layer and a capping layer on the polysilicon layer; and sequentially etching the capping layer, the metal-containing layer, and the polysilicon layer to form a bit line and a bit-line contact below the bit line.

BRIEF DESCRIPTION OF THE DRAWINGS

FIGS. 4A to 17A illustrate plan views showing a method of fabricating the semiconductor memory device of FIG. 1A.

FIGS. 4B, 4C, 5B to 13B, 13C, and 14B to 17B illustrate cross-sectional views showing a method of fabricating the semiconductor memory device of FIG. 1B.

FIGS. 23A to 33A illustrate plan views showing a method of fabricating a semiconductor memory device having the plan view of FIG. 21A.

FIGS. 23B to 27B, 27C, 28B to 33B illustrate cross-sectional views showing a method of fabricating the semiconductor memory device of FIG. 21B.

DETAILED DESCRIPTION OF EMBODIMENTS

Some embodiments of the present inventive concepts will now be described in detail with reference to the accompanying drawings to aid in clearly explaining the present inventive concepts.

Figure 1A:
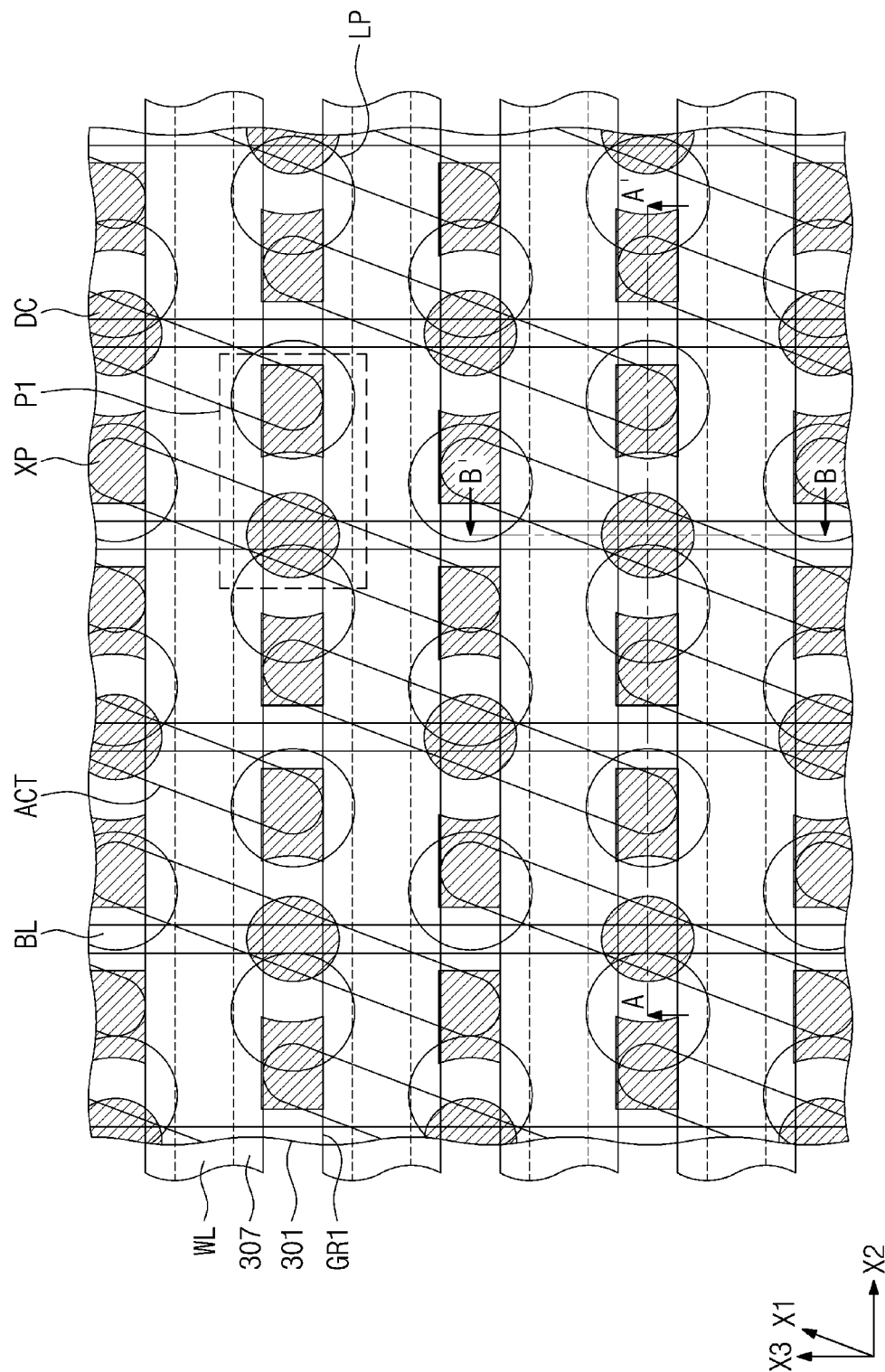
FIG. 1A illustrates a plan view showing a semiconductor memory device according to some embodiments of the present inventive concepts.
Figure 1B:
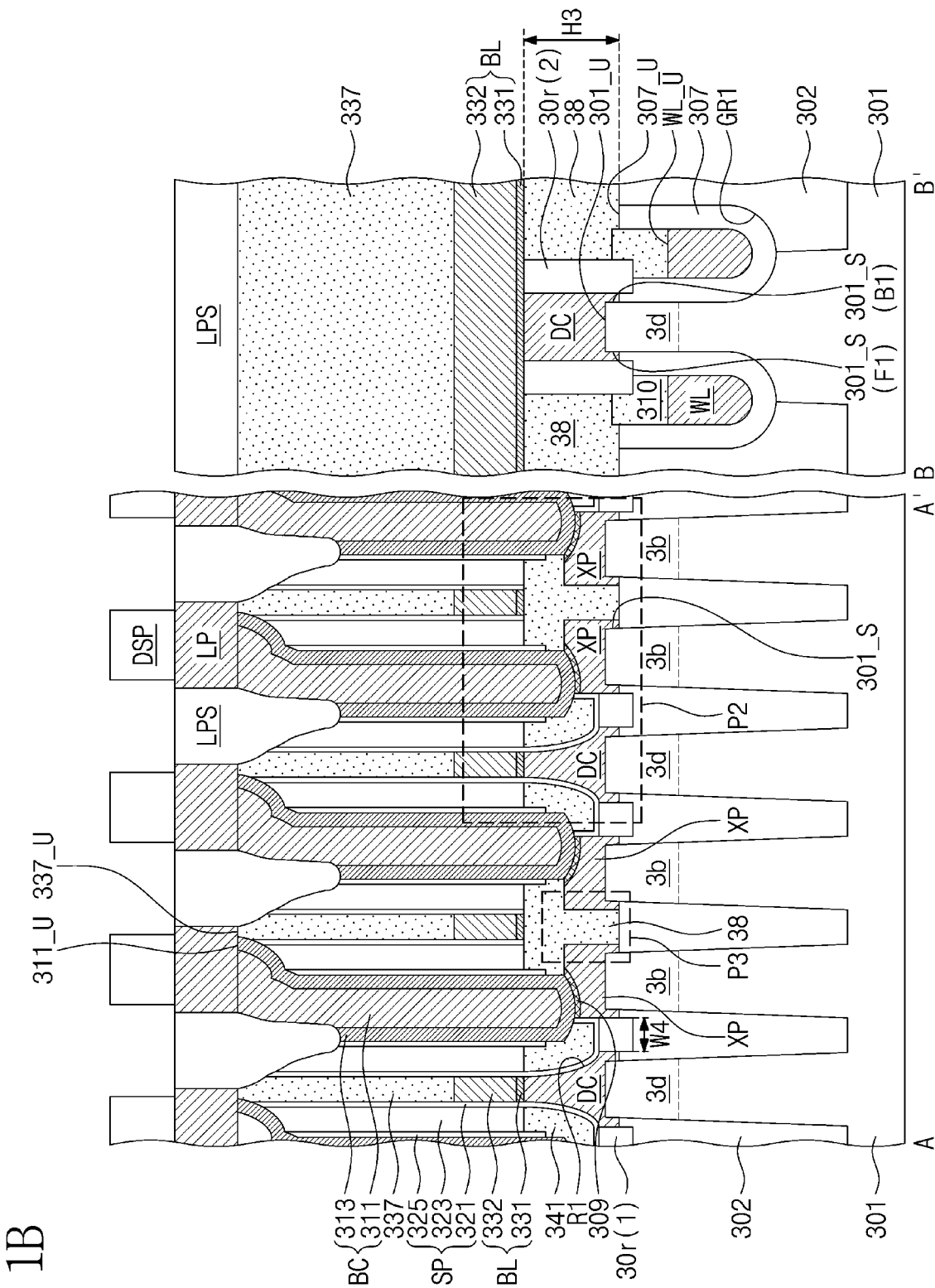
FIG. 1B illustrates a cross-sectional view taken along lines A-A' and B-B' of FIG. 1A.
Figure 2A:
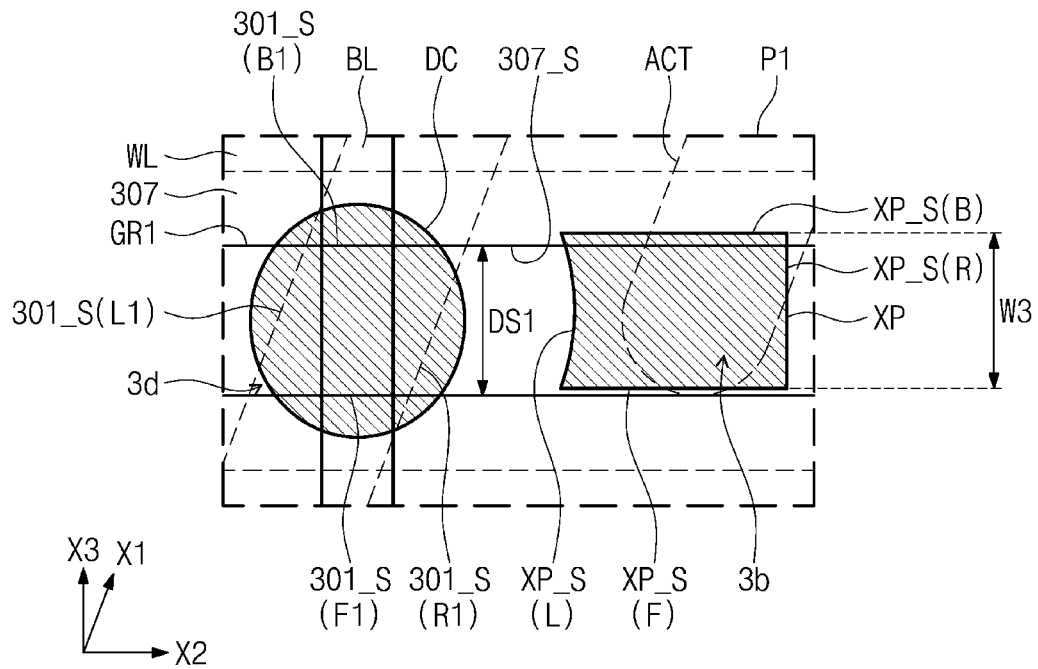
FIGS. 2A to 2C illustrate enlarged views showing section P1 of FIG. 1A.
Figure 2B:
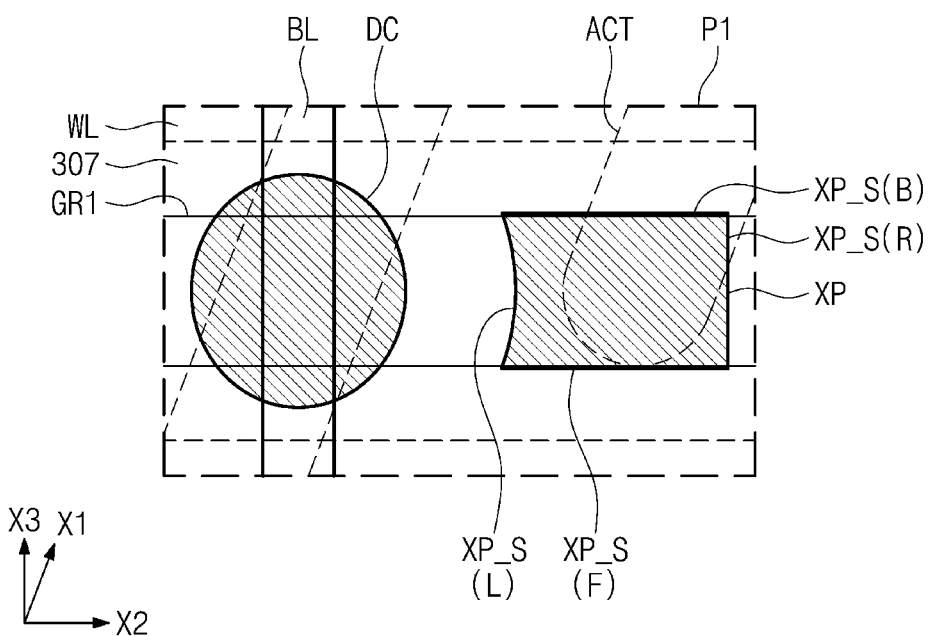
Figure 2C:
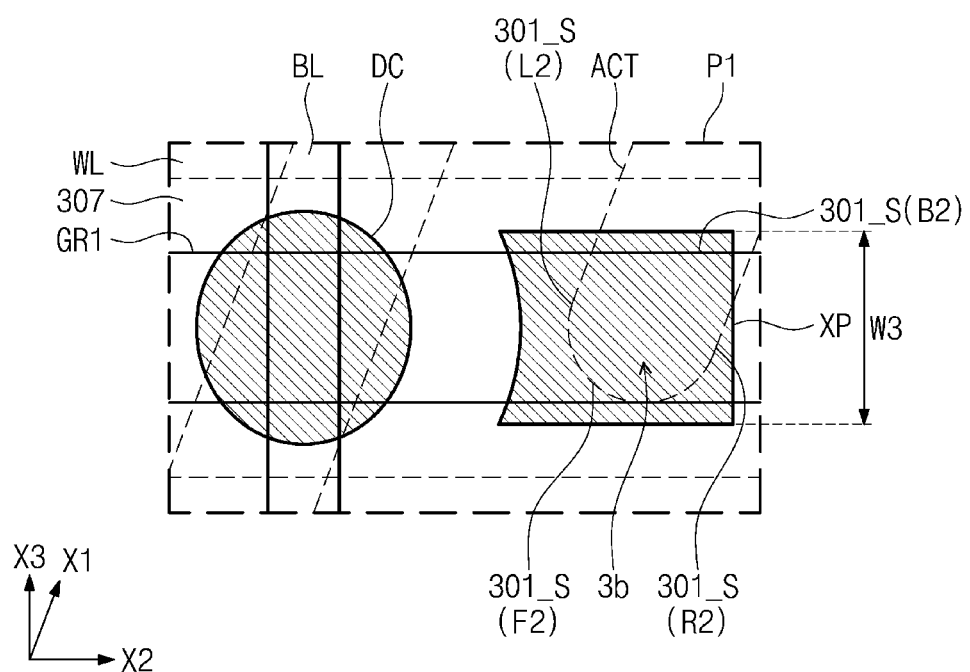
Figure 3A:
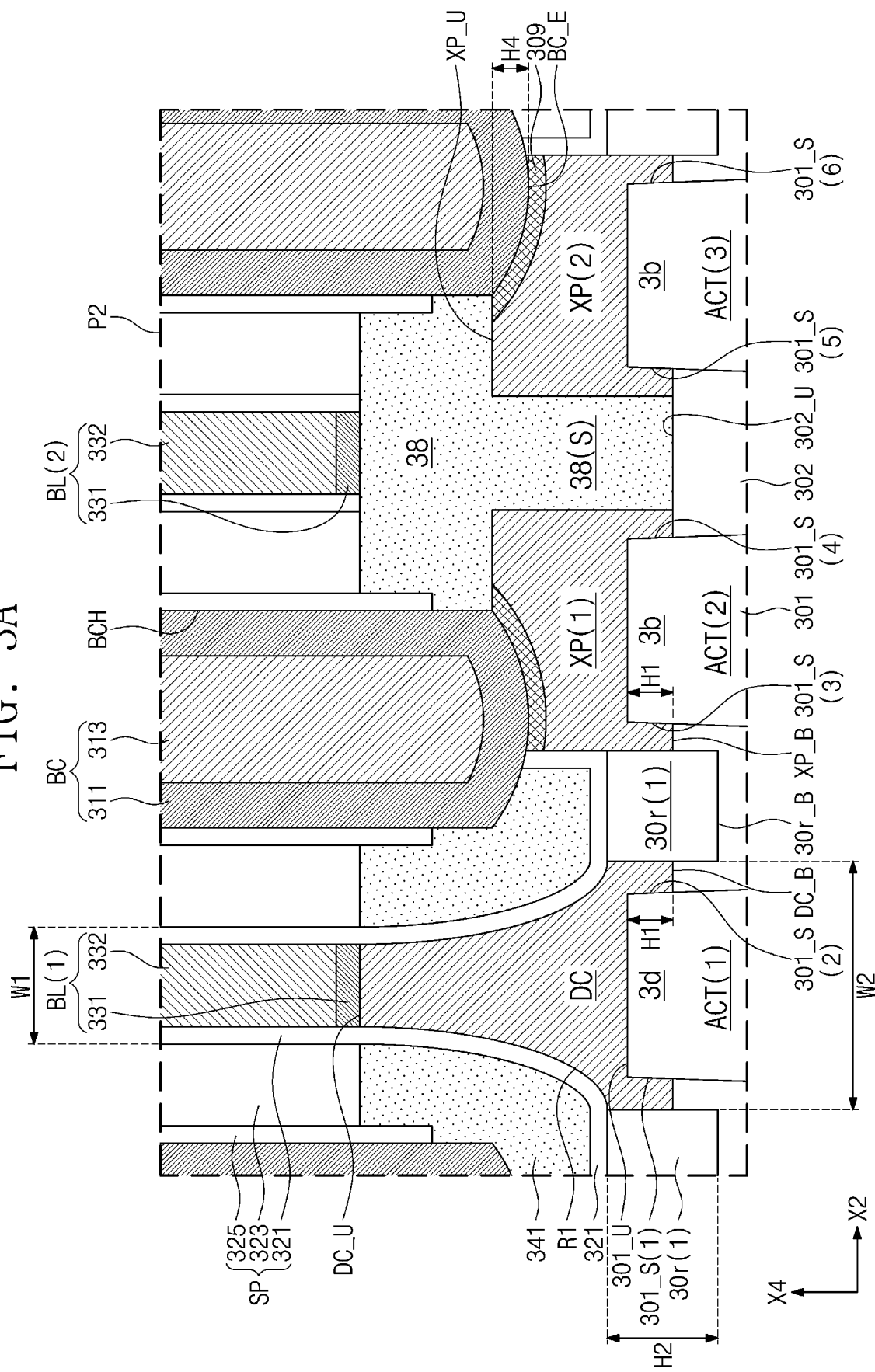
FIG. 3A illustrates an enlarged view showing section P2 of FIG. 1B.
Figure 3B:
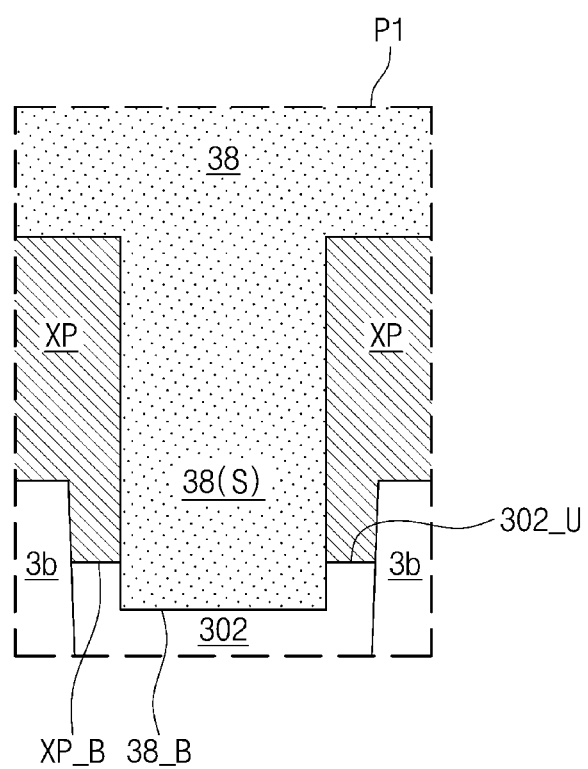
FIG. 3B illustrates an enlarged view showing section P3 of FIG. 1B.

FIG. 1A illustrates a plan view showing a semiconductor memory device according to some embodiments of the present inventive concepts. FIG. 1B illustrates a cross-sectional view taken along lines A-A' and B-B' of FIG. 1A. FIGS. 2A to 2C illustrate enlarged views showing section P1 of FIG. 1A. FIG. 3A illustrates an enlarged view showing section P2 of FIG. 1B. FIG. 3B illustrates an enlarged view showing section P3 of FIG. 1B.

Referring to FIGS. 1A and 1B, active sections ACT may be defined by device isolation patterns 302 disposed in a substrate 301. Each of the active sections ACT may have an isolated shape. Each of the active sections ACT may have a bar shape elongated along a first direction X1 when viewed in plan (i.e., when viewed in a plan view). When viewed in plan, the active sections ACT may correspond to portions of the substrate 301 that are surrounded by the device isolation patterns 302. The substrate 301 may include or may be formed of a semiconductor material. The active sections ACT may be arranged parallel to each other in the first direction X1, such that one of the active sections ACT may have an end adjacent to a central portion of a neighboring one of the active sections ACT. Each of the device isolation patterns 302 may have a single-layered or multi-layered structure formed of at least one selected from, for example, silicon oxide, silicon oxynitride, and silicon nitride.

The device isolation patterns 302 may have top surfaces 302_U lower than top surfaces 301_U of the active sections ACT (or of the substrate 301). Therefore, the device isolation patterns 302 may expose sidewalls 301_S of the active sections ACT (or of the substrate 301). The active sections ACT may have upper portions that protrude beyond the device isolation patterns 302.

Word lines WL may run across the active sections ACT. The word lines WL may be disposed in grooves GR1 formed in the device isolation patterns 302 and in the active sections ACT. The word lines WL may be parallel to a second direction X2 that intersects the first direction X1. The word lines WL may be formed of a conductive material. A gate dielectric layer 307 may be disposed between each of the word lines WL and an inner surface of each groove GR1. Although not shown, the grooves GR1 may have bottom surfaces located relatively deeper in the device isolation patterns 302 and relatively shallower in the active sections ACT. Each of the word lines WL may have a curved bottom surface. The gate dielectric layer 307 may include or may be formed of at least one selected from thermal oxide, silicon nitride, silicon oxynitride, and high-k dielectric, and for example may include or may be formed of thermal oxide. The gate dielectric layer 307 may have a top surface 307_U lower than the top surfaces 301_U of the active sections ACT (or of the substrate 301). For example, the top surface 307_U of the gate dielectric layer 307 may be located at the same level as that of the top surfaces 302_U of the device isolation patterns 302.

A first impurity region 3d may be disposed in the active section ACT between a pair of the word lines WL, and a pair of second impurity regions 3b may be disposed in opposite edge portions of each of the active sections ACT, respectively. The first and second impurity regions 3d and 3b may be doped with, for example, N-type impurities. The first impurity region 3d may correspond to a common drain region, and the second impurity regions 3b may correspond to source regions. A transistor may be constituted by each of the word lines WL and its adjacent first and second impurity regions 3d and 3b. As the word lines WL are disposed in the grooves GR1, each of the word lines WL may have thereunder a channel region whose length becomes increased within a limited planar area. Accordingly, short-channel effects may be minimized.

The word lines WL may have top surfaces WL_U lower than the top surfaces 301_U of the active sections ACT (or of the substrate 301). A word-line capping pattern 310 may be disposed on each of the word lines WL. The word-line capping patterns 310 may have linear shapes (i.e., straight line shapes) that extend along longitudinal directions of the word lines WL, and may cover entire top surfaces WL_U of the word lines WL. The grooves GR1 may have inner spaces not occupied by the word lines WL, and the word-line capping patterns 310 may fill the unoccupied inner spaces of the grooves GR1. The word-line capping pattern 310 may be formed of, for example, a silicon nitride layer. The word-line capping pattern 310 may have a top surface higher than the top surface 307_U of the gate dielectric layer 307 and/or than the top surfaces 302_U of the device isolation patterns 302.

Bit lines BL may be disposed on the substrate 301. The bit lines BL may run across the word-line capping patterns 310 and the word lines WL. As disclosed in FIG. 1A, the bit lines BL may be parallel to a third direction X3 that intersects the first and second directions X1 and X2. The bit line BL may include or may be formed of a bit-line diffusion barrier pattern 331 and a bit-line wire pattern 332 that are sequentially stacked. The bit-line diffusion barrier pattern 331 may include or may be formed of at least one selected from titanium, titanium nitride (TiN), titanium silicon nitride (TiSiN), tantalum, tantalum nitride, and tungsten nitride. The bit-line wire pattern 332 may include or may be formed of metal, such as tungsten, aluminum, copper, ruthenium, and iridium. Although not shown, the bit line BL may further include a polysilicon pattern below the diffusion barrier pattern 331, which polysilicon pattern is doped with impurities. A bit-line capping pattern 337 may be disposed on each of the bit lines BL. The bit-line capping patterns 337 may be formed of a dielectric material, such as a silicon nitride layer.

A bit-line contact DC may be disposed between the bit line BL and the active section ACT with the first impurity region 3d. The bit-line contact DC may include or may be formed of, for example, impurity-doped polysilicon. The bit-line contact DC may have a circular or oval shape when viewed in plan as shown in FIGS. 2A to 2C. The bit-line contact DC may have a planar area greater than that of a location where a single bit line BL and a single first impurity region 3d overlap each other. The planar area of the bit-line contact DC may be greater than that of a single first impurity region 3d.

As shown in FIG. 2A, the active section ACT with the first impurity region 3d may have four substrate sidewalls 301_S, for example, a first substrate right sidewall 301_S(L1), a first substrate rear sidewall 301_S(B1), a first substrate left sidewall 301_S(R1), and a first substrate front sidewall 301_S(F1), which four substrate sidewalls 301_S are arranged in a clockwise direction, and upper portions of the four substrate sidewalls 301_S may be exposed without being covered with the device isolation pattern 302 or the gate dielectric layer 307. The bit-line contact DC may cover the exposed first substrate right, rear, left, and front sidewalls 301_S(L1), 301_S(B1), 301_S(R1), and 301_S(F1).

Referring to FIGS. 1B and 3A, the bit-line contact DC may have a first width W1 at a top surface DC_U of the bit-line contact DC. The bit-line contact DC may have at its lower portion a second width W2 greater than the first width W1. The bit-line contact DC may have a width that increases in a direction from an upper portion of the bit-line contact DC toward a lower portion thereof. The bit-line contact DC may have a bottom end DC_B located at a level which is a first height H1 downwardly away from the top surface 301_U of the substrate 301. The top surface DC_U of the bit-line contact DC may be located at substantially the same level as that of a top surface of the pad separation pattern 38.

In the present inventive concepts, a contact area between the bit-line contact DC and the active section ACT with the first impurity region 3d may increase, and accordingly a contact resistance may be reduced between the bit-line contact DC and the active section ACT (or the first impurity region 3d), with the result that a semiconductor memory device may operate at high speed and low power.

A storage node pad XP may be disposed on the active section ACT with the second impurity region 3b. The storage node pad XP may include or may be formed of, for example, impurity-doped polysilicon. When viewed in plan as shown in FIGS. 2A to 2C, the storage node pad XP may have a shape similar to a rectangular shape. The storage node pad XP may have a pad left sidewall XP_S(L), a pad rear sidewall XP_S(B), a pad right sidewall XP_S(R), and a pad front sidewall XP_S(F) that are arranged in a clockwise direction. The pad left sidewall XP_S(L) of the storage node pad XP may be recessed in a direction (e.g., the second direction X2) away from the bit-line contact DC adjacent to the pad left sidewall XP_S(L). When viewed in plan, the pad rear sidewall XP_S(B) and the pad front sidewall XP_S(F) may not align with (or overlap) an inner sidewall of the groove GR1 or an outer sidewall 307_S of the gate dielectric layer 307 as shown in FIGS. 2A and 2C, or may align with (or overlap) the inner sidewall of the groove GR1 or the outer sidewall 307_S of the gate dielectric layer 307 as shown in FIG. 2B.

The storage node pad XP may have a third width W3 in the third direction X3. The third width W3 may be the same as or greater than an interval DS1 between neighboring grooves GR1. The storage node pad XP may have a planar area greater than that of a single second impurity region 3b. The storage node pad XP may cover at least two sidewalls (see 301_S(3) and 301_S(4) of FIG. 3A) of the active section ACT with the second impurity region 3b. The sidewalls of the active section ACT are opposite to each other in the second direction X2.

Referring to FIG. 2C, the active section ACT with the second impurity region 3b may have a second substrate right sidewall 301_S(L2), a second substrate rear sidewall 301_S(B2), a second substrate left sidewall 301_S(R2), and a second substrate front sidewall 301_S(F2) that are arranged in a clockwise direction, and upper portions of the sidewalls 301_S(L2), 301_S(B2), 301_S(R2), and 301_S(F2) may be exposed without being covered with the device isolation pattern 302 or the gate dielectric layer 307. The second substrate front sidewall 301_S(F2) may be rounded. As shown in FIG. 2C, the storage node pad XP may cover all of the second substrate right, rear, left, and front sidewalls 301_S(L2), 301_S(B2), 301_S(R2), and 301_S(F2). In the present inventive concepts, a contact area between the storage node pad XP and the active section ACT with the second impurity region 3b may increase, and accordingly a contact resistance may be reduced between the storage node pad XP and the active section ACT (or the second impurity region 3b), with the result that a semiconductor memory device may operate at high speed and low power.

The storage node pad XP may have a bottom end XP_B located at a level which is the first height H1 downwardly away from the top surface 301_U of the substrate 301. The bottom end XP_B of the storage node pad XP and the bottom end DC_B of the bit-line contact DC may be located at the same level, or a position which is the first height H1 downwardly away from the top surface 301_U of the substrate 301. The storage node pad XP may have a top surface XP_U lower than the top surface DC_U of the bit-line contact DC. A contact dielectric pattern 30r may be interposed between the bit-line contact DC and its adjacent storage node pad XP. The contact dielectric pattern 30r may include or may be formed of a material, such as silicon oxide, whose dielectric constant is less than that of silicon nitride. Therefore, insulating properties of the contact dielectric pattern 30r may be increased (i.e., the dielectric constant of the contact dielectric pattern 30r may be lowered) to reduce inference (i.e., coupling) between the bit-line contact DC and the storage node pad XP, and thus it may be possible to improve BBD (bit line to buried contact disturb) characteristics and to increase reliability of a semiconductor memory device.

The spacer liner 321 may include or may be formed of silicon nitride, silicon oxide, or silicon oxynitride. For example, the spacer liner 321 may include or may be formed of silicon oxide.

Figure 12A:
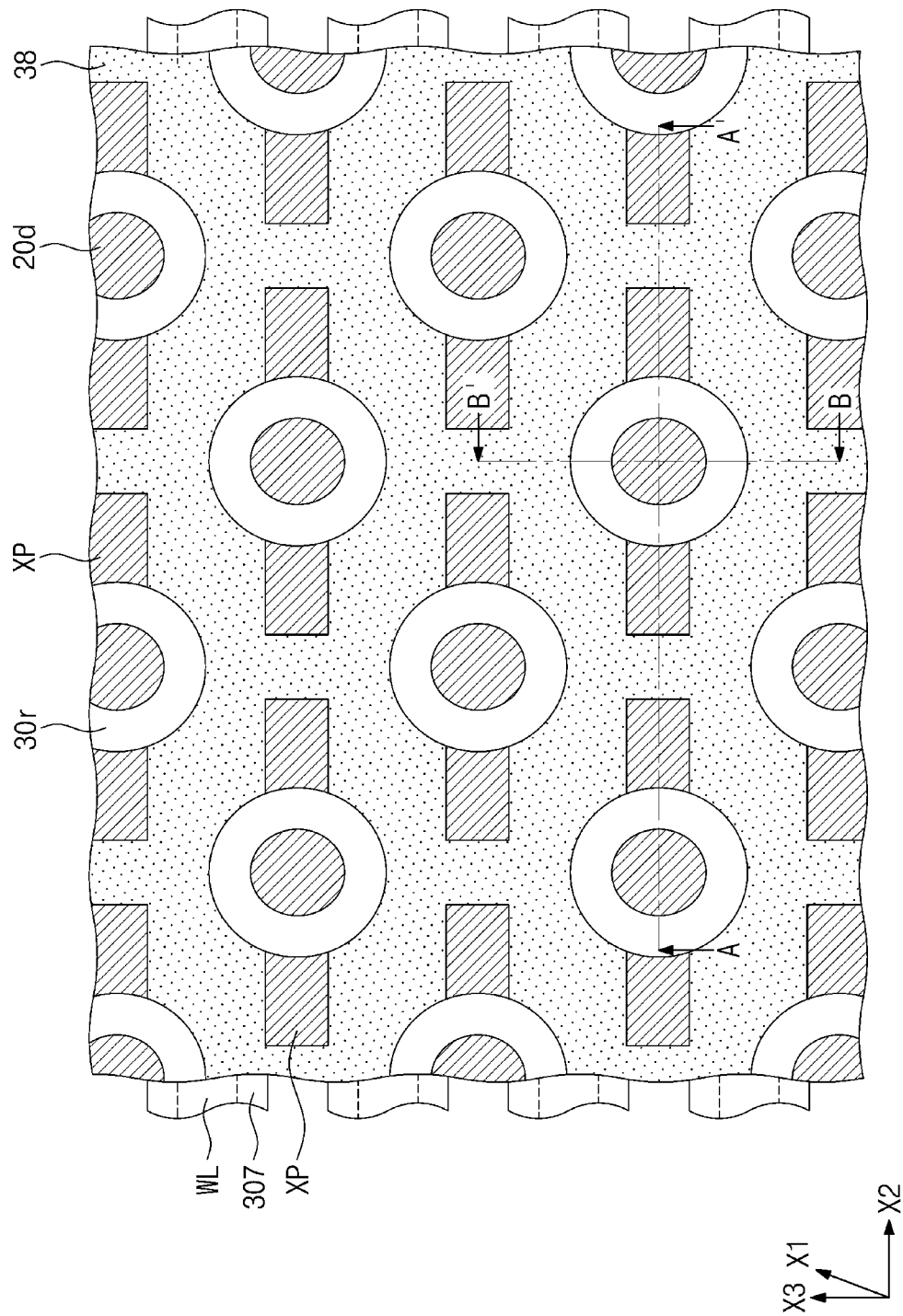
Figure 12B:
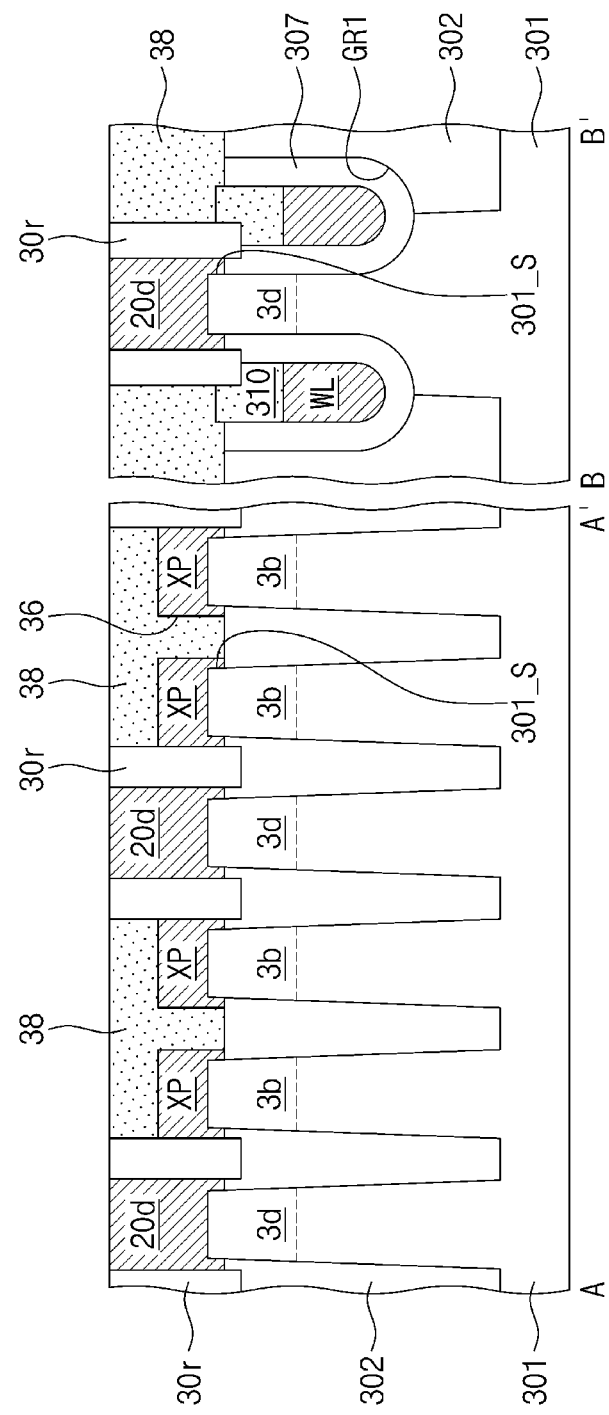

When viewed in plan, the contact dielectric pattern 30r may have a doughnut or annular shape as shown in FIG. 12A and may surround the bit-line contact DC. A portion of the contact dielectric pattern 30r may extend downwardly from the bit line BL as shown in the cross-sectional view of line B-B' in FIG. 1B. The contact dielectric pattern 30r may have a first dielectric part 30r(1) between the bit-line contact DC and its adjacent storage node pad XP, and may also include a second dielectric part 30r(2) below the bit line BL. The first dielectric part 30r(1) may have a second height H2. The second dielectric part 30r(2) may have a third height H3 greater than that second height H2. The contact dielectric pattern 30r may be in contact with a bottom surface of the bit line BL. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The contact dielectric pattern 30r may have a fourth width W4 as shown in FIG. 1B. The fourth width W4 may correspond to an interval between the bit-line contact DC and its adjacent storage node pad XP. The fourth width W4 may be called a thickness of the contact dielectric pattern 30r. The fourth width W4 may range, for example, from about 4 nm to about 10 nm (i.e., may have a width between about 4 nm and about 10 nm). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The contact dielectric pattern 30r may have a bottom surface 30r_B located at a level the same as or lower than that of the top surface 302_U of the device isolation pattern 302. The bottom surface 30r_B of the contact dielectric pattern 30r may be located at a level the same as or lower than that of the top surface 307_U of the gate dielectric layer 307. The bottom surface 30r_B of the contact dielectric pattern 30r may be located at a level the same as or lower than that of the top surface of the word-line capping pattern 310.

The bit line BL and the bit-line capping pattern 337 may have sidewalls covered with a bit-line spacer SP. The bit-line spacer SP may include a spacer liner 321, a first spacer 323, and a second spacer 325 that are sequentially arranged along a direction away from the sidewalls of the bit line BL and the bit-line capping pattern 337. The spacer liner 321, the first spacer 323, and the second spacer 325 may independently include or may be formed one of silicon oxide, silicon nitride, silicon oxynitride, and silicon oxycarbide (SiOC). The spacer liner 321 and the first spacer 323 may include or may be formed of the same material as each other, for example, silicon oxide. In some embodiments, the spacer liner 321 may include or may be formed of a material having etch selectivity with respect to the first spacer 323, and the spacer liner 321 may include or may be formed of silicon nitride and the first spacer 323 may include or may be formed of silicon oxide. The second spacer 325 may include or may be formed of a dielectric material, such as silicon nitride, having etch selectivity with respect to the first spacer 323.

The spacer liner 321 may include or may be formed of, for example, silicon oxide. Because silicon oxide has a dielectric constant less than that of silicon nitride, insulating properties of the bit-line spacer SP may increase as a ratio of silicon nitride becomes smaller in the bit-line spacer SP and as a ratio of silicon oxide becomes larger in the bit-line spacer SP. In some embodiments of the present inventive concepts, because the spacer liner 321 includes or is formed of silicon oxide, insulating properties of the bit-line spacer SP may increase (i.e., the dielectric constant of the spacer liner 321 may be lowered) to reduce interference between the bit line BL and a storage node contact BC which will be discussed below. Therefore, it may be possible to improve the BBD characteristics and to increase reliability of a semiconductor memory device.

A recess region R1 may be defined by a sidewall of the bit-line contact DC, a top surface of the contact dielectric pattern 30r, and a sidewall of the storage node pad XP. The spacer liner 321 may extend to conformally cover inner sidewalls and a bottom surface of the recess region R1, or the sidewall of the bit-line contact DC, the top surface of the contact dielectric pattern 30r, and the sidewall of the storage node pad XP. The spacer liner 321 may be provided thereon with a buried dielectric pattern 341 that fills the recess region R1. The second spacer 325 may have a bottom end lower than that of the first spacer 323.

Referring to FIG. 3A, a first active section ACT(1), a second active section ACT(2), and a third active section ACT(3) may be linearly arranged along the second direction X2. The first active section ACT(1) may have a first substrate sidewall 301_S(1) and a second substrate sidewall 301_S(2) that are opposite to each other and are exposed without being covered with the device isolation pattern 302. The first impurity region 3d may be formed in the first active section ACT(1). The bit-line contact DC may cover the first substrate sidewall 301_S(1), the second substrate sidewall 301_S(2), and a top surface of the first active section ACT(1). The second active section ACT(2) may have a third substrate sidewall 301_S(3) and a fourth substrate sidewall 301_S(4) that are opposite to each other and are exposed without being covered with the device isolation pattern 302. A first storage node pad XP(1) may cover the third substrate sidewall 301_S(3), the fourth substrate sidewall 301_S(4), and a top surface of the second active section ACT(2). The third active section ACT(3) may have a fifth substrate sidewall 301_S(5) and a sixth substrate sidewall 301_S(6) that are opposite to each other and exposed without being covered with the device isolation pattern 302. A second storage node pad XP(2) may cover the fifth substrate sidewall 301_S(5), the sixth substrate sidewall 301_S(6), and a top surface of the third active section ACT(3). It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

A pad separation pattern 38 may be interposed between neighboring storage node pads XP, for example, between the first storage node pad XP(1) and the second storage node pad XP(2) that are shown in FIG. 3A. The pad separation pattern 38 may extend to cover a top surface of the first storage node pad XP(1) and a top surface XP_U of the second storage node pad XP(2). The pad separation pattern 38 may have a separation part 38(S) positioned between the first storage node pad XP(1) and the second storage node pad XP(2). The pad separation pattern 38 may include or may be formed of a dielectric material, for example, silicon nitride. As shown in FIG. 3A, the pad separation pattern 38 may have a bottom surface 38_B located at a level the same as or lower than that of the top surface 302_U of the device isolation pattern 302. For example, a portion of the pad separation pattern 38 may protrude into the device isolation pattern 302. The bottom surface 38_B of the pad separation pattern 38 may be located at a level the same as or lower than that of the bottom end XP_B of the storage node pad XP, as shown in FIG. 3A or 3B.

As illustrated in the cross-sectional view of line B-B' in FIG. 1B, the pad separation pattern 38 may also be disposed below the bit line BL and may be in contact with a sidewall of the second dielectric part 30r(2) included in the contact dielectric pattern 30r, the top surface of the word-line capping pattern 310, the top surface 307_U of the gate dielectric layer 307, and the top surface 302_U of the device isolation pattern 302. The pad separation pattern 38 may be in contact with the bottom surface of the bit line BL.

As shown in FIG. 3A, a first bit line BL(1) may be positioned on the bit-line contact DC that covers the first impurity region 3d of the first active section ACT(1). A second bit line BL(2) adjacent to the first bit line BL(1) may be positioned on the pad separation pattern 38, and may vertically overlap the separation part 38(S).

Figure 17A:
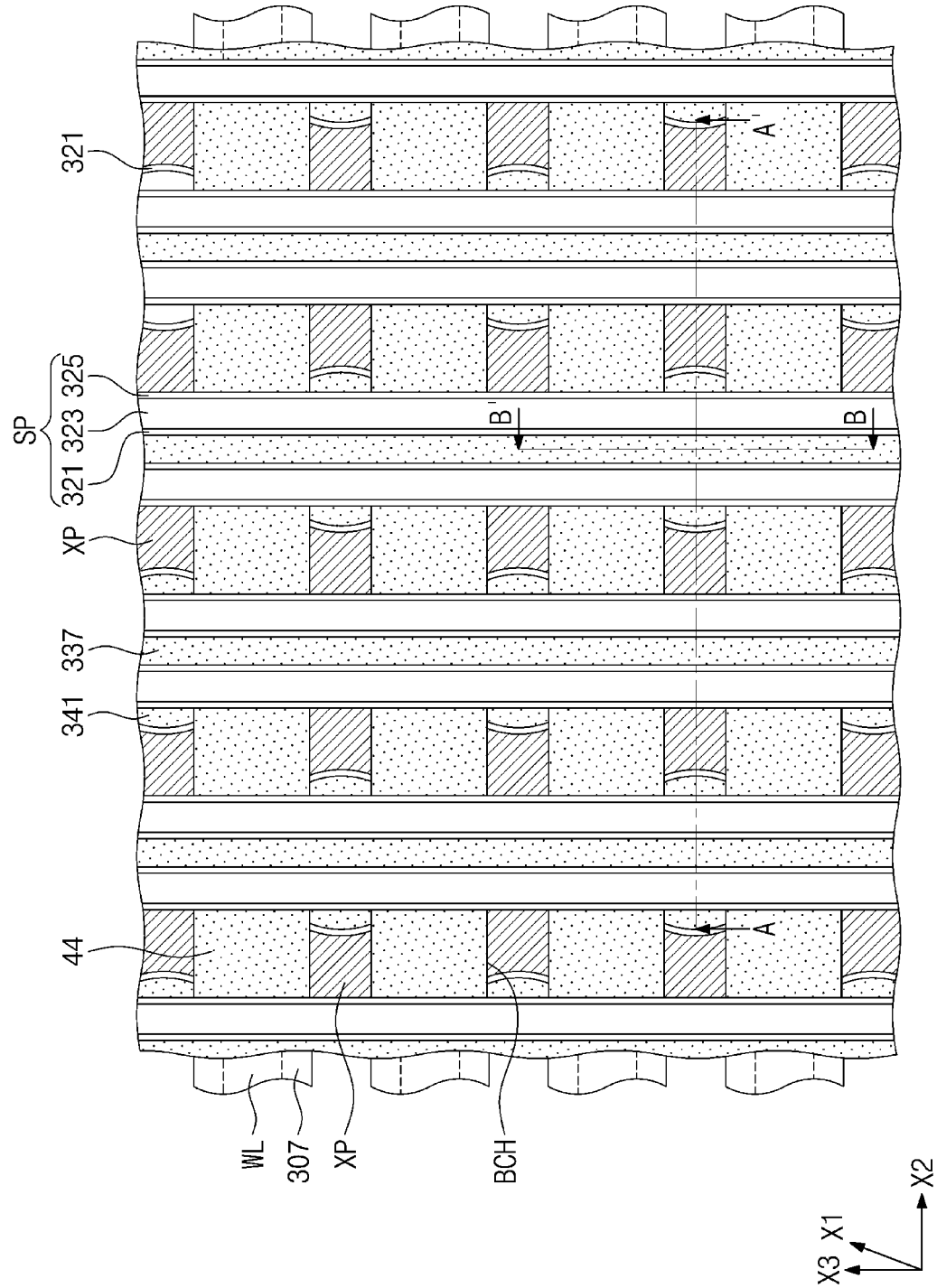
Figure 17B:
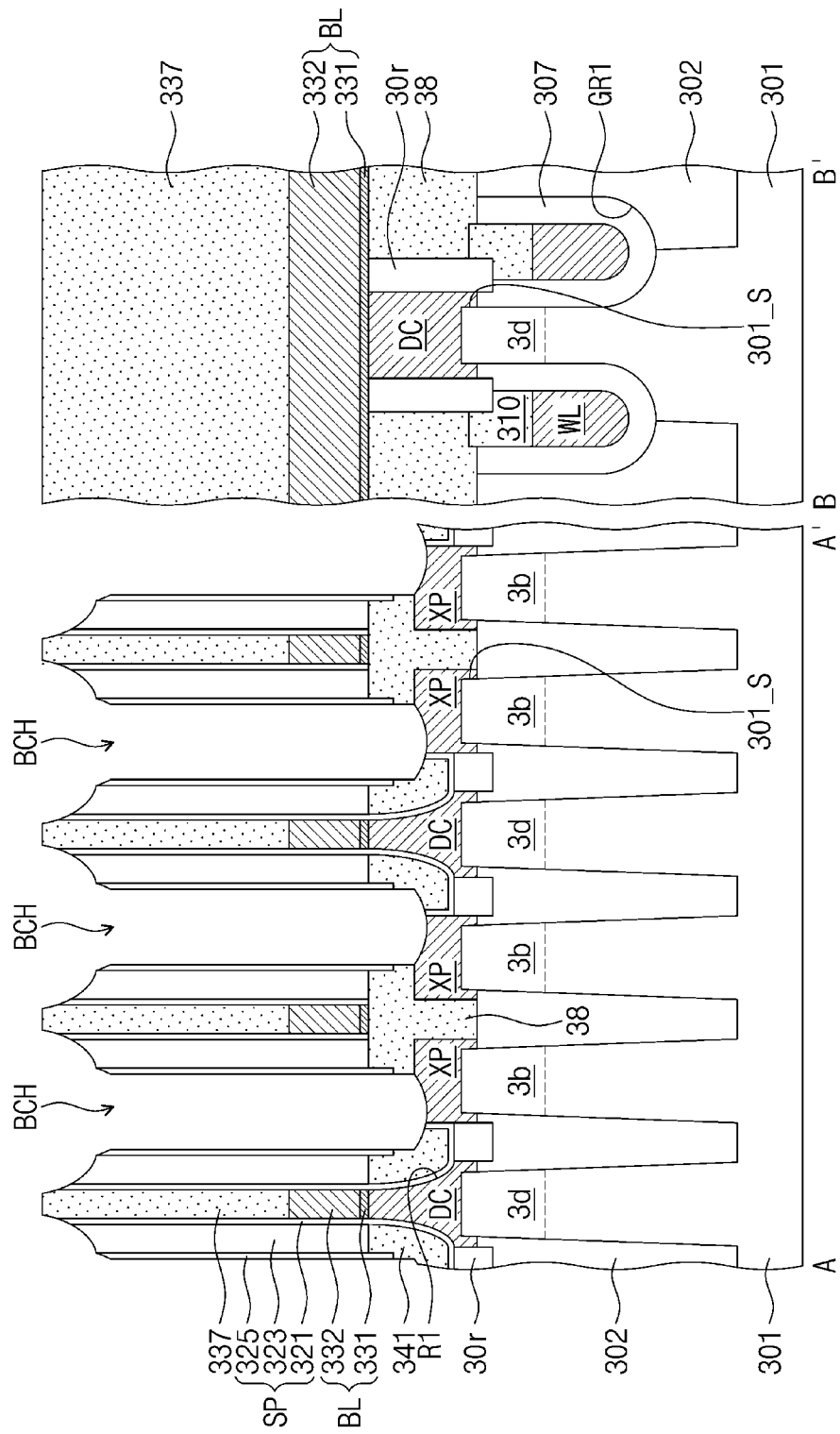

A storage node contact BC may be interposed between neighboring bit lines BL, for example, between the first bit line BL(1) and the second bit line BL(2) that are shown in FIG. 3A. The storage node contact BC may be disposed in a storage node contact hole BCH between neighboring bit lines BL. Although not shown in FIGS. 1A and 1B, a plurality of node separation patterns 44 may be disposed between neighboring bit-line spacers SP as illustrated in FIGS. 17A and 17B. The node separation patterns 44 may be linearly arranged and spaced apart from each other between the bit-line spacers SP. The node separation patterns 44 may overlap the word lines WL. The storage node contact holes BCH may be defined between the bit-line spacers SP and between the node separation patterns 44. The node separation patterns 44 may include or may be formed of a dielectric material, for example, silicon oxide.

The storage node contact BC may include or may be formed of a contact metal pattern 313 and a contact diffusion barrier pattern 311 that surrounds a sidewall and a bottom surface of the contact metal pattern 313. The contact diffusion barrier pattern 311 may have a uniform thickness regardless of position or may conformally cover a sidewall and a bottom surface of the storage node contact hole BCH. All of the contact metal pattern 313 and the contact diffusion barrier pattern 311 may include metal. The contact diffusion barrier pattern 311 may include or may be formed of, for example, at least one selected from titanium, titanium nitride (TiN), titanium silicon nitride (TiSiN), tantalum, tantalum nitride, and tungsten nitride. The contact metal pattern 313 may include or may be formed of, for example, tungsten, aluminum, or copper. The contact diffusion barrier pattern 311 may have a rounded bottom surface. The contact metal pattern 313 may also have a rounded bottom surface. The rounded bottom surface of the contact metal pattern 313 may increase a contact surface between the storage node pad XP and the contact metal pattern 313, and may lower a contact resistance therebetween.

In the present inventive concepts, the storage node pad XP may be in contact with the sidewalls 301_S of the substrate 301, and as a result a contact resistance may be remarkably reduced between the storage node contact BC and the second impurity region 3b. In some embodiments, the storage node contact BC may exclude silicon such as polysilicon. For example, the storage node contact BC may include a conductive material such as metal and a metal nitride, which is free of silicon. For example, the storage node contact BC may be formed of metal such as at least one selected from titanium, titanium nitride (TiN), titanium silicon nitride (TiSiN), tantalum, tantalum nitride, and tungsten nitride, and a metal nitride such as tungsten, aluminum, and copper. In some embodiments, the storage node contact BC may include a polysilicon pattern below the contact diffusion barrier pattern 311, but the polysilicon pattern may have a relatively small size or a relatively thin layer compared to a thickness of the contact metal pattern 313. An increase in amount of polysilicon in the storage node contact BC may increase a possibility of the occurrence of voids in the storage node contact BC, and therefore a high-temperature annealing process may be required to remove the voids. The annealing process may increase the occurrence of process defects on parts other than the storage node contact BC.

An increase in amount of polysilicon in the storage node contact BC may allow the storage node contact BC to have an electrical resistance relatively greater than that of metal, tRDL (last data into row free charge time) defects may become greater. A high-temperature annealing process may be performed to reduce a resistance of polysilicon. The high-temperature annealing may form voids at an interface between a substrate (or storage node pad) and a storage node contact made of polysilicon, with the result that tRDL defects may become greater.

In contrast, according to the present inventive concepts, because the storage node contact BC does not include silicon such as polysilicon and includes metal, an electrical resistance may be reduced such that it is possible to suppress tRDL defects, and a high-temperature annealing process may not be required such that it is possible to achieve simplification of fabrication process.

In some embodiments of the present inventive concepts, because the storage node contact BC does not include silicon such as polysilicon and includes metal, processes (e.g., metal deposition) other than the annealing process may be performed at low temperatures. Therefore, process defects may be reduced or prevented. The low-temperature processes may use silicon oxide to form the spacer liner 321, and thus the bit-line spacer SP may increase in insulating properties.

The storage node contact BC may have a bottom end BC_E lower than the top surface XP_U of the storage node pad XP. The bottom end BC_E of the storage node contact BC may be located at a level which is a fourth height H4 downwardly away from the top surface XP_U of the storage node pad XP. The bottom end BC_E of the storage node contact BC may be lower than the bottom end of the second spacer 325. An ohmic contact layer 309 may be interposed between the storage node contact BC and the storage node pad XP. The ohmic contact layer 309 may include or may be formed of metal silicide, such as cobalt silicide. The ohmic contact layer 309 may have a rounded cross-section. In some embodiments, the ohmic contact layer 309 may have a rounded bottom surface. The storage node pad XP may be rounded at a contact surface (or top surface) in contact with the ohmic contact layer 309. Because such rounded contact surface has a contact area greater than that of a flat contact surface, an electrical resistance may be reduced. Therefore, it may be possible to suppress tRDL defects.

Referring to FIG. 1B, the contact diffusion barrier pattern 311 may have a top surface 311_U located at the same level as that of a top surface 337_U of the bit-line capping pattern 337. The contact metal pattern 313 may have a top surface that is positioned at the same level as that of the top surface 311_U of the contact diffusion barrier pattern 311 and is coplanar with the top surface 311_U of the contact diffusion barrier pattern 311. Landing pads LP may be positioned on corresponding storage node contacts BC. When viewed in plan as shown in FIG. 1A, the landing pads LP may each have an isolated island shape. Six landing pads LP that surrounds one landing pad LP may constitute a regular hexagonal shape. The landing pads LP may be arranged to form a honeycomb shape.

The landing pad LP may be in contact simultaneously with the top surface 311_U of the contact diffusion barrier pattern 311, the top surface 337_U of the bit-line capping pattern 337, and the top surface of the contact metal pattern 313. The landing pad LP may include or may be formed of the same material as that of the contact metal pattern 313. Landing pad separation patterns LPS may be disposed between the landing pads LP. A portion of the landing pad separation pattern LPS may be interposed between the storage node contact BC and its adjacent bit-line spacer SP. Therefore, the landing pad separation patterns LPS may have a bottom end lower than a top end of the bit-line spacer SP.

Data storage patterns DSP may be disposed on corresponding landing pads LP. The data storage patterns DSP may each be a capacitor including a bottom electrode, a dielectric layer, and a top electrode. A semiconductor memory device may be a dynamic random access memory (DRAM). In some embodiments, the data storage patterns DSP may each include a magnetic tunnel junction pattern. A semiconductor memory device may be a magnetic random access memory (MRAM). Dissimilarly, the data storage patterns DSP may each include a phase change material or a variable resistance material. A semiconductor memory device may be a phase change random access memory (PRAM) or a resistive random access memory (ReRAM).

In the present inventive concepts, structures of the bit-line contact DC and the storage node pad XP may reduce contact resistance, and thus a semiconductor memory device may operate at high speeds and low powers.

FIGS. 4A to 17A illustrate plan views showing a method of fabricating the semiconductor memory device of FIG. 1A. FIGS. 4B, 4C, 5B to 13B, 13C, and 14B to 17B illustrate cross-sectional views showing a method of fabricating the semiconductor memory device of FIG. 1B. FIGS. 4B to 17B correspond to cross-sectional views taken along lines A-A' and B-B' of FIGS. 4A to 17A, respectively.

Figure 4A:
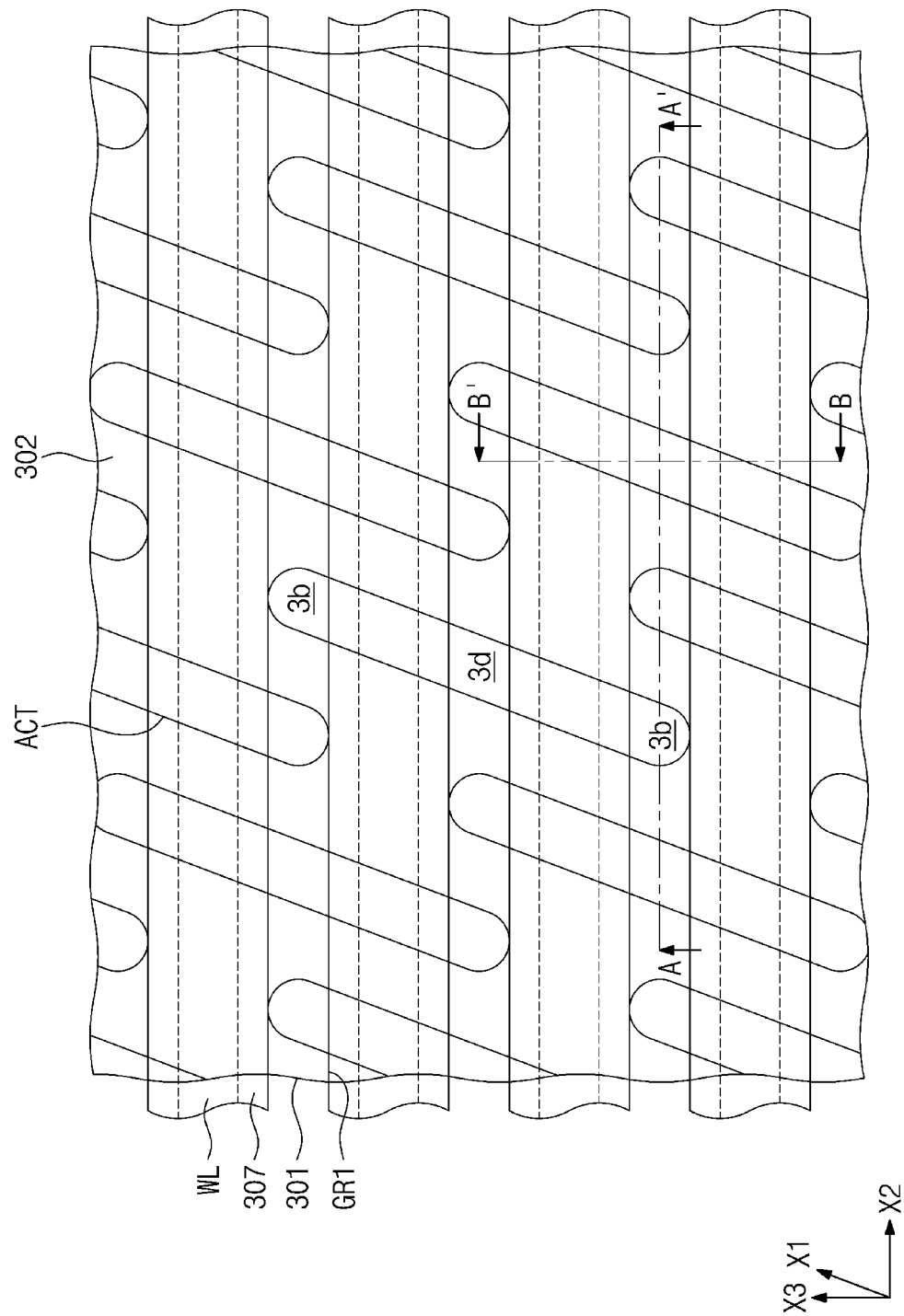
Figure 4B:
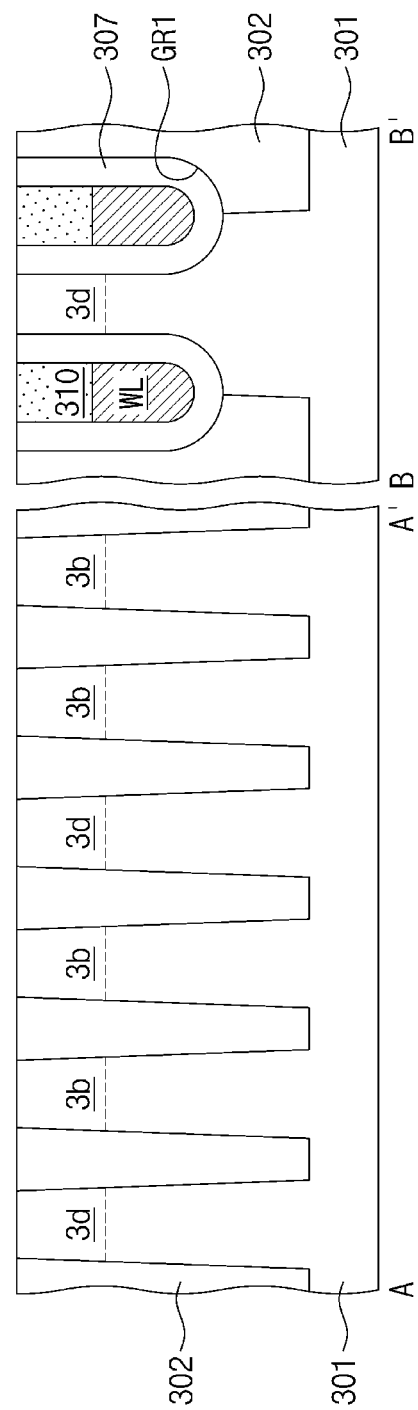

Referring to FIGS. 4A and 4B, device isolation patterns 302 may be formed in a substrate 301 to define active sections ACT. A device isolation trench may be formed in the substrate 301, and the device isolation patterns 302 may fill the device isolation trench. The active sections ACT and the device isolation patterns 302 may be patterned to form grooves GR1. In this step, an etching condition of the substrate 301 and the device isolation patterns 302 may be properly controlled such that the device isolation patterns 302 may be more easily etched than the substrate 301. Therefore, the grooves GR1 may have curved bottom surfaces. A gate dielectric layer 307 may be conformally formed in the grooves GR1. The gate dielectric layer 307 may be formed by one or more of thermal oxidation, chemical vapor deposition, and atomic layer deposition. A gate conductive layer may be stacked to fill the grooves GR1, and then the gate conductive layer may be etched back to form word lines WL. A pair of word lines WL may run across each of the active sections ACT. A dielectric layer such as a silicon nitride layer may be stacked on the substrate 301 so as to fill the grooves GR1, and then the dielectric layer may be etched to form a word-line capping pattern 310 on each of the word lines WL. The word-line capping patterns 310 and the device isolation patterns 302 may be used as a mask to dope impurities into the active sections ACT to form first and second impurity regions $3d$ and $3b$.

Figure 4C:
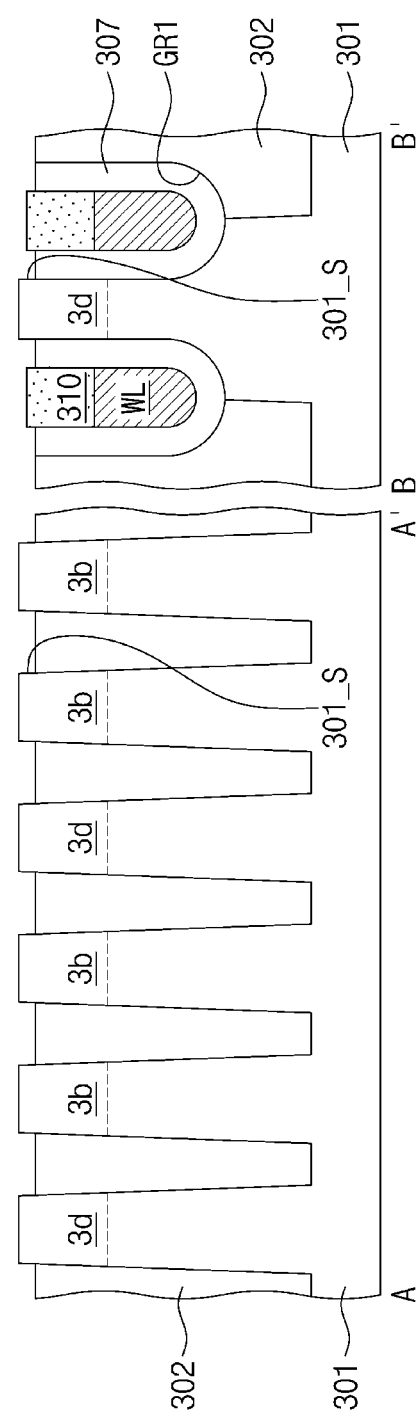

Referring to FIGS. 4A and 4C, an upper portion of the device isolation pattern 302 may be selectively removed. In this step, the gate dielectric layer 307 may be partially removed. The selective removal of the upper portion of the device isolation pattern 302 may be, for example, a wet etching process in which hydrofluoric acid (HF) is used to remove silicon oxide. The process mentioned above may expose sidewalls 301_S of the active sections ACT (or of the substrate 301). A sidewall of the word-line capping pattern 310 may be exposed. As the sidewalls 301_S of the active sections ACT (or of the substrate 301) are exposed as discussed above, a contact areas between the substrate 301 and bit-line contacts DC which will be discussed below may increase, and contact surfaces between the substrate 301 and storage node pads XP which will be discussed below may increase.

Figure 5B:
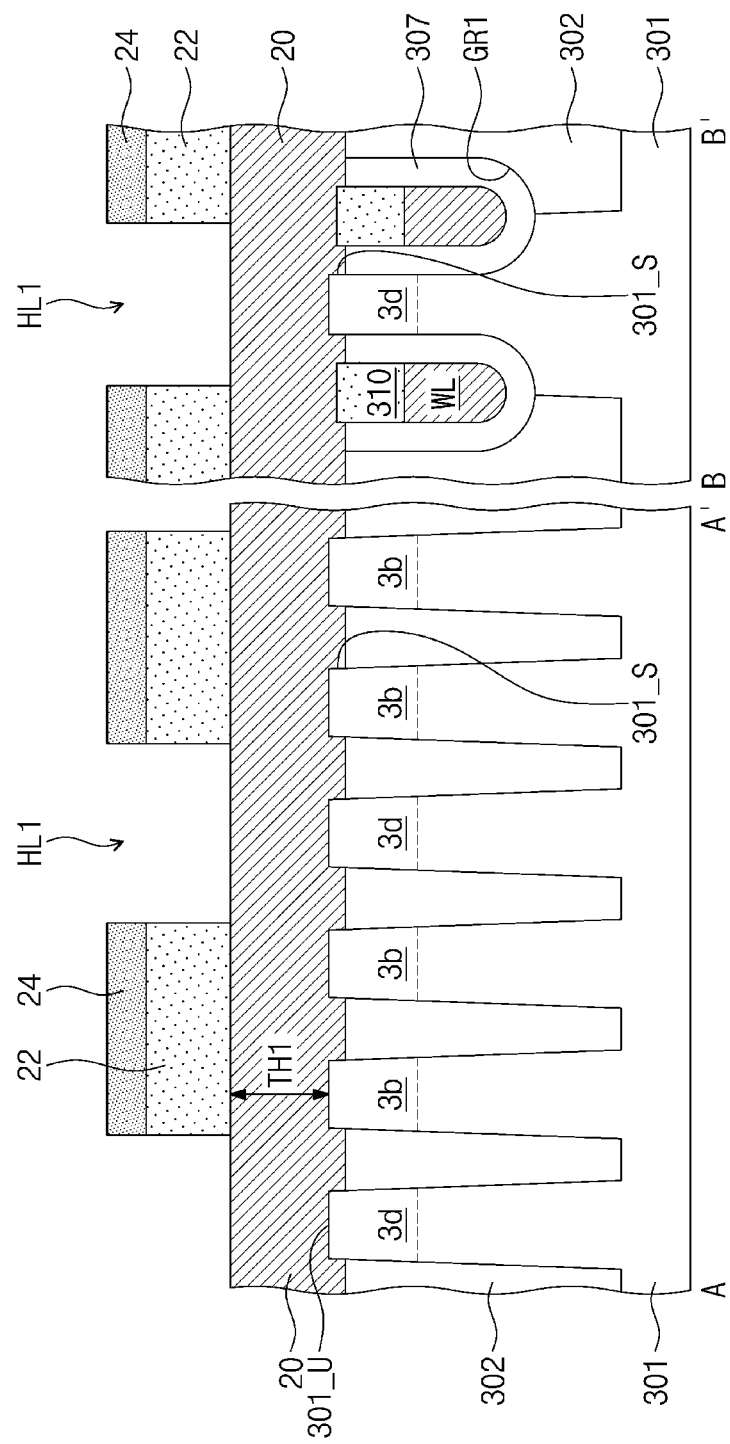

Referring to FIGS. 5A and 5B, a conductive layer 20 may be formed on an entire surface of the substrate 301. The conductive layer 20 may be, for example, an impurity-doped polysilicon layer. The formation of the conductive layer 20 may include depositing a polysilicon layer and performing an ion implantation process to dope impurities into the polysilicon layer. In some embodiments, the formation of the conductive layer 20 may include depositing a polysilicon layer while the polysilicon layer is in-situ doped with impurities. The conductive layer 20 may be formed to have a first thickness TH1 measured from a top surface 301_U of the substrate 301. A first mask layer (not shown) and a second mask pattern 24 may be sequentially formed on an entire surface of the conductive layer 20. The first mask layer may include or may be formed of a material, such as silicon oxide, having etch selectivity with respect to the conductive layer 20. The second mask pattern 24 may include or may be formed of a material, such as spin-on-hardmask (SOH) and amorphous carbon layer (ACL), having etch selectivity with respect to the first mask layer. The second mask pattern 24 may be formed to have a plurality of first holes HL1. The first holes HL1 may overlap the first impurity regions 3d. The second mask pattern 24 may be used as an etching mask such that the first mask layer may be etched to form a first mask pattern 22 and to expose a top surface of the conductive layer 20. The first mask pattern 22 may have a planar shape the same as that of the second mask pattern 24. The first holes HL1 may be transferred to the first mask pattern 22. The first mask pattern 22 may be thicker than the second mask pattern 24.

Figure 6A:
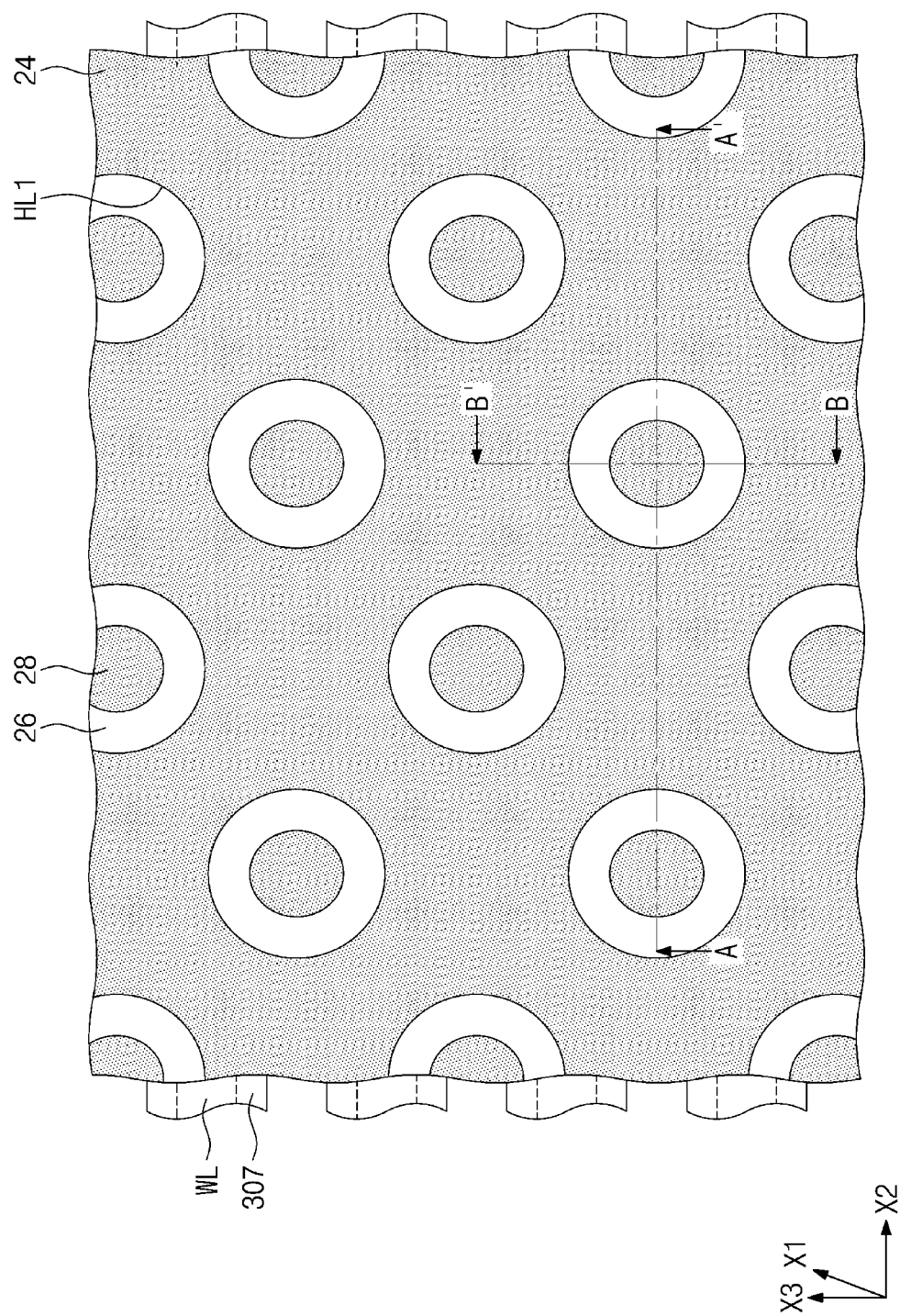
Figure 6B:
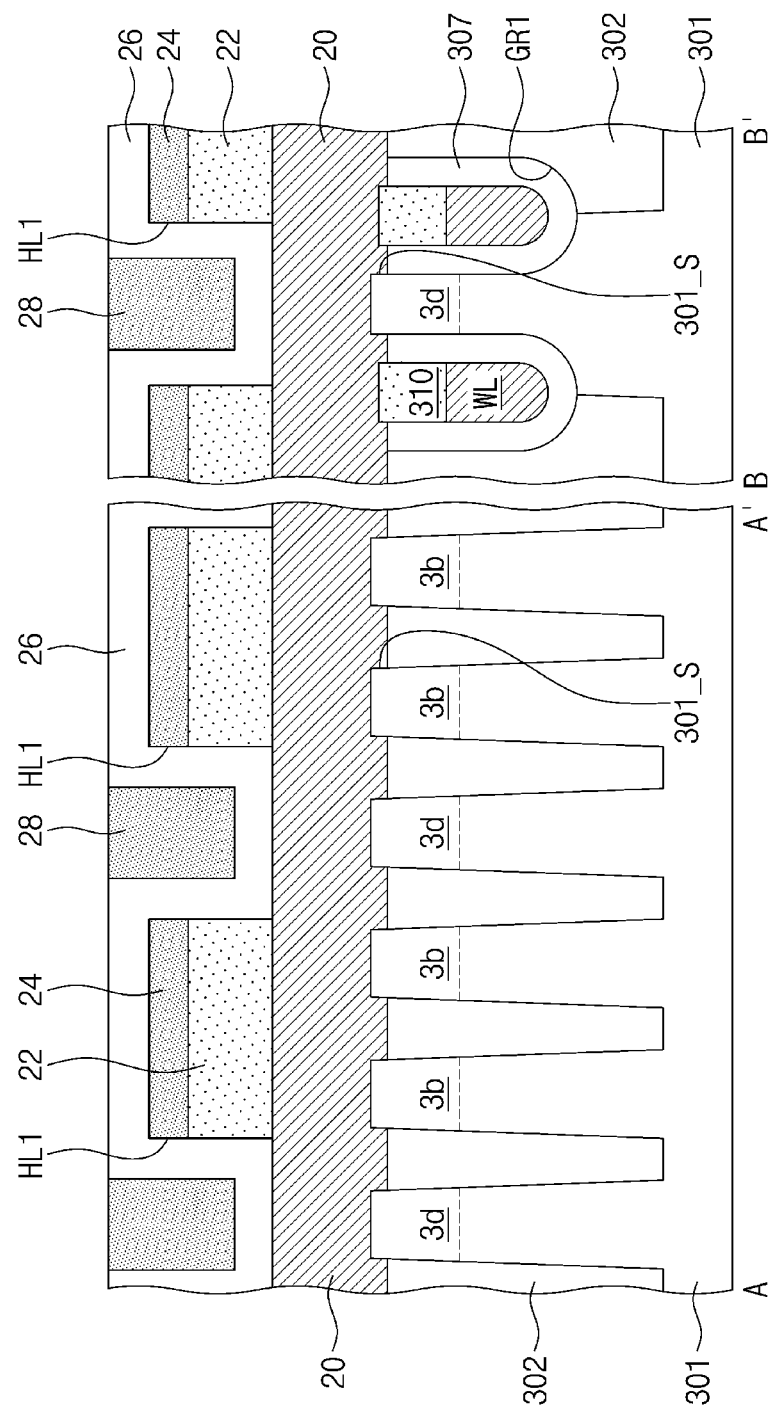
Figure 7B:
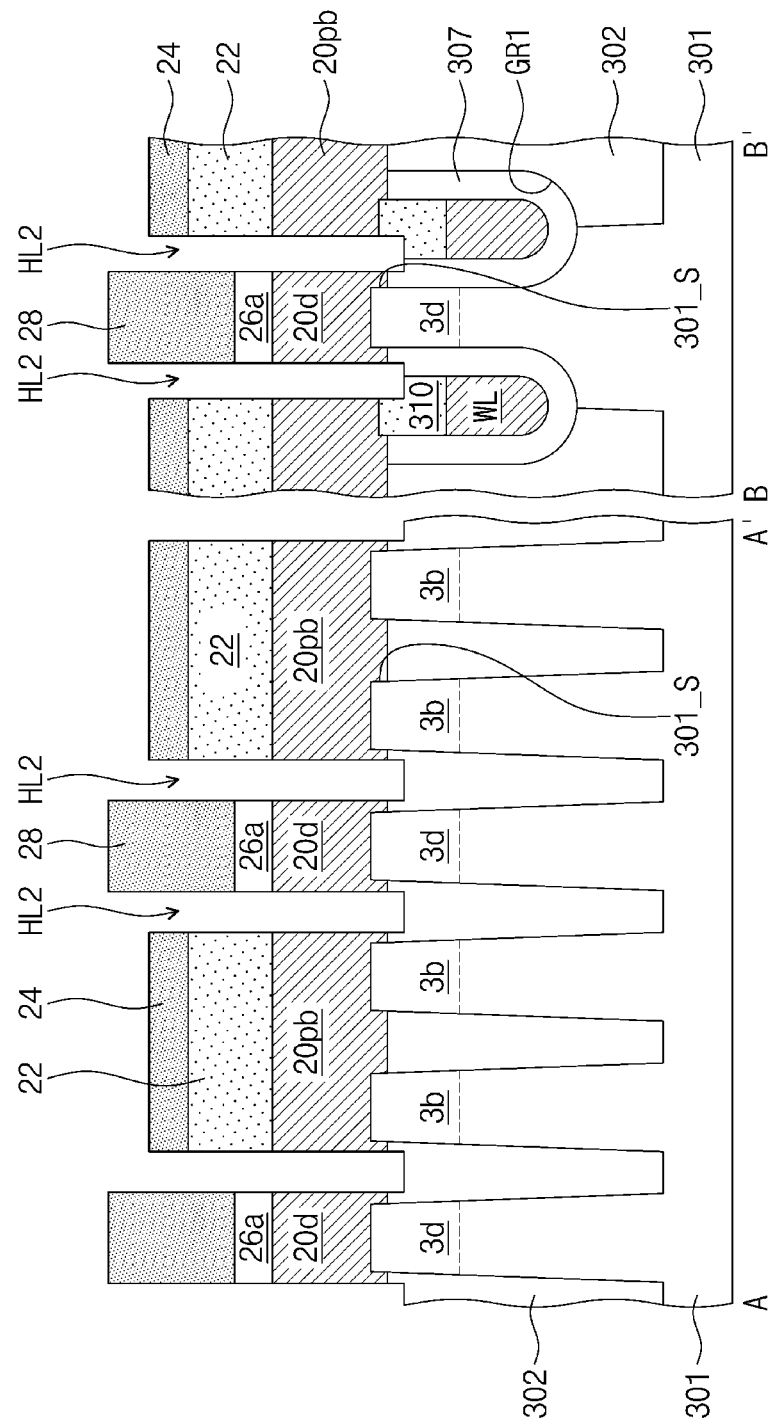
Figure 8B:
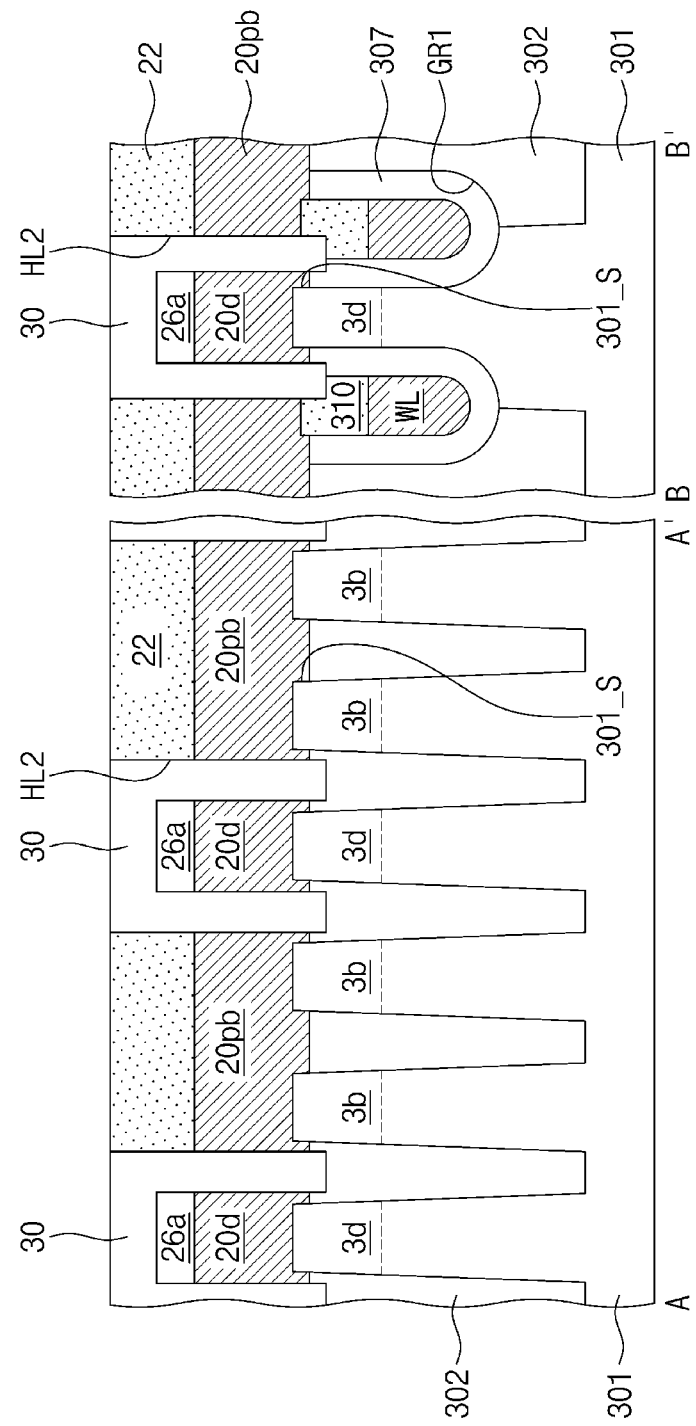
Figure 9A:
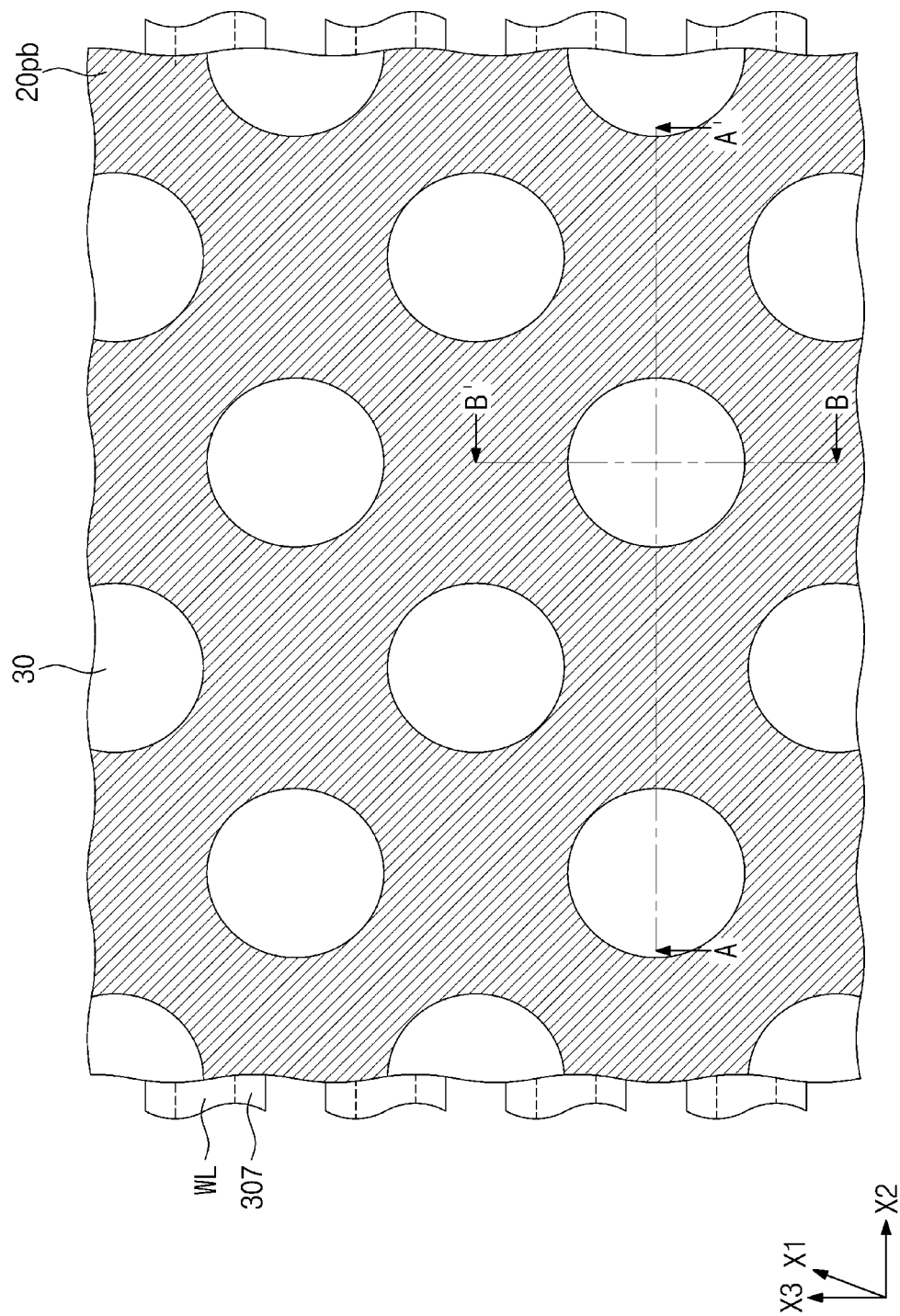
Figure 9B:
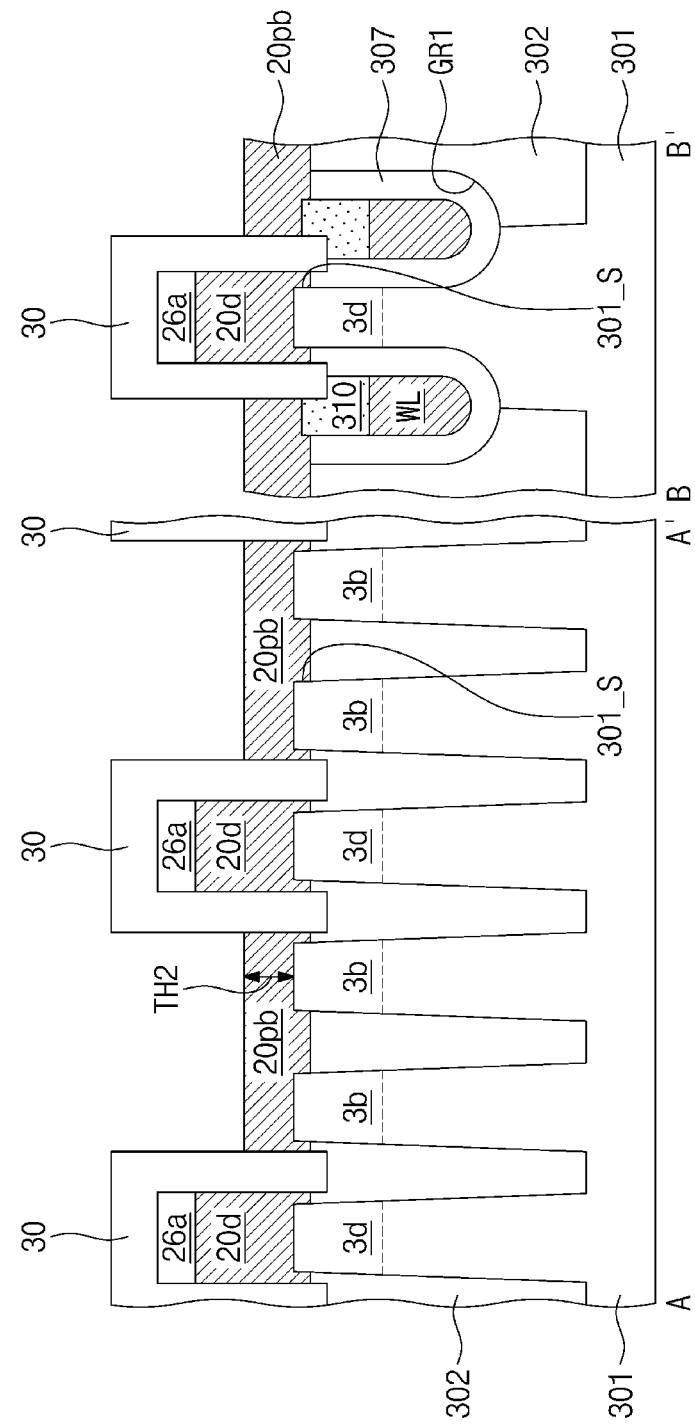

Referring to FIGS. 6A and 6B, a first sacrificial layer 26 may be conformally formed on the entire surface of the substrate 301. The first sacrificial layer 26 may include or may be formed of, for example, silicon oxide formed by atomic layer deposition (ALD). The first sacrificial layer 26 may be formed to have a thickness insufficient enough to fill the first holes HL1. The first sacrificial layer 26 may cover a top surface and lateral surfaces of the second mask pattern 24, lateral surfaces of the first mask pattern 22, and the top surface of the conductive layer 20 exposed within the first holes HL1. A second sacrificial pattern 28 may be formed to fill the first holes HL1. The second sacrificial pattern 28 may be formed of, for example, spin-on-hardmask (SOH) having excellent filling properties. The formation of the second sacrificial pattern 28 may include performing a spin coating process and a curing process to form a spin-on-hardmask (SOH) layer to fill the first holes HL1, and then performing an etch-back process to expose a top surface of the first sacrificial layer 26.

Referring to FIGS. 6A, 6B, 7A, and 7B, an etching process may be selectively performed on the first sacrificial layer 26. In this step, the second sacrificial pattern 28 may not be etched. The etching process may expose the top surface of the second mask pattern 24. The etching process may be performed such that the first sacrificial layer 26 in the first hole HL1 may be removed to expose the conductive layer 20. The conductive layer 20 exposed within the first hole HL1 may be removed to form a second hole HL2 that exposes a top surface of the device isolation pattern 302, a top surface of the gate dielectric layer 307, and a top surface of the word-line capping pattern 310. The formation of the second hole HL2 may separate the conductive layer 20 into a first conductive pattern 20d and a second conductive pattern 20pb. The first conductive pattern 20d and the second conductive pattern 20pb may each have the first thickness TH1 of FIG. 5B.

The first conductive pattern 20d may have a circular shape when viewed in plan and may overlap the first impurity region 3d. The second conductive pattern 20pb may simultaneously cover two neighboring second impurity regions 3b. The second conductive pattern 20pb may have a network shape when viewed in plan.

The second hole HL2 may be formed to have a doughnut or annular shape as shown in FIG. 7A. In this step, the first sacrificial layer 26 positioned below the second sacrificial pattern 28 may not be etched, but may remain to form a residual sacrificial pattern 26a. The etching process may also partially remove an upper portion of the device isolation pattern 302, an upper portion of the gate dielectric layer 307, and an upper portion of the word-line capping pattern 310. The residual sacrificial pattern 26a may be formed of, for example, silicon oxide.

Referring to FIGS. 7A, 7B, 8A, and 8B, the second mask pattern 24 and the second sacrificial pattern 28 may all be removed to expose a top surface of the residual sacrificial pattern 26a and a top surface of the first mask pattern 22. When both of the second mask pattern 24 and the second sacrificial pattern 28 are formed of spin-on-hardmask (SOH), an ashing process may be performed to remove the second mask pattern 24 and the second sacrificial pattern 28. The top surface of the residual sacrificial pattern 26a may be formed lower than the top surface of the first mask pattern 22. A contact dielectric layer may be formed on the entire surface of the substrate 301 to thereby fill the second holes HL2, and then a chemical mechanical polishing (CMP) or etch-back process may be performed to form contact capping patterns 30 in the second holes HL2. The contact capping pattern 30 may include or may be formed of a dielectric material, such as silicon oxide. The contact capping pattern 30 may cover the residual sacrificial pattern 26a and the first conductive pattern 20d.

Referring to FIGS. 8A, 8B, 9A, and 9B, the first mask pattern 22 may be removed to expose the second conductive pattern 20pb. An etch-back process may be performed to remove an upper portion of the second conductive pattern 20pb, and thus a thickness of the second conductive pattern 20pb may be changed to a second thickness TH2 less than the first thickness TH1 of FIG. 5B. In this step, the contact capping pattern 30 may protect the first conductive pattern 20d.

Figure 10A:
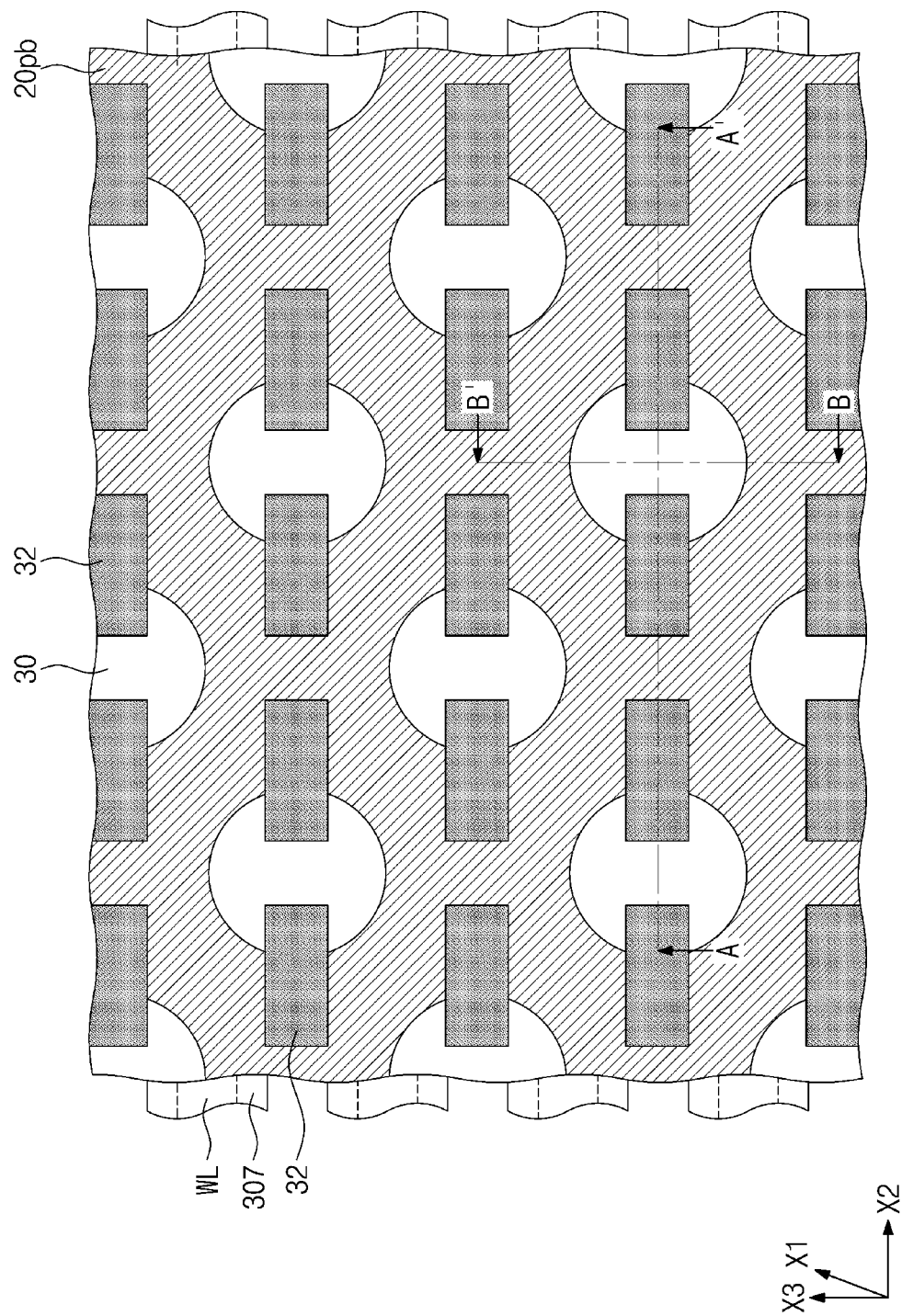
Figure 10B:
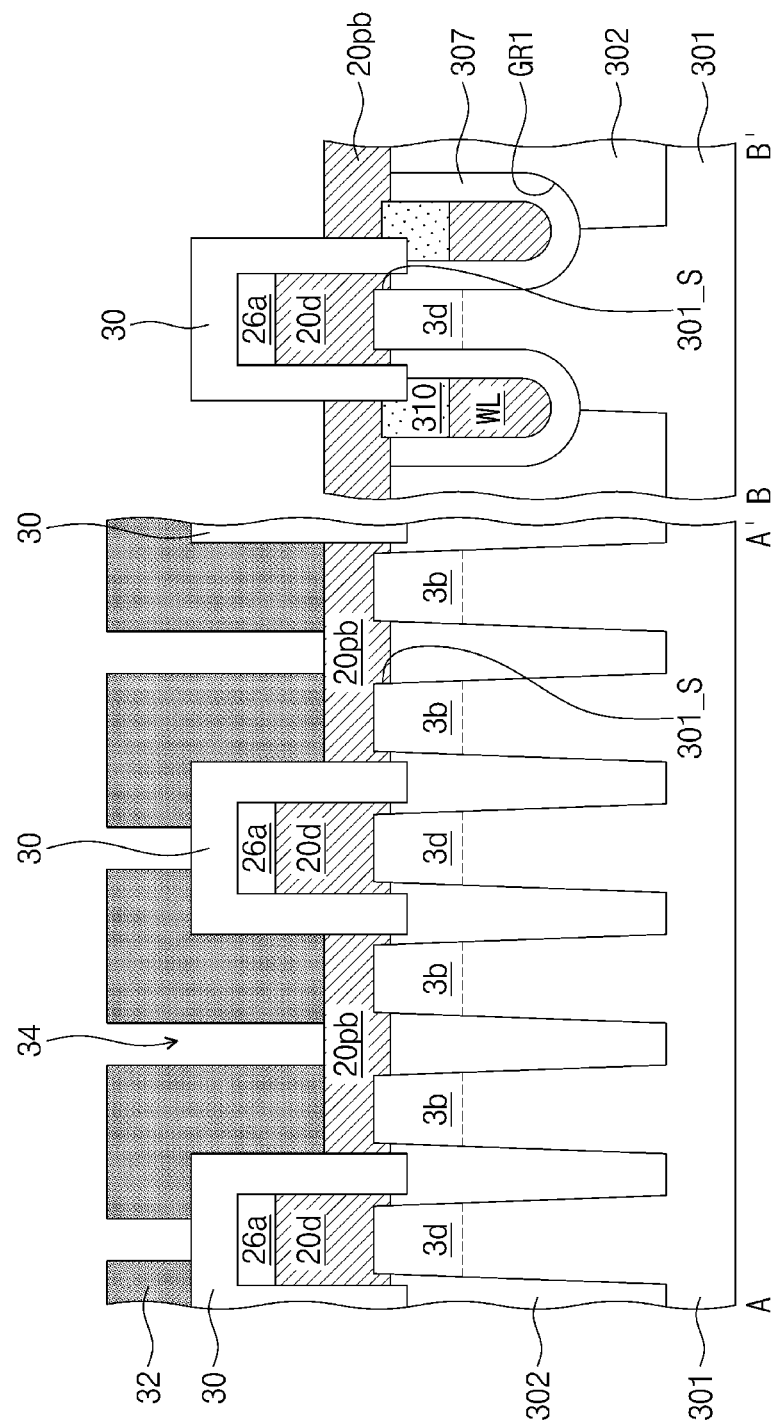
Figure 11A:
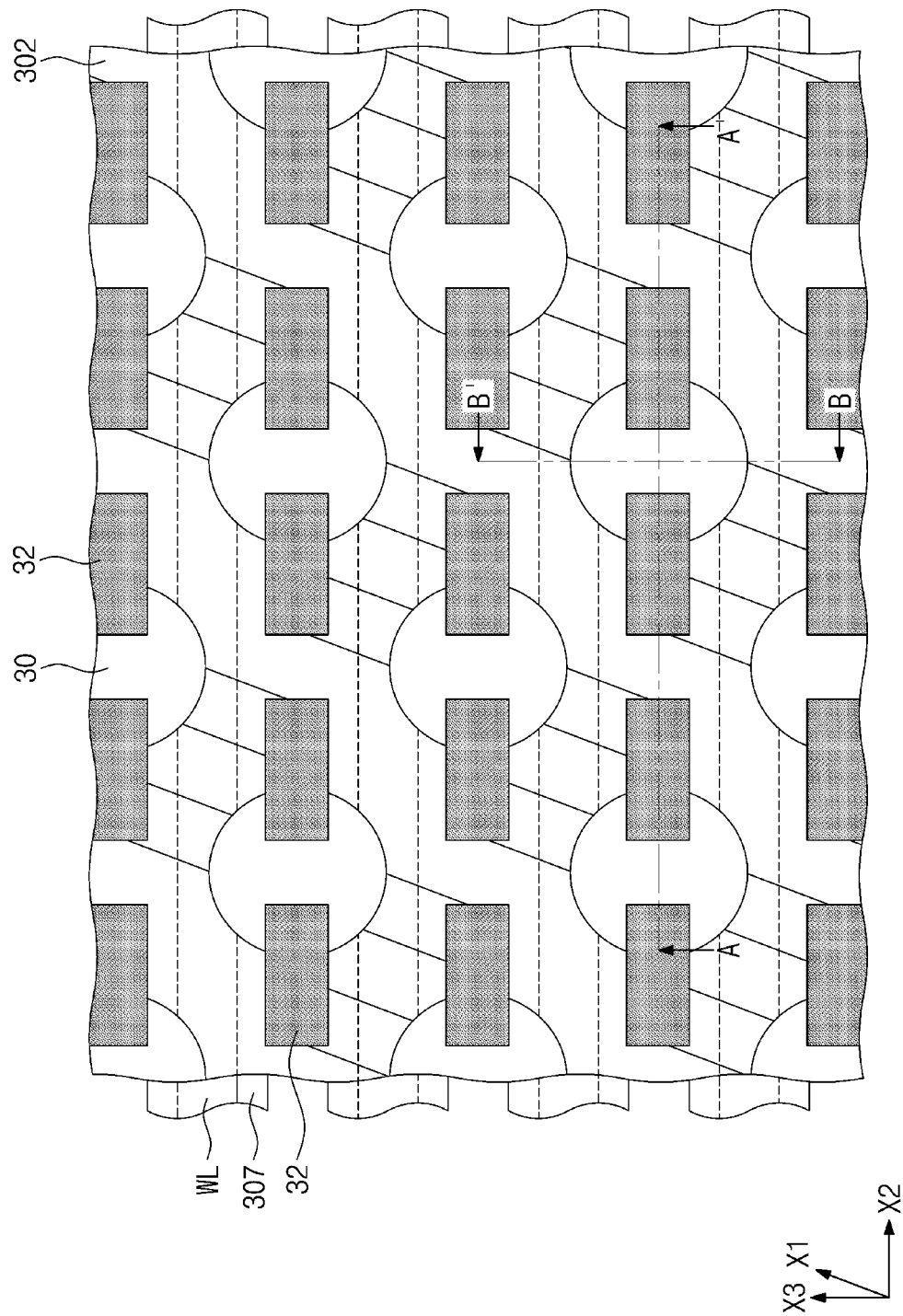
Figure 11B:
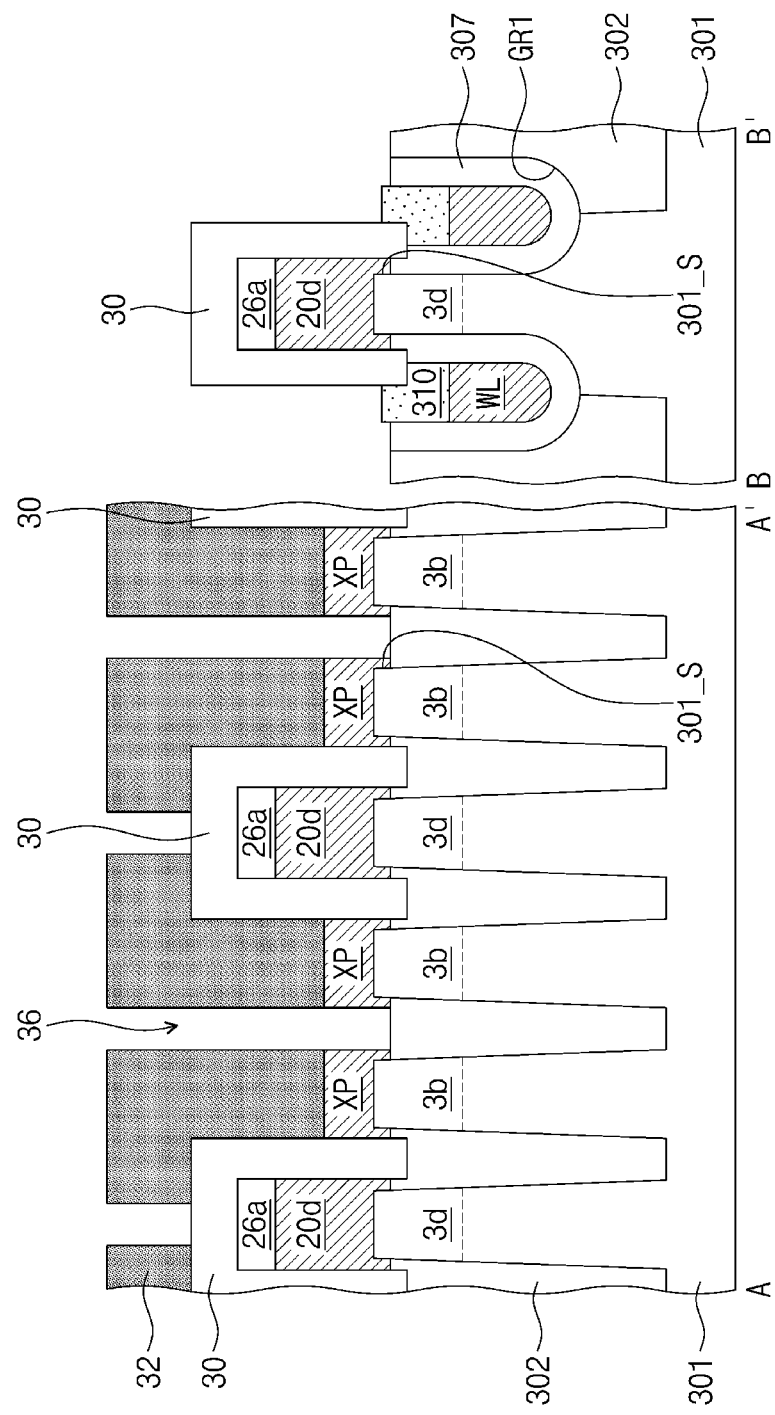

Referring to FIGS. 10A and 10B, third mask patterns 32 may be formed on the contact capping pattern 30 and the second conductive pattern 20pb. The third mask patterns 32 may be formed of, for example, spin-on-hardmask (SOH), amorphous carbon layer (ACL), silicon nitride, silicon oxynitride, or photoresist. The third mask patterns 32 may be two-dimensionally arranged along a second direction X2 and a third direction X3. The third mask patterns 32 may be positioned on the device isolation pattern 302 and the substrate 301 between neighboring gate dielectric layers 307. Two neighboring third mask patterns 32 may simultaneously overlap a single contact capping pattern 30. The second conductive pattern 20pb and the contact capping patterns 30 may be exposed between the third mask patterns 32. The third mask patterns 32 may be formed by using patterning processes such as double patterning technology (DPT), quadruple patterning technology (QPT), and litho-etching-litho-etching (LELE).

Referring to FIGS. 10A, 10B, 11A, and 11B, the third mask patterns 32 may be used as an etching mask to etch the second conductive pattern 20pb to form storage node pads XP spaced apart from each other. A space 36 may be between two adjacent storage node pads of the storage node pads XP. The space 36 may expose the device isolation pattern 302. In this step, the contact capping pattern 30 and the residual sacrificial pattern 26a may protect and prevent the first conductive pattern 20d from being etched. An upper portion of the contact capping pattern 30 may be also be partially etched in the etching process. An upper portion of the device isolation pattern 302 may be partially etched between the storage node pads XP. The storage node pads XP may each have the second thickness TH2 of FIG. 9B.

Referring to FIGS. 11A, 11B, 12A, and 12B, the third mask patterns 32 may be removed to expose top surfaces of the storage node pads XP and top surfaces of the contact capping patterns 30. A pad separation layer (not shown) may be formed on the entire surface of the substrate 301 to fill the space 36 between the storage node pads XP, and then a chemical mechanical polishing (CMP) process may be performed. As such, the contact capping pattern 30 on the first conductive pattern 20d may be removed to expose a top surface of the first conductive pattern 20d and simultaneously to form a contact dielectric pattern 30r that covers a sidewall of the first conductive pattern 20d. A portion of the contact capping pattern 30 may be formed into the contact dielectric pattern 30r. The contact dielectric pattern 30r may have a doughnut or annular shape when viewed in plan. A pad separation pattern 38 may be formed to fill the space 36 between the storage node pads XP and to cover the top surfaces of the storage node pads XP. The pad separation pattern 38 may be a portion of the pad separation layer (not shown).

Figure 13A:
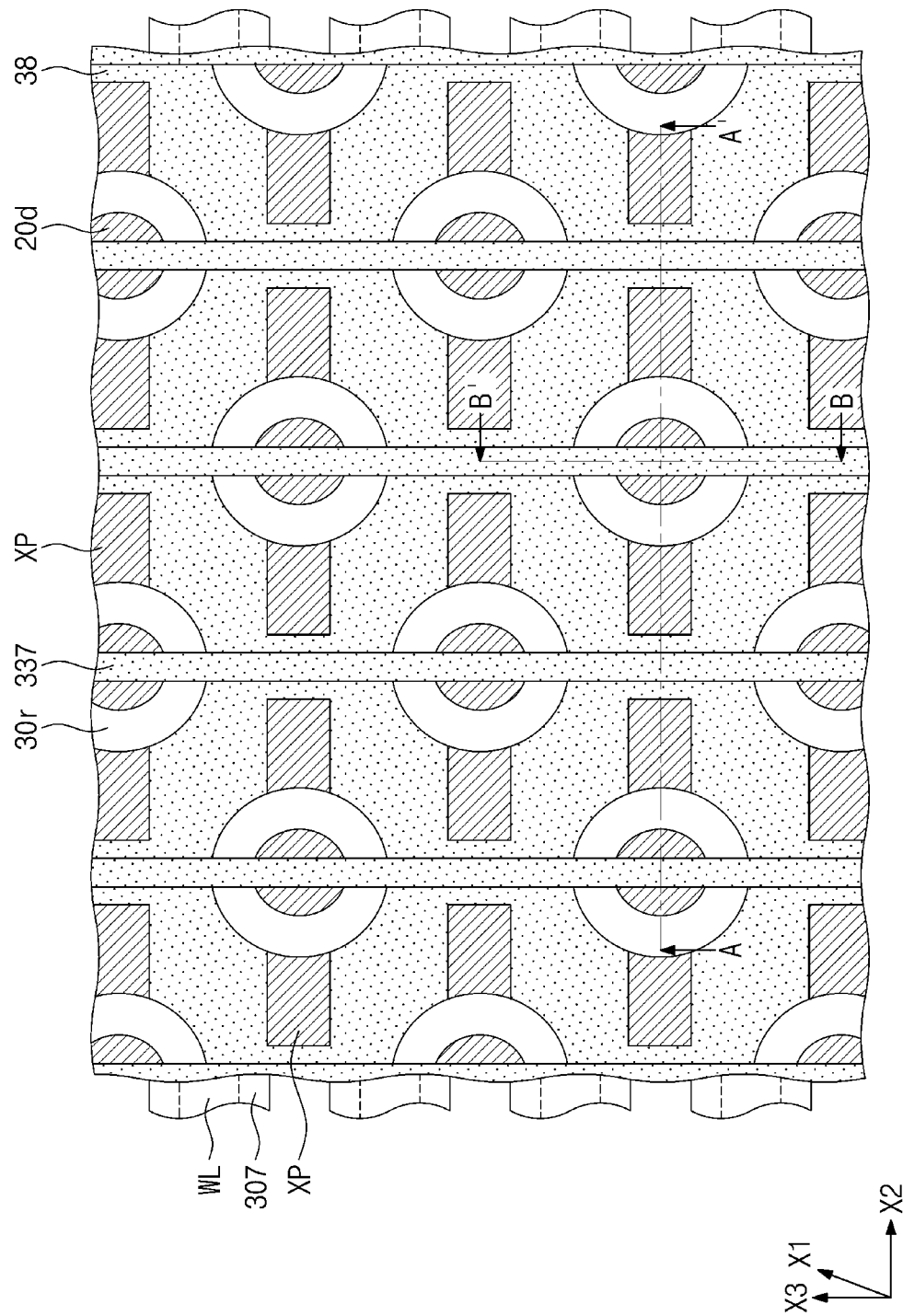
Figure 13B:
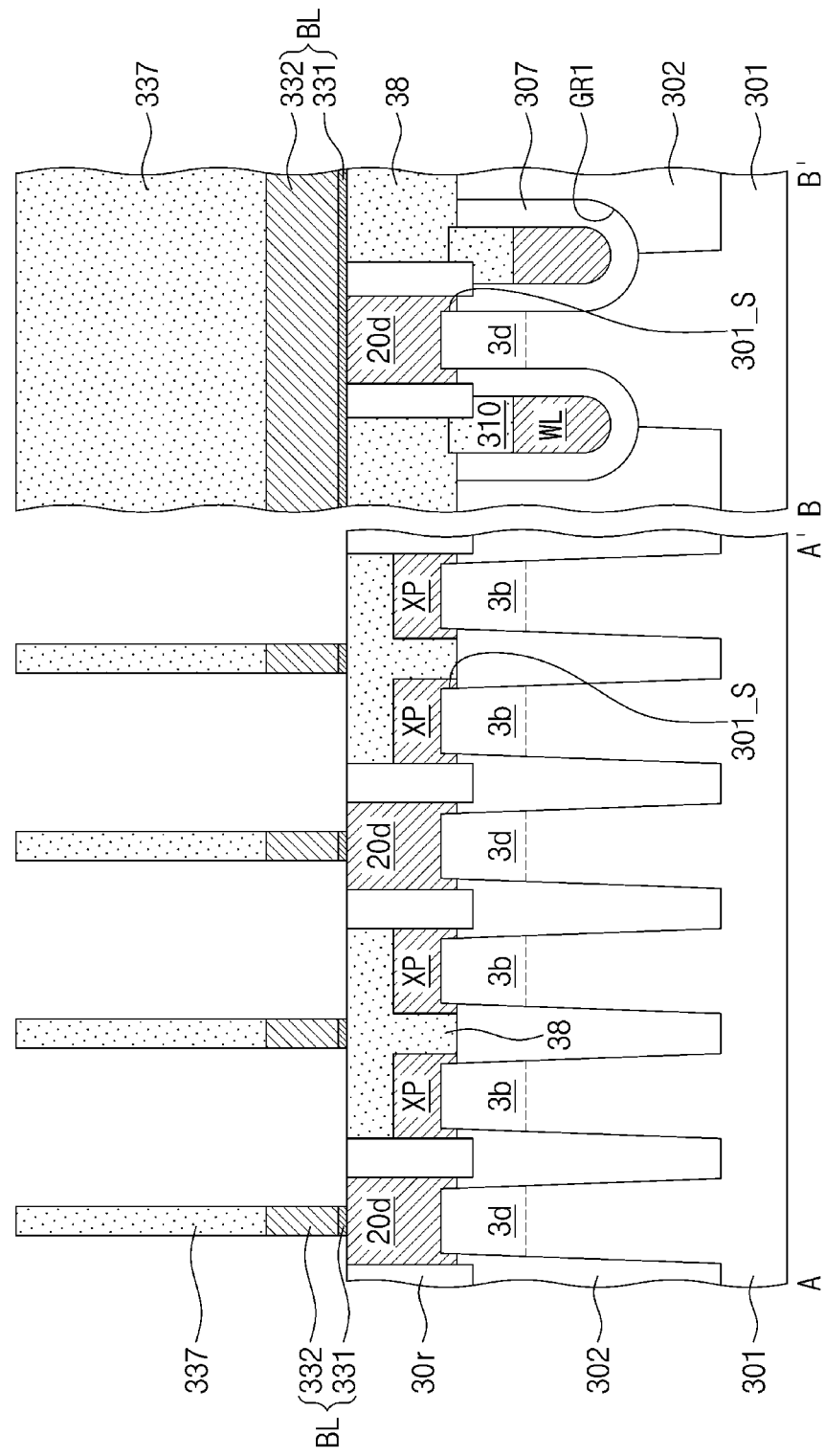

Referring to FIGS. 13A and 13B, a bit-line diffusion barrier layer (not shown) and a bit-line wire layer (not shown) may be sequentially formed on the first conductive pattern 20d, the contact dielectric pattern 30r, and the pad separation pattern 38, and then a bit-line capping pattern 337 may be formed on the bit-line wire layer. The bit-line capping pattern 337 may be used as an etching mask to sequentially etch the bit-line wire layer and the bit-line diffusion barrier layer to form a bit-line wire pattern 332 and a bit-line diffusion barrier pattern 331. Therefore, a bit line BL may be formed.

Figure 13C:
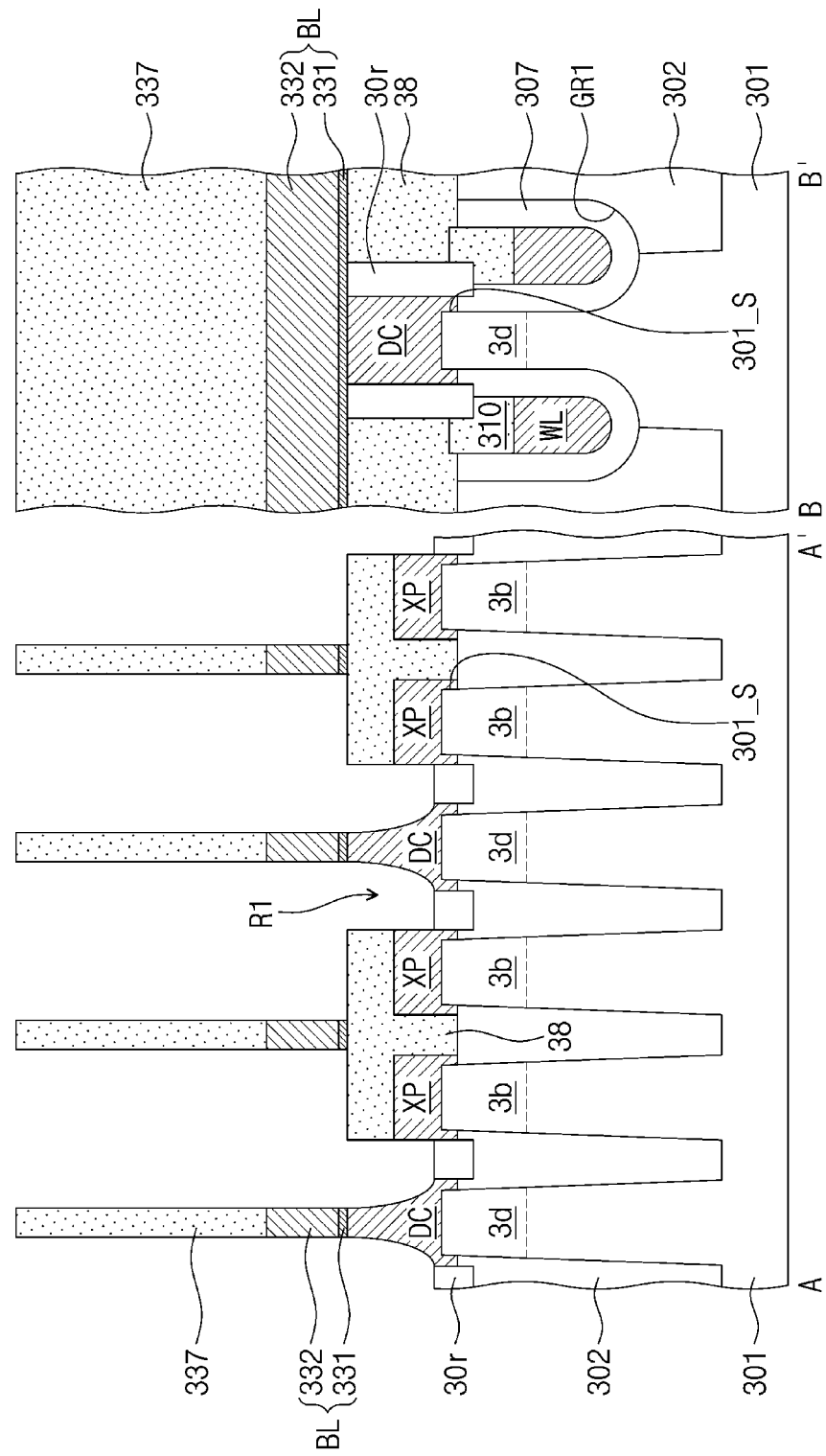

Referring to FIGS. 13B and 13C, an etching process may be performed to form a bit-line contact DC. The bit-line capping pattern 337 may be used as an etching mask to etch the first conductive pattern 20d exposed on a side of the bit-line capping pattern 337 to form the bit-line contact DC. The contact dielectric pattern 30r exposed on the side of the bit-line capping pattern 337 may also be etched, and thus an upper portion of the contact dielectric pattern 30r may be removed and a recess region R1 may be formed on a side of the bit-line contact DC. The recess region R1 may expose a sidewall of the storage node pad XP and a sidewall of the pad separation pattern 38. In the etching process, process parameters may be properly adjusted to allow the bit-line contact DC to have an inclined sidewall and a width that increases in a downward direction.

Figure 14A:
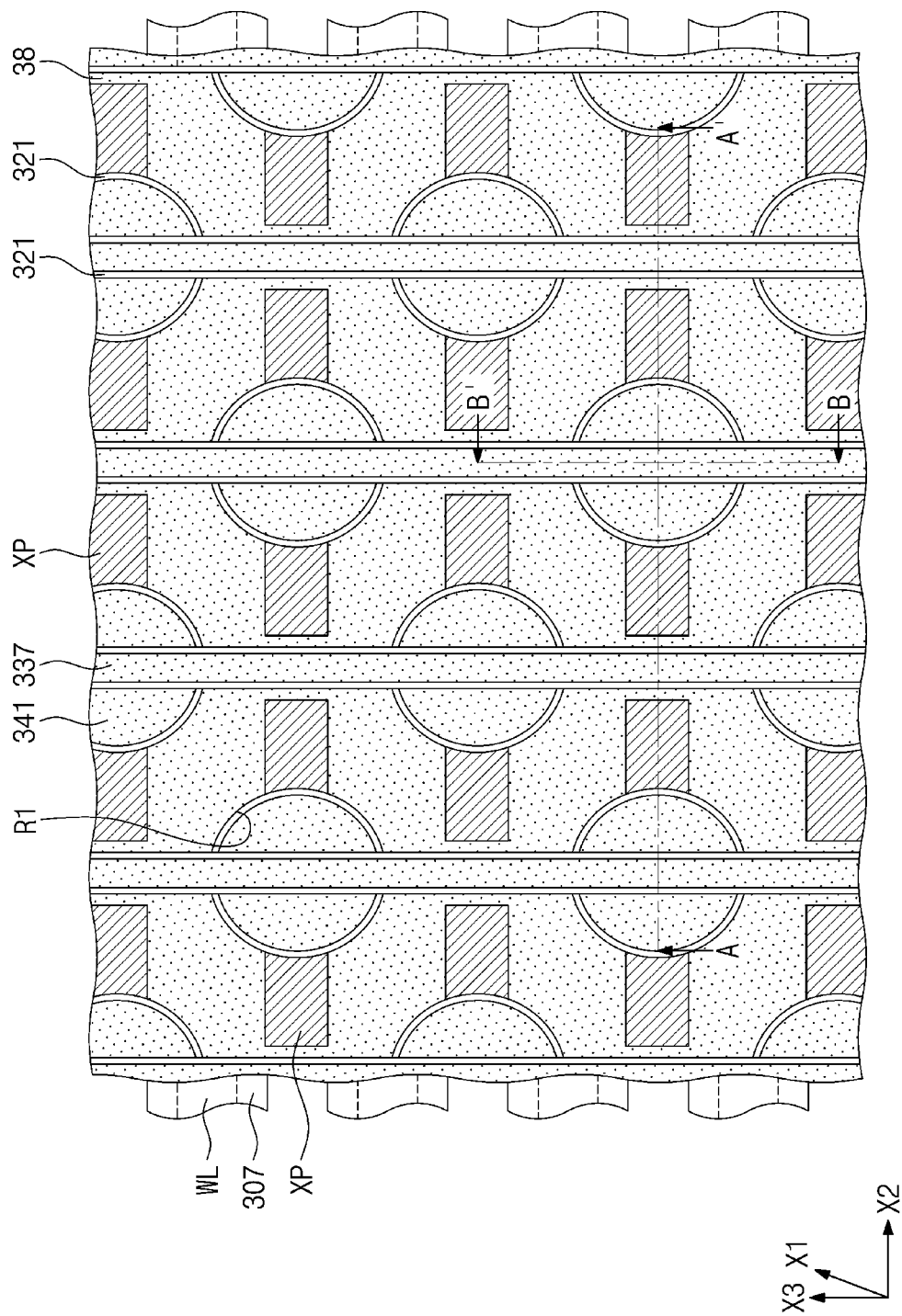
Figure 14B:
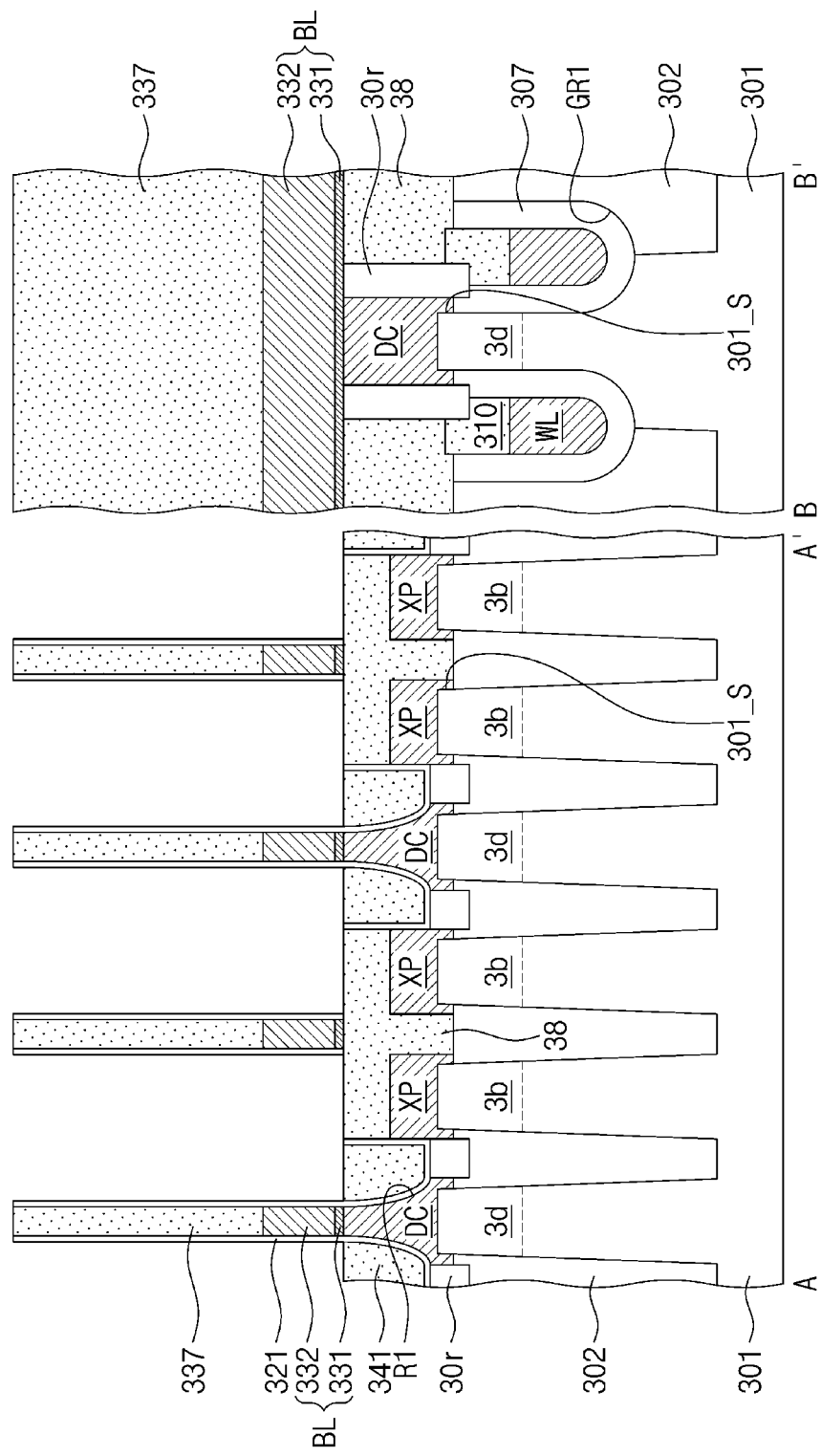

Referring to FIGS. 14A and 14B, a spacer liner 321 may be conformally formed on the entire surface of the substrate 301. A buried dielectric layer (not shown) may be formed on the spacer liner 321 to fill the recess region R1. The buried dielectric layer may undergo an etch-back process to form a buried dielectric pattern 341 in the recess region R1. A top surface of the pad separation pattern 38 may be exposed while the spacer liner 321 may remain on a sidewall of the bit line BL and on a sidewall of the bit-line capping pattern 337.

Figure 15A:
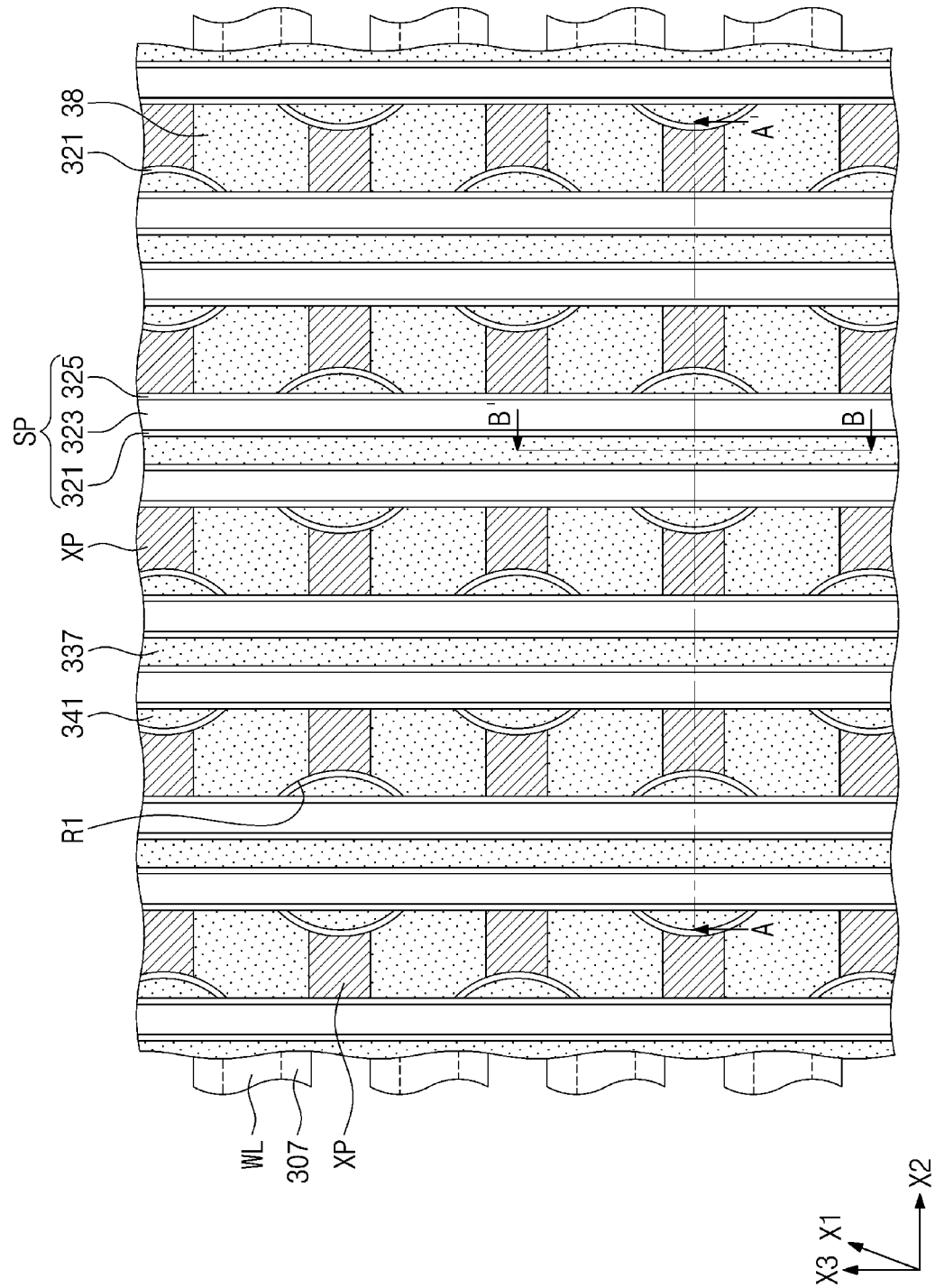
Figure 15B:
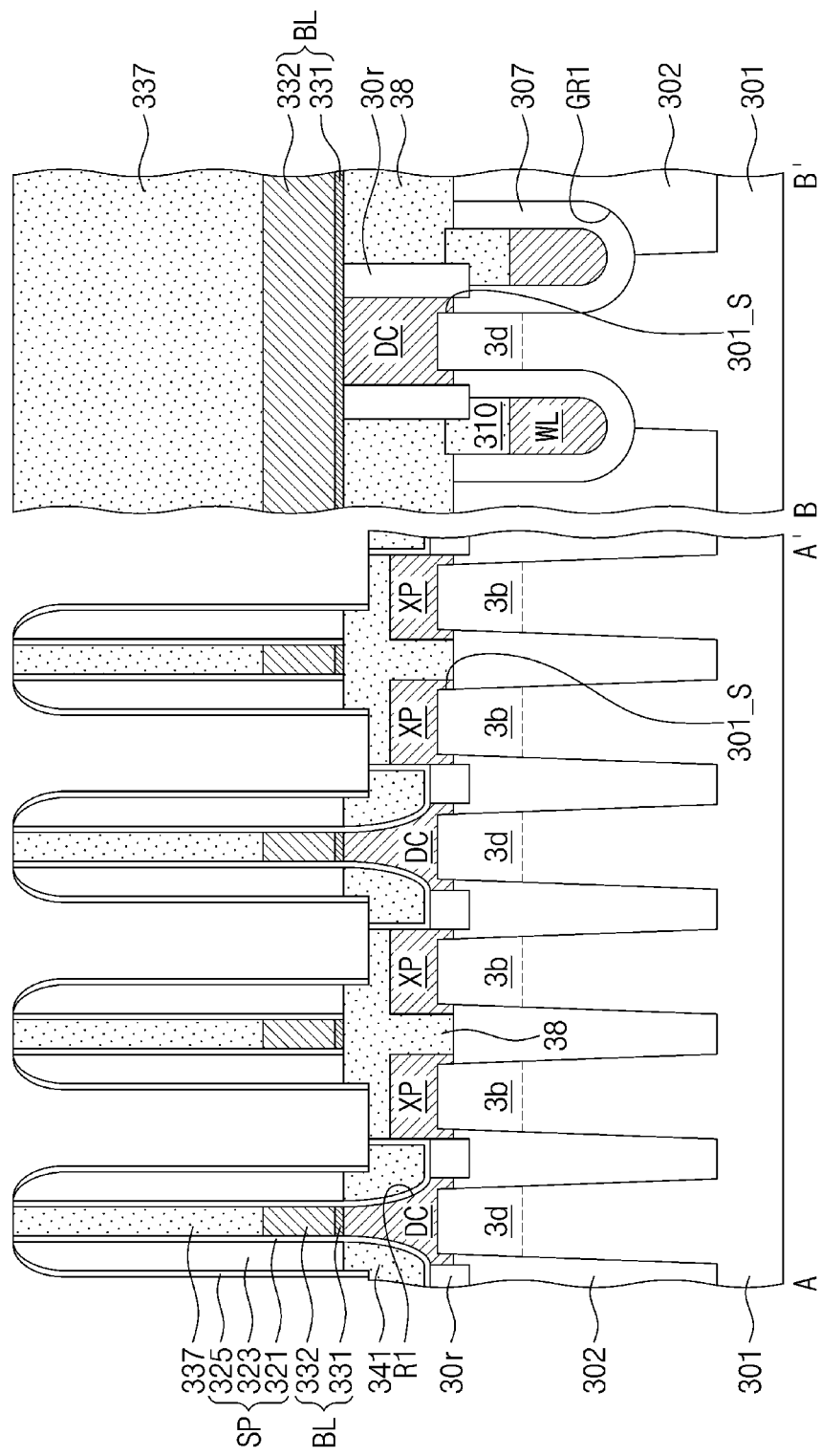

Referring to FIGS. 15A and 15B, a first spacer layer may be conformally formed on the entire surface of the substrate 301, and then the first spacer layer may be etched back to form a first spacer 323 that covers a sidewall of the spacer liner 321. In this step, the buried dielectric pattern 341 and the pad separation pattern 38 may be partially etched at an upper portion of the buried dielectric pattern 341 and an upper portion of the pad separation pattern 38. A second spacer layer may be conformally formed on the entire surface of the substrate 301, and then the second spacer layer may be etched back to form a second spacer 325 that covers a sidewall of the first spacer 323. Therefore, a bit-line spacer SP may be formed.

Figure 16A:
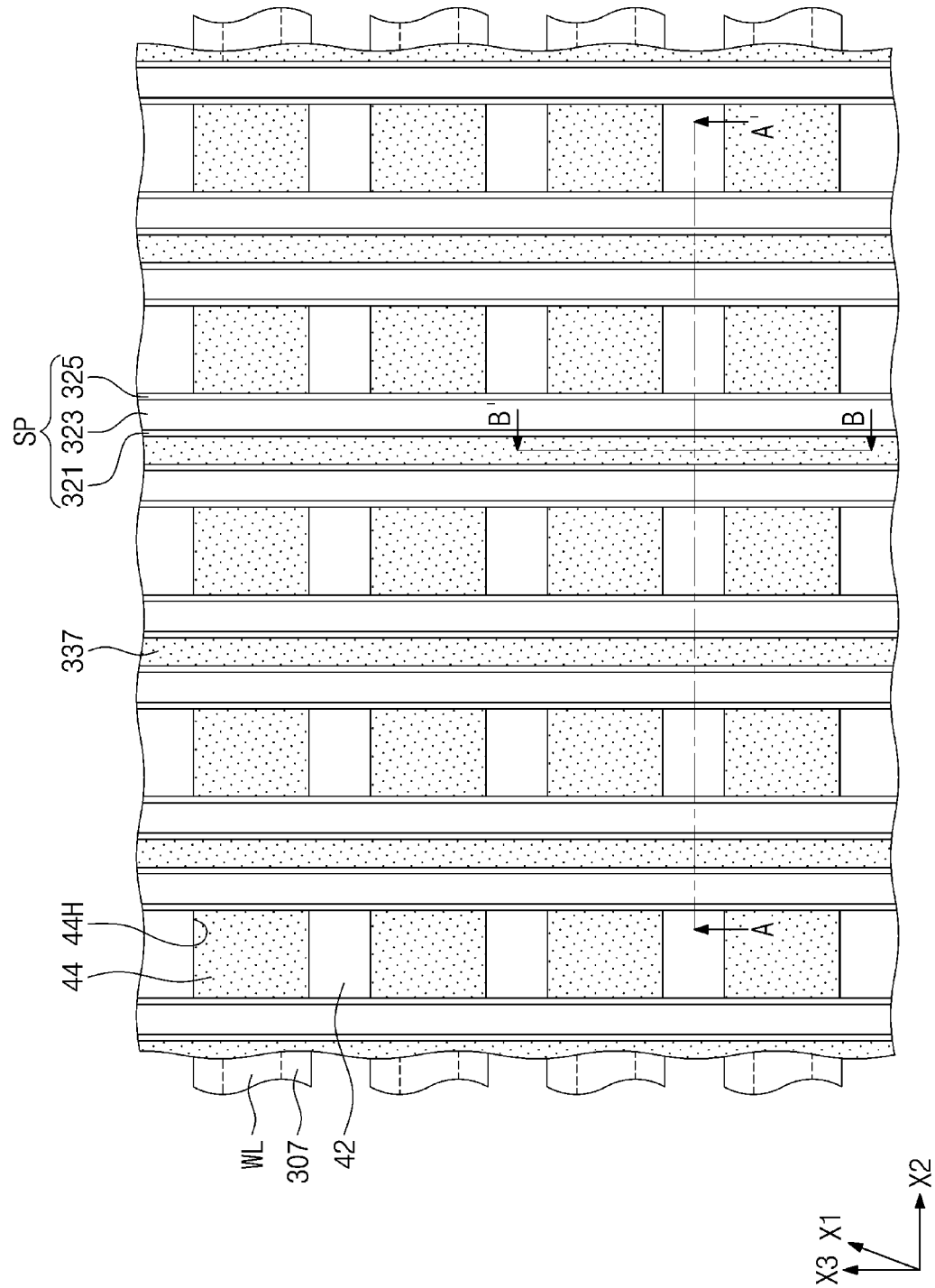
Figure 16B:
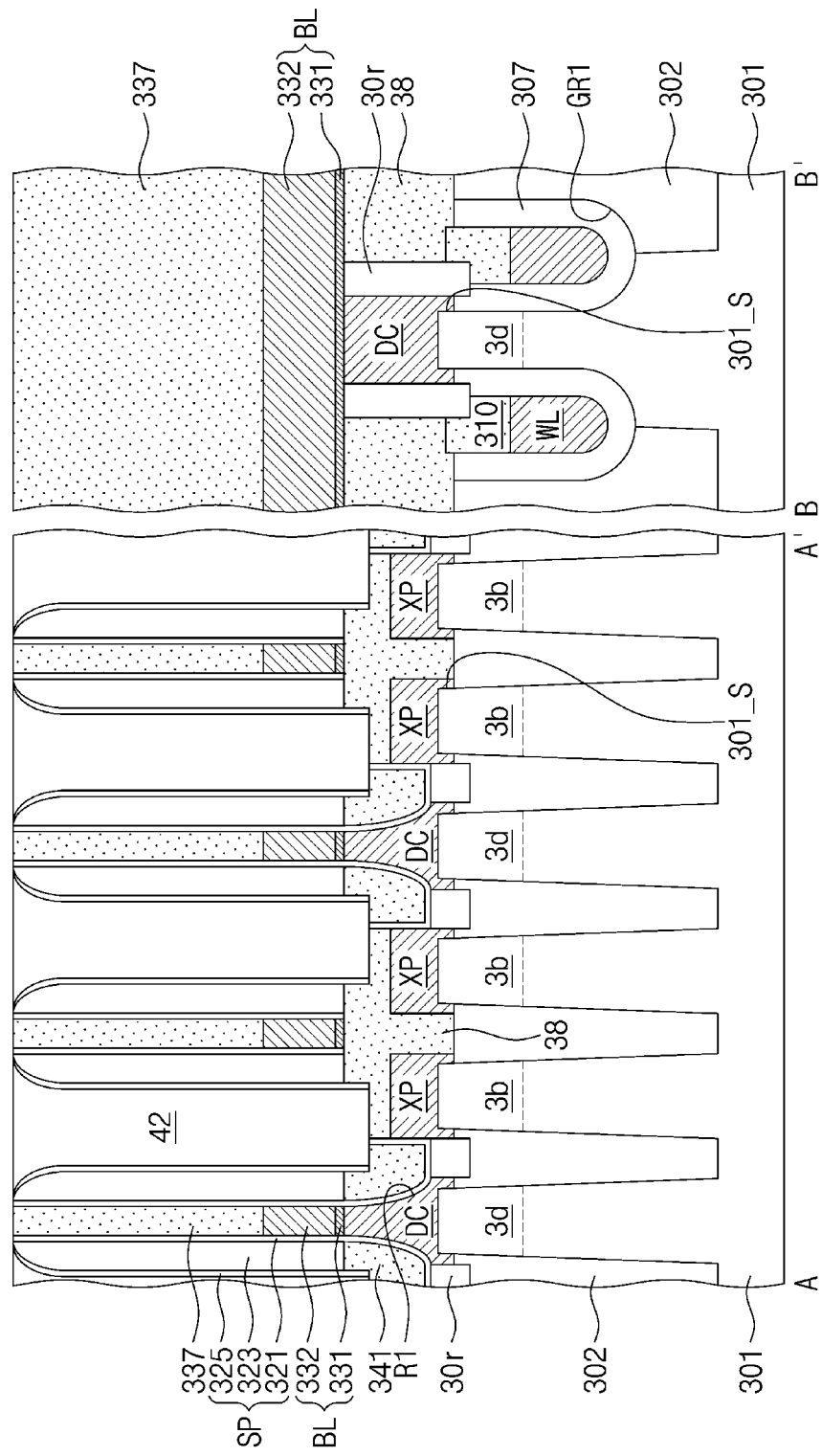

Referring to FIGS. 16A and 16B, a sacrificial buried layer may be formed on the entire surface of the substrate 301 to fill a space between the bit line BL, and an etch-back process and a patterning process may be performed to form sacrificial buried patterns 42 between the bit lines BL. The sacrificial buried patterns 42 may be formed of, for example, silicon oxide, tetraethylorthosilicate (TEOS), or tonen silazene (TOSZ). Node separation holes 44H may be formed between the bit lines BL and in the sacrificial buried patterns 42. The sacrificial buried patterns 42 may overlap the storage node pads XP. A node separation layer may be formed on the entire surface of the substrate 301 to fill the node separation holes 44H, and then the node separation layer may be etched back to form the node separation patterns 44. The node separation patterns 44 may include or may be formed of, for example, silicon oxide.

Referring to FIGS. 16A, 16B, 17A, and 17B, the sacrificial buried patterns 42 may be removed to expose the buried dielectric pattern 341 and the pad separation pattern 38. An etching process may be performed to etch the buried dielectric pattern 341 and the pad separation pattern 38 that are exposed between the bit lines BL to form storage nod contact holes BCH that expose the storage node pads XP. In this step, an upper portion of the bit-line spacer SP may also be partially etched. Upper portions of the storage node pads XP may be partially etched.

Referring to FIGS. 17A, 17B, 1A, and 1B, a contact diffusion barrier layer (not shown) may be conformally formed on the entire surface of the substrate 301, and then a contact metal layer (not shown) may be formed on the contact diffusion barrier layer to fill the storage node contact holes BCH. The contact diffusion barrier layer and the contact metal layer may all include metal, and may be formed by a process (e.g., deposition) performed at a lower temperature (e.g., hundreds of degrees Celsius or from about 300° C. to about 400° C.) than that (e.g., about 1000° C.) of an annealing process.

A chemical mechanical polishing (CMP) process may be subsequently performed to expose a top surface of the bit-line capping pattern 337 and simultaneously to form a contact diffusion barrier pattern 311 and a contact metal pattern 313. A portion of the contact diffusion barrier layer may be formed into the contact diffusion barrier pattern 311. A portion of the contact metal layer may be formed into the contact metal pattern 313. The contact diffusion barrier pattern 311 and the contact metal pattern 313 may constitute a storage node contact BC. Subsequently, a conductive layer may be formed on the storage node contact BC and the bit-line capping patterns 337, and then the conductive layer may be etched to form landing pads LP and to form trenches between the landing pads LP. The trenches may be filled with a dielectric layer, and then an etch-back process or a chemical mechanical polishing (CMP) process may be performed to form landing pad separation patterns LPS.

According to some embodiments of the present inventive concepts, a method of fabricating a semiconductor memory device may include forming a storage node pad XP of which area is greater than that of the second impurity region 3b and forming the storage node contact hole BCH that exposes the storage node pad XP. Therefore, it may be possible to securely obtain a misalignment margin when the storage node contact hole BCH is formed. Accordingly, process defects may be reduced.

Figure 18:
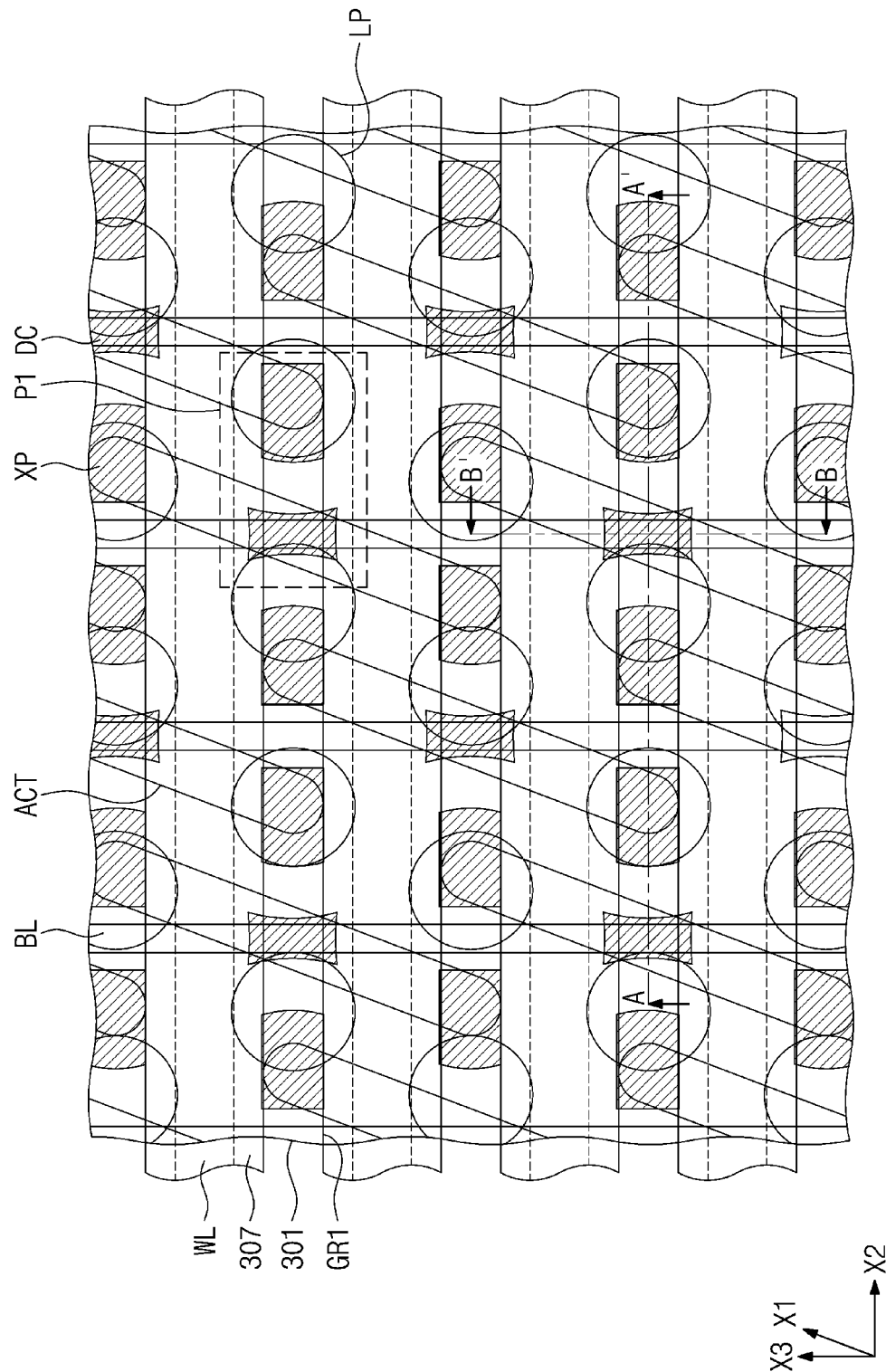
FIG. 18 illustrates a plan view showing a semiconductor memory device according to some embodiments of the present inventive concepts.
Figure 19:
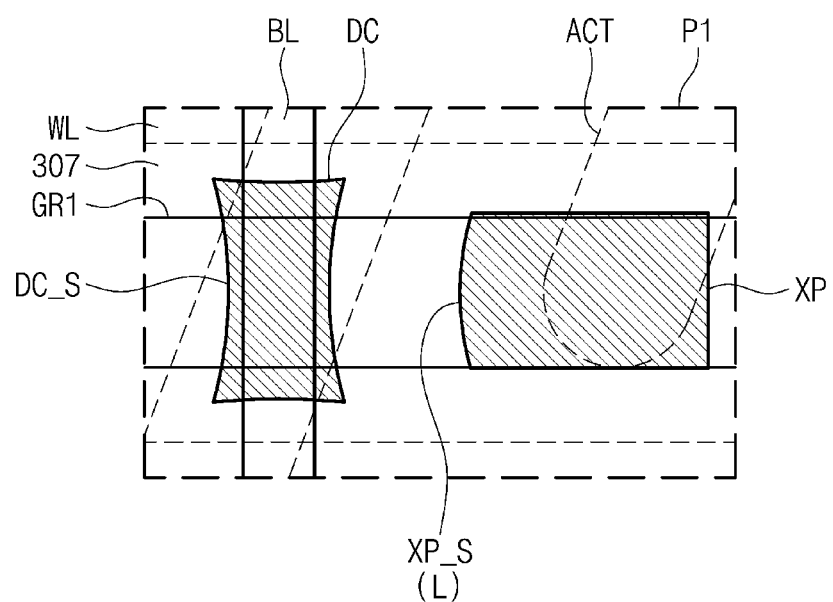
FIG. 19 illustrates an enlarged view showing section P1 of FIG. 18.

FIG. 18 illustrates a plan view showing a semiconductor memory device according to some embodiments of the present inventive concepts. FIG. 19 illustrates an enlarged view showing section P1 of FIG. 18.

Referring to FIGS. 18 and 19, for a semiconductor memory device according to the present embodiment, the bit-line contact DC may have a shape similar to a rectangular shape when viewed in plan and may have sidewalls DC_S that are inwardly recessed. When viewed in plan, the storage node pad XP may have a pad left sidewall XP_S(1) that protrudes toward the bit-line contact DC. Other configurations may be identical or similar to those discussed with reference to FIGS. 1A to 3A.

Figure 20:
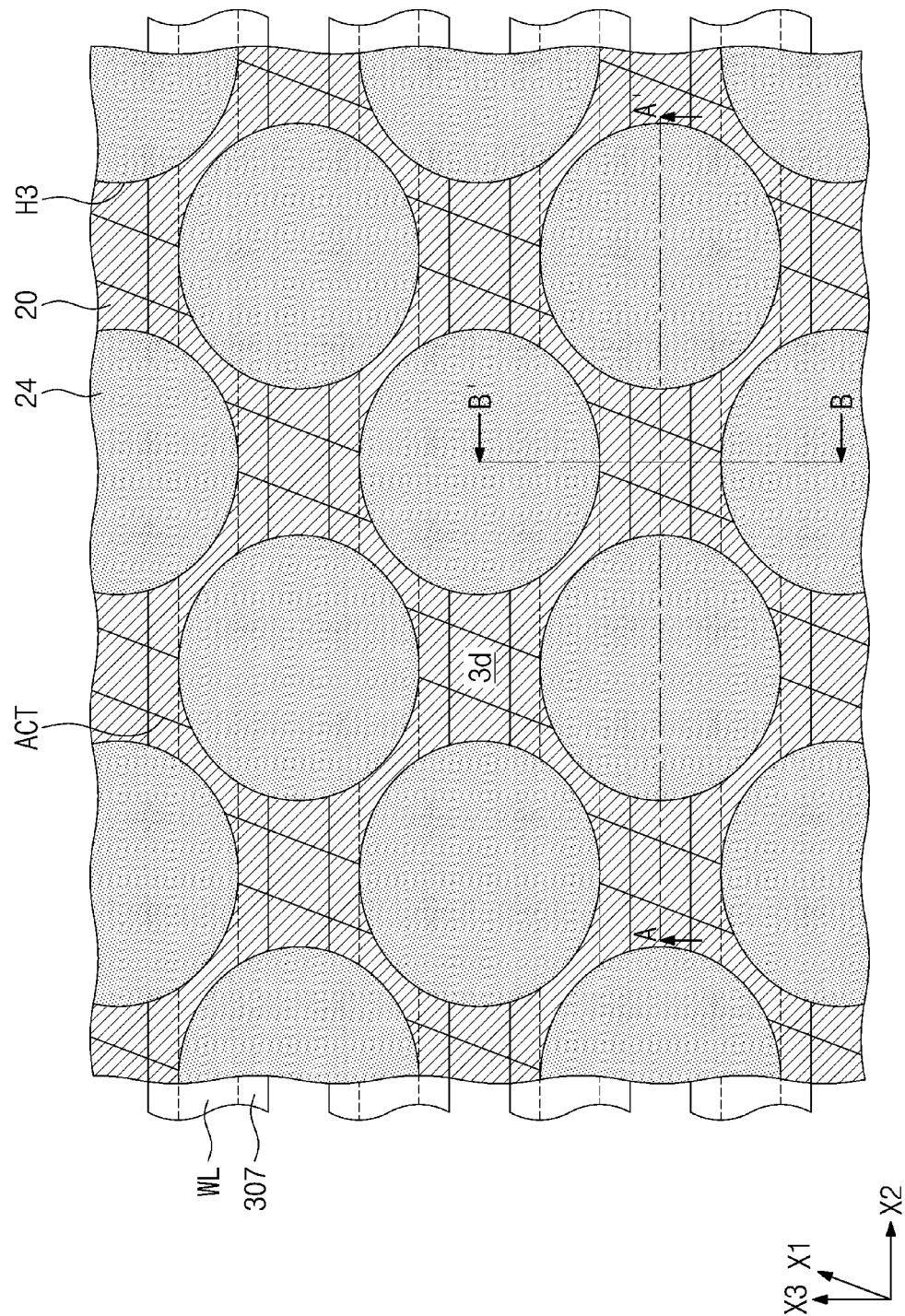
FIG. 20 illustrates a plan view showing a method of fabricating a semiconductor memory device having the cross-sectional view of FIG. 18.

FIG. 20 illustrates a plan view showing a method of fabricating a semiconductor memory device having the cross-sectional view of FIG. 18.

Referring to FIG. 20, the second mask pattern 24 may not be formed to have a network shape as shown in FIG. 5A, but may be formed to have a plurality of isolated island shapes as shown in FIG. 20. The second mask patterns 24 may expose a top surface of the conductive layer 20 that overlaps the first impurity region 3d. The conductive layer 20 may constitute a network shape on its top surface exposed by the second mask patterns 24. Subsequent processes may be identical or similar to those discussed with reference to FIGS. 5A to 17B.

Figure 21A:
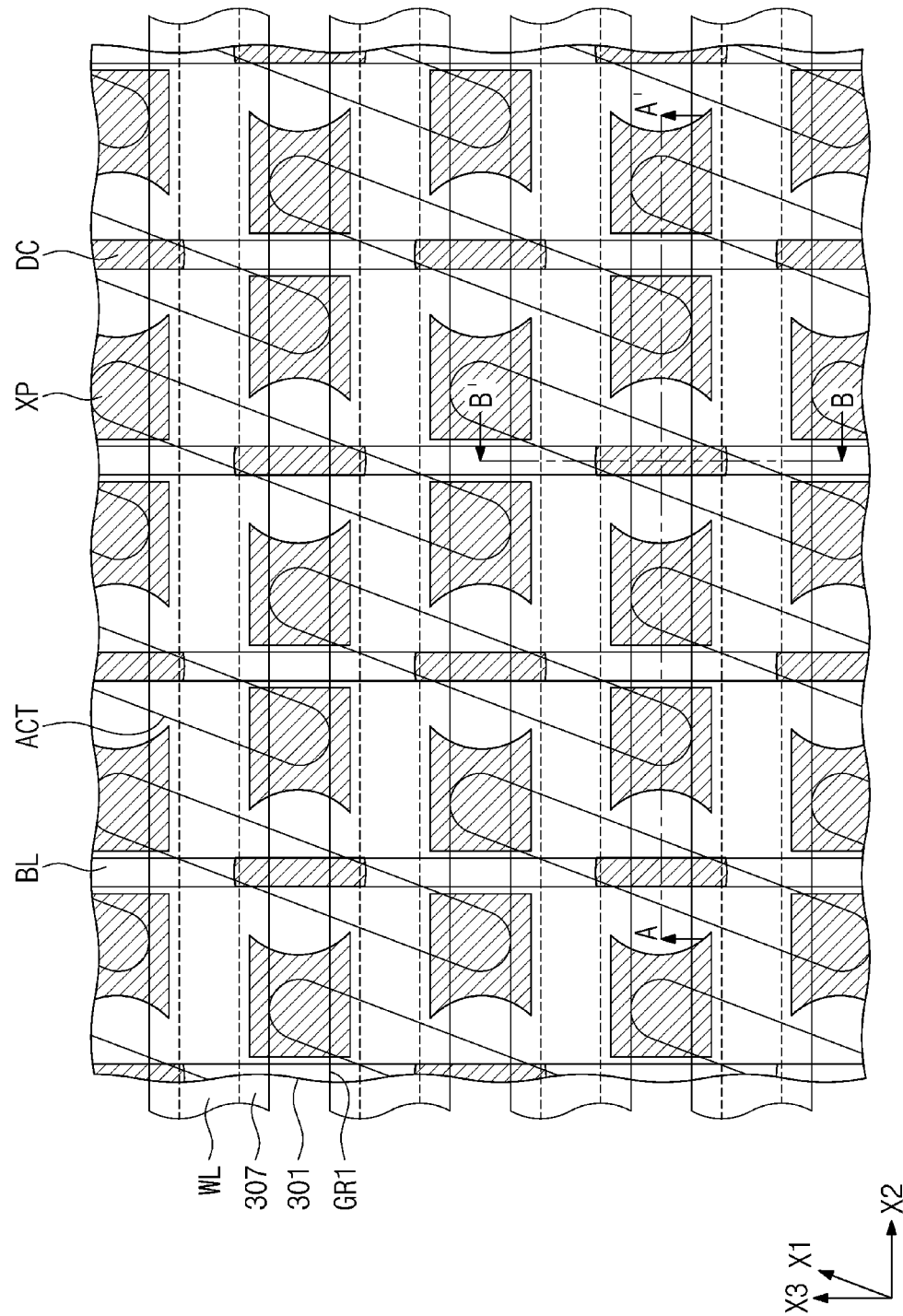
FIG. 21A illustrates a plan view showing a semiconductor memory device according to some embodiments of the present inventive concepts.
Figure 21B:
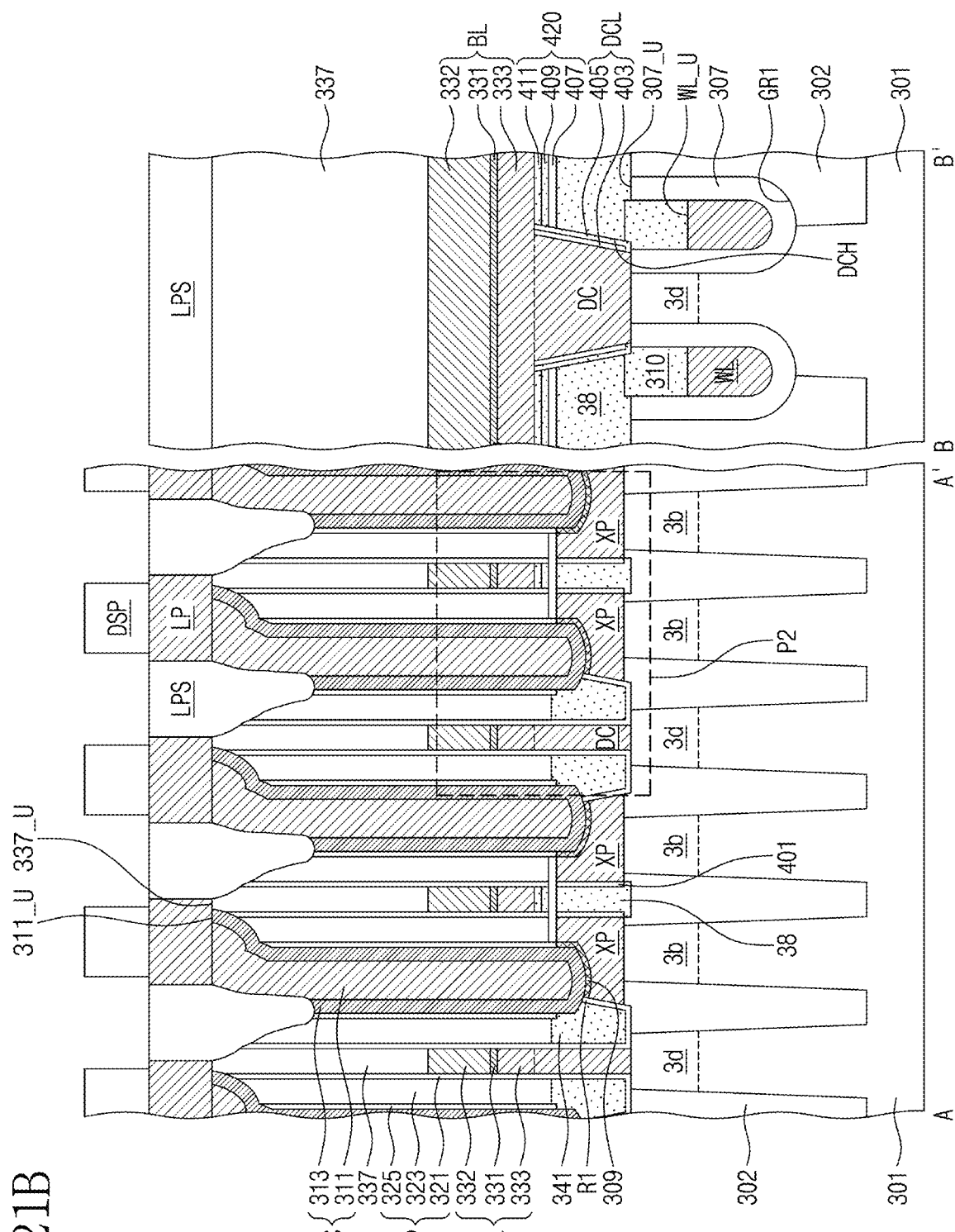
FIG. 21B illustrates a cross-sectional view taken along lines A-A' and B-B' of FIG. 21A.
Figure 22A:
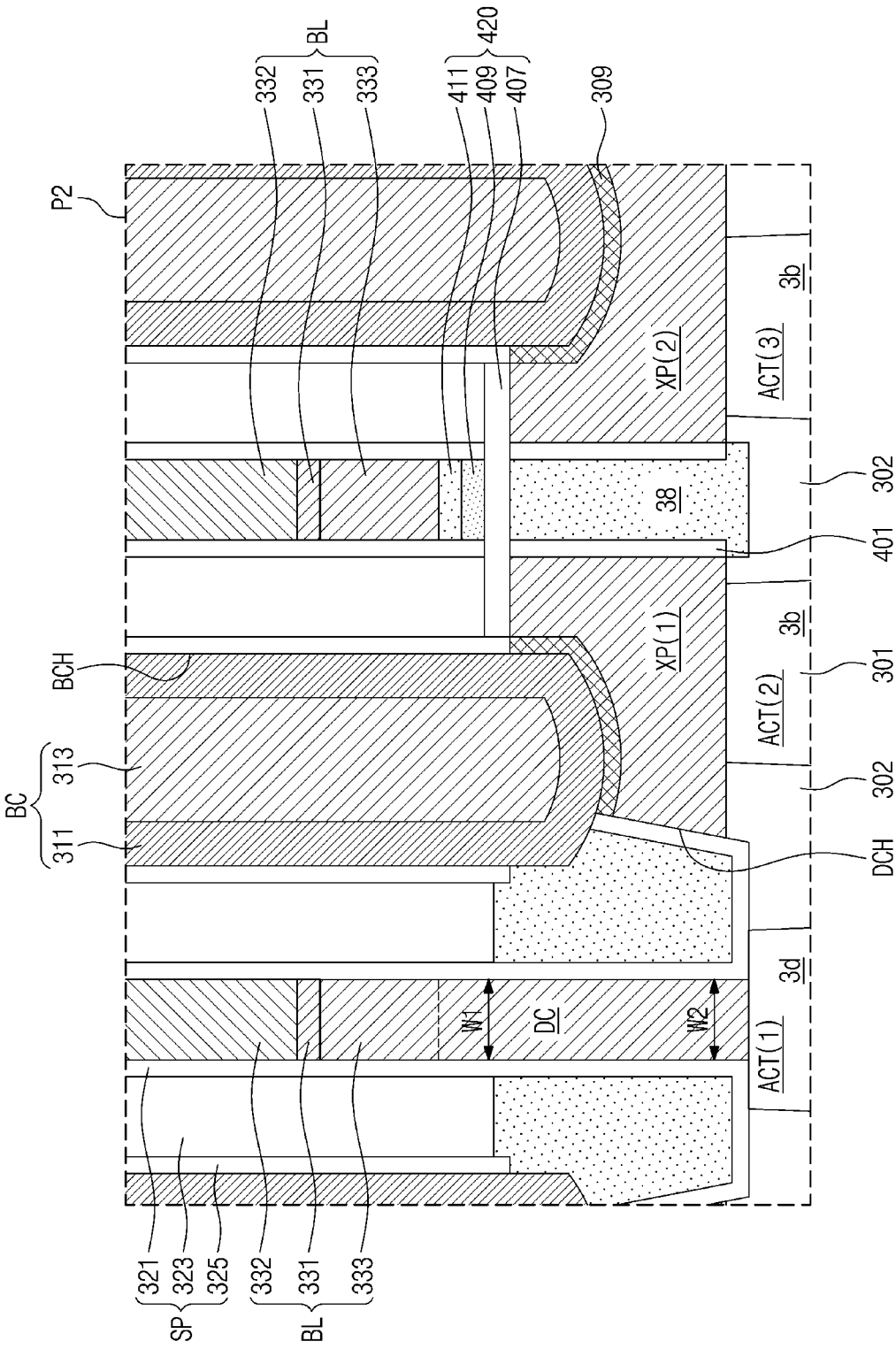
FIGS. 22A and 22B illustrate enlarged views showing section P2 of FIG. 21B.
Figure 22B:
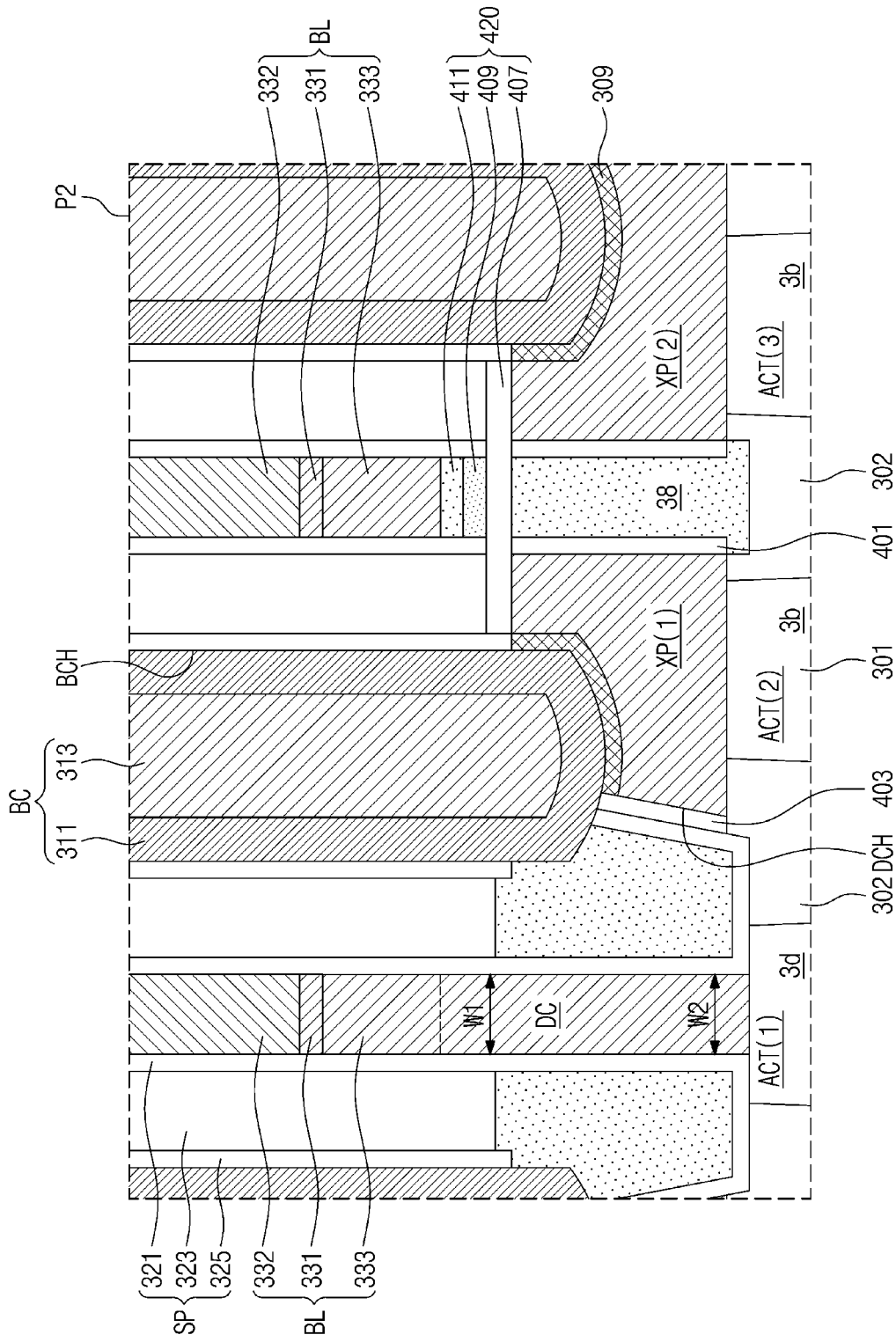

FIG. 21A illustrates a plan view showing a semiconductor memory device according to some embodiments of the present inventive concepts. The landing pad LP is omitted from FIG. 21A. FIG. 21B illustrates a cross-sectional view taken along lines A-A' and B-B' of FIG. 21A. FIGS. 22A and 22B illustrate enlarged views showing section P2 of FIG. 21B.

Referring to FIGS. 21A, 21B, and 22A, in some embodiments, the bit-line contact DC may have a width that is uniform regardless of height. For example, the bit-line contact DC may have a first width W1 at an upper portion of the bit-line contact DC and a second width W2 at a lower portion thereof, and the first width W1 may be substantially the same as the second width W2. The first width W1 may be about 0.9 times to about 1.1 times the second width W2. When viewed in plan as shown in FIG. 21A, the bit-line contact DC may not have a circular shape, but have a bar shape that elongates in the third direction X3. The bit-line contact DC may overlap the bit line BL.

In some embodiments, as the bit-line contact DC has a width that is uniform regardless of height, a relatively large distance may be provided between the bit-line contact DC and the storage node pad XP. Accordingly, it may be possible to suppress BBD defects (i.e., defects arising from BBD).

The bit line BL may further include a bit-line polysilicon pattern 333 in addition to the bit-line diffusion barrier pattern 331 and the bit-line wire pattern 332. The bit-line polysilicon pattern 333 may be interposed between the bit-line contact DC and the bit-line diffusion barrier pattern 331 and between the interlayer dielectric layer 420 and the bit-line diffusion barrier pattern 331. The bit-line polysilicon pattern 333 and the bit-line contact DC may be integrally connected into a single unitary piece. The bit-line polysilicon pattern 333 and the bit-line contact DC may include or may be formed of polysilicon doped with the same impurity at the same concentration. No boundary may be present between the bit-line polysilicon pattern 333 and the bit-line contact DC.

A pad separation pattern 38 may be interposed between the storage node pads XP. A subsidiary dielectric pattern 401 may be interposed between the pad separation pattern 38 and the storage node pads XP. The subsidiary dielectric pattern 401 may include or may be formed of a material different from that of the pad separation pattern 38. The subsidiary dielectric pattern 401 may include or may be formed of a material whose dielectric constant is less than that of a material included in the pad separation pattern 38. For example, the pad separation pattern 38 may include or may be formed of silicon nitride, and the subsidiary dielectric pattern 401 may include or may be formed of silicon oxide. The pad separation pattern 38 and the subsidiary dielectric pattern 401 may have top surfaces that are coplanar with each other.

The interlayer dielectric layer 420 may include first, second, and third interlayer dielectric layers 407, 409, and 411 that are sequentially stacked. The second and third interlayer dielectric layers 409 and 411 may have sidewalls aligned with that of the bit line BL. The first interlayer dielectric layer 407 may have a width greater that those of the second and third interlayer dielectric layers 409 and 411. The first interlayer dielectric layer 407 may have a sidewall aligned with that of the first spacer 323. Each of the first, second, and third interlayer dielectric layers 407, 409, and 411 may include or may be formed of a dielectric material having etch selectivity with respect to a material included in any one of the first, second, and third interlayer dielectric layers 407, 409, and 411. The first, second, and third interlayer dielectric layers 407, 409, and 411 may include materials different from each other. For example, the first interlayer dielectric layer 407 may include or may be formed of silicon oxide. The second interlayer dielectric layer 409 may include or may be formed of metal oxide. The metal oxide may be, for example, at least one selected from hafnium oxide, aluminum oxide, ruthenium oxide, and iridium oxide. The third interlayer dielectric layer 411 may include or may be formed of silicon nitride.

A semiconductor memory device according to some embodiments may be configured such that the contact dielectric pattern 30r of FIG. 1B is not interposed between the bit-line contact DC and the storage node pad XP. The bit-line contact DC may be disposed in a contact hole DCH, and may conformally cover a bottom surface and an inner sidewall of the contact hole DCH. A buried dielectric pattern 341 may fill the contact hole DCH. The buried dielectric pattern 341 and the spacer liner 321 may be interposed between the bit-line contact DC and the storage node pad XP.

As shown in the B-B' cross-section of FIG. 21B, the bit line BL may be provided thereunder with a contact dielectric pattern DCL interposed between the bit-line contact DC and the pad separation pattern 38. The contact dielectric pattern DCL may include a first contact dielectric pattern 403 and a second contact dielectric pattern 405. The first contact dielectric pattern 403 may be in contact with a sidewall of the contact hole DCH, or a sidewall of the pad separation pattern 38 and a sidewall of the interlayer dielectric layer 420. The second contact dielectric pattern 405 may be in contact with a sidewall of the bit-line contact DC. The first contact dielectric pattern 403 may cover a bottom surface of the second contact dielectric pattern 405. The first contact dielectric pattern 403 and the second contact dielectric pattern 405 may include materials different from each other. For example, the first contact dielectric pattern 403 may include or may be formed of silicon nitride, and the second contact dielectric pattern 405 may include or may be formed of silicon oxide.

As shown in FIG. 22B, on a side of the bit line BL, the first contact dielectric pattern 403 may cover the sidewall of the contact hole DCH. The first contact dielectric pattern 403 may be interposed between the spacer liner 321 and the storage node pad XP.

In some embodiments, the pad separation pattern 38 may have a top surface lower than that of the bit-line contact DC. The bit-line contact DC may have a bottom surface lower than that of the storage node pad XP. The bit-line contact DC and the storage node pad XP may not be in contact with a lateral surface of the substrate 301 or a lateral surface of the active section ACT. Other configurations may be identical or similar to those discussed with reference to FIGS. 1A to 3B.

FIGS. 23A to 33A illustrate plan views showing a method of fabricating a semiconductor memory device having the plan view of FIG. 21A. FIGS. 23B to 27B, 27C to 28B, and 28B to 33B illustrate cross-sectional views showing a method of fabricating the semiconductor memory device of FIG. 21B. FIGS. 23B to 33B correspond to cross-sectional views taken along lines A-A' and B-B' of FIGS. 23A to 33A, respectively.

Figure 23A:
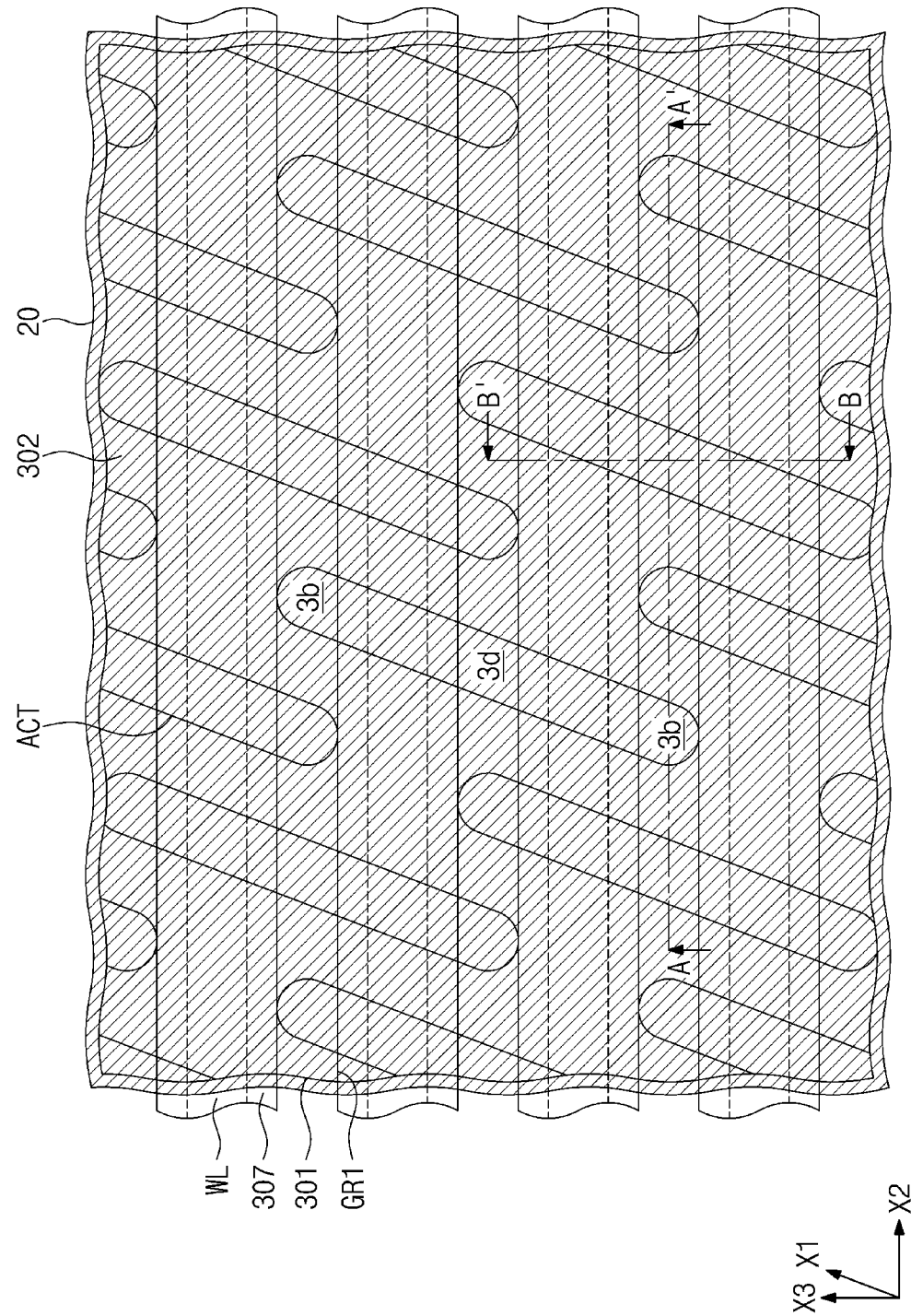
Figure 23B:
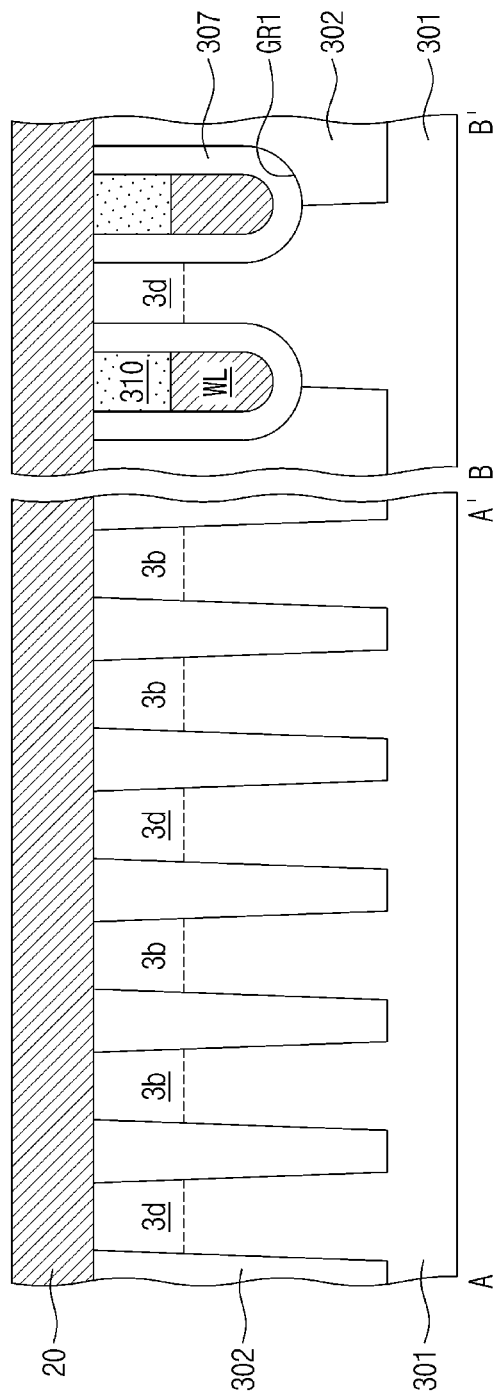

Referring to FIGS. 23A and 23B, as discussed with reference to FIGS. 4A and 4B, active sections ACT may be defined by forming device isolation patterns 302 in a substrate 301. Afterwards, word lines WL, word-line capping patterns 310, and first and second impurity regions 3d and 3b may be formed. A conductive layer 20 may be formed on the substrate 301. The conductive layer 20 may be, for example, an impurity-doped polysilicon layer. Before the formation of the conductive layer 20, as discussed in FIG. 4C, a process may be additionally performed in which an upper portion of the device isolation pattern 302 is selectively removed to expose sidewalls 301_S of the active sections ACT (or of the substrate 301).

Figure 24A:
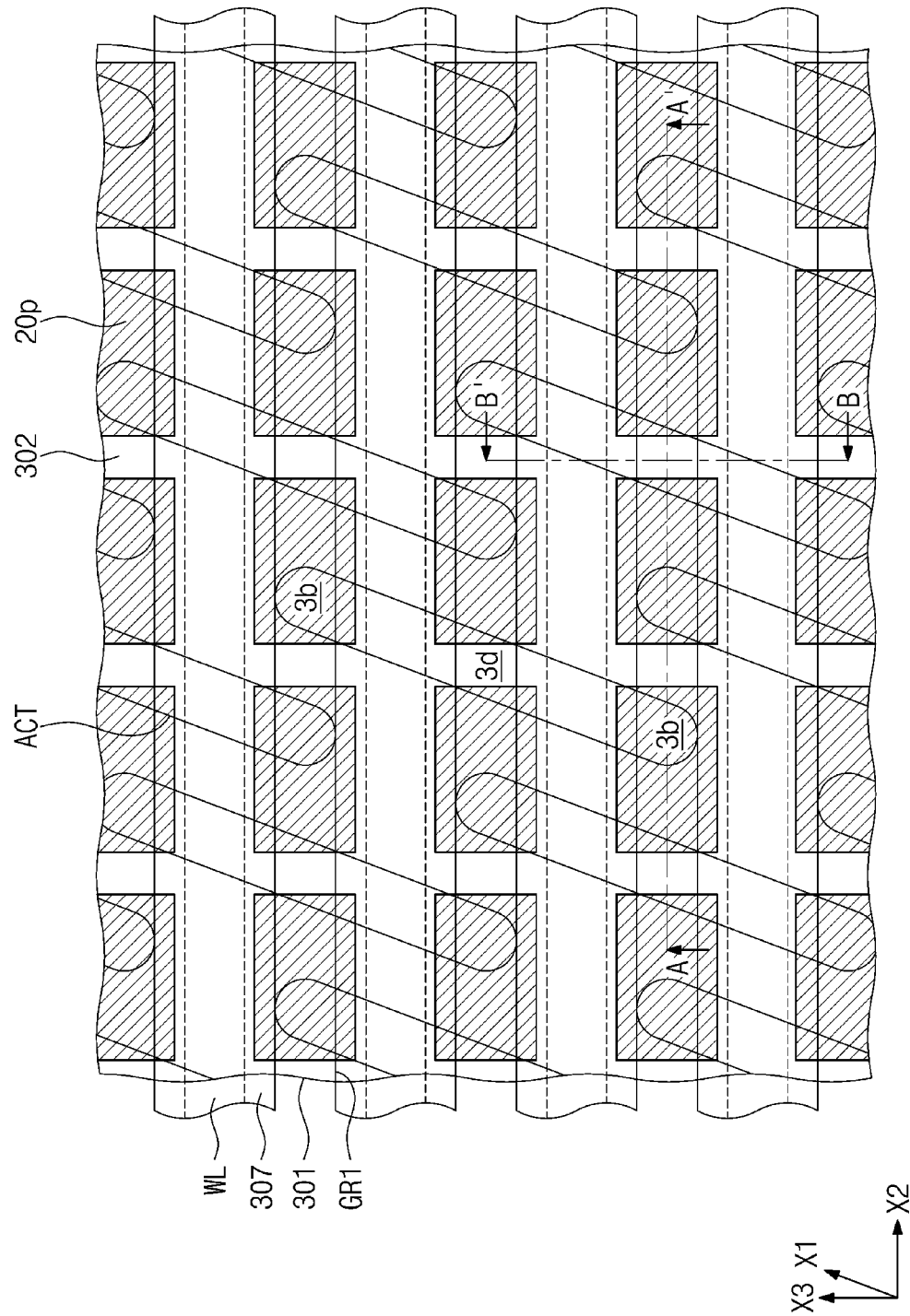
Figure 24B:
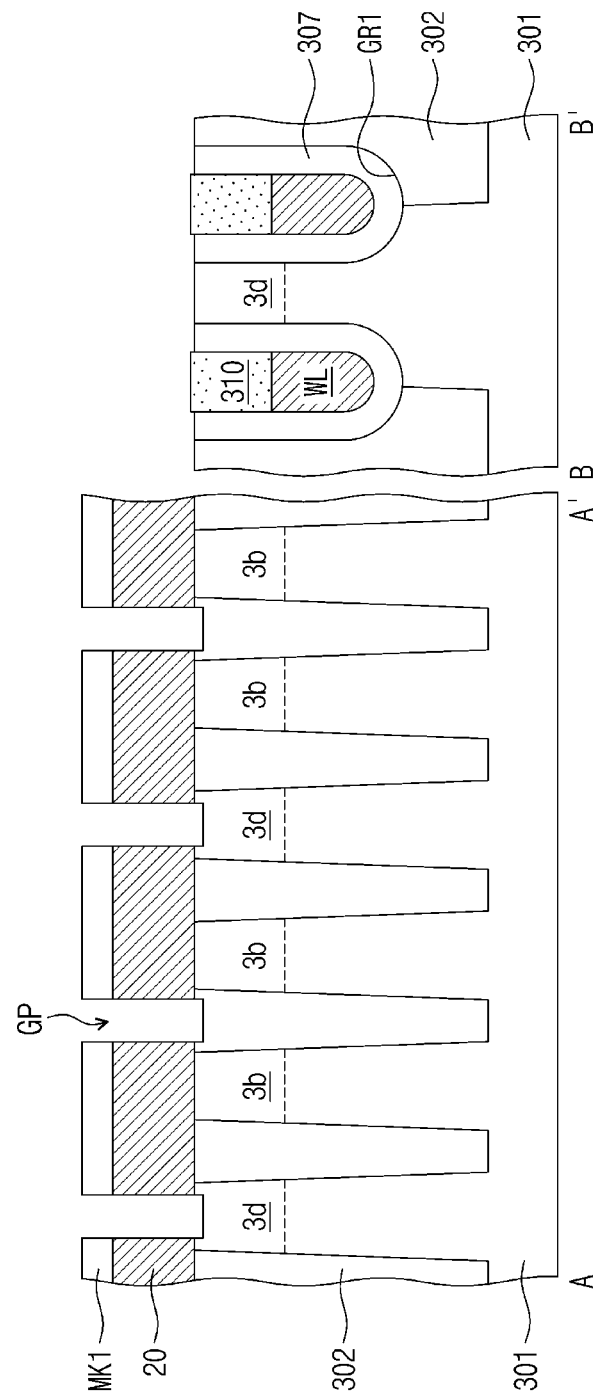

Referring to FIGS. 24A and 24B, mask patterns MK1 may be formed on the conductive layer 20. The mask patterns MK1 may include or may be formed of a material, such as silicon oxide, silicon nitride, and silicon oxynitride, which has etch selectivity with respect to the conductive layer 20. The mask patterns MK1 may be formed to have rectangular shapes that are two-dimensionally arranged along a second direction X2 and a third direction X3 to thereby constitute an array. The mask patterns MK1 may overlap the second impurity regions 3b. The mask patterns MK1 may be used as an etching mask to etch the conductive layer 20 to form conductive patterns 20p and gap regions GP between the conductive patterns 20p. The gap regions GP may partially expose the device isolation pattern 302, the active sections ACT, the word-line capping pattern 310, and the gate dielectric layer 307.

Figure 25A:
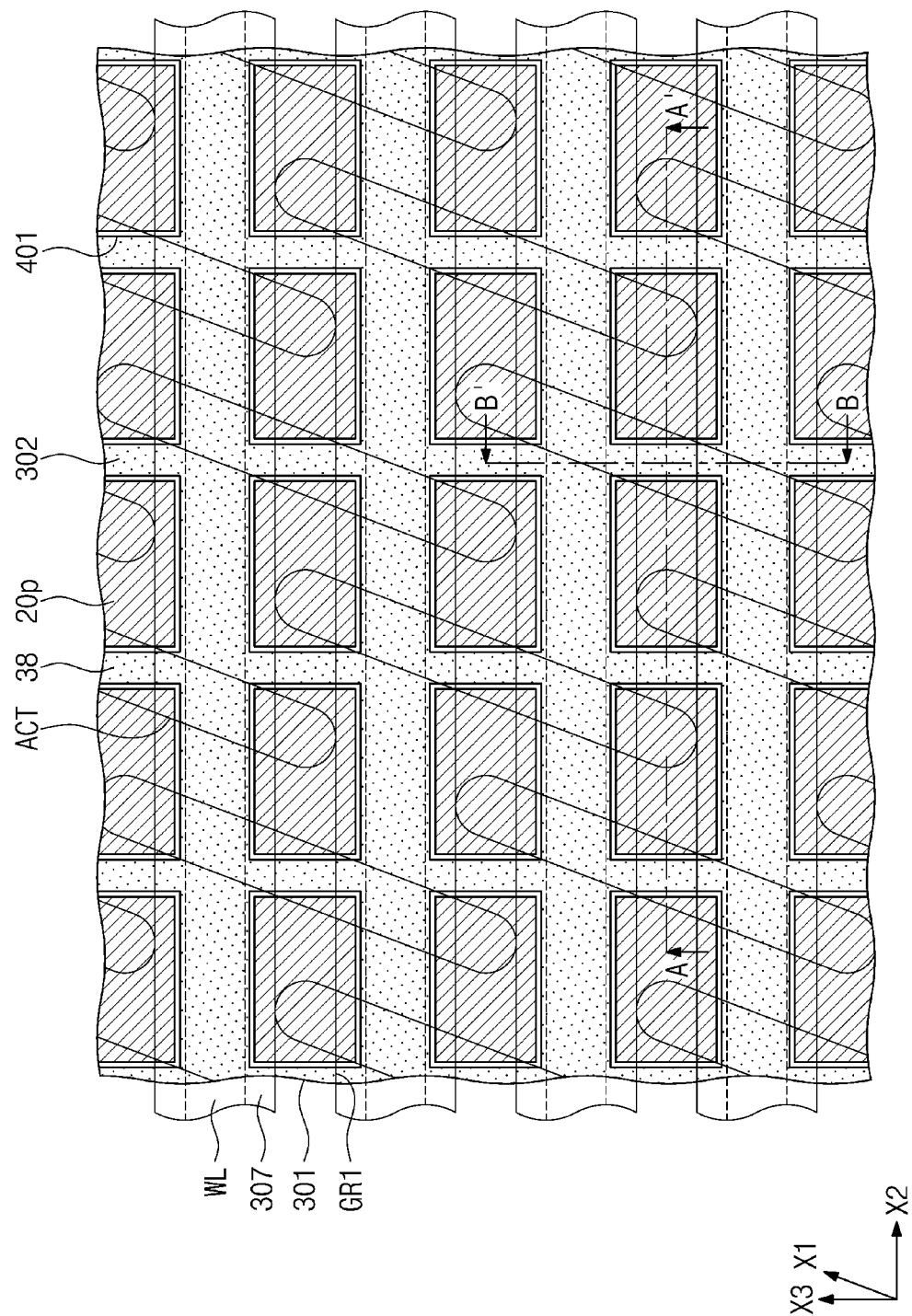
Figure 25B:
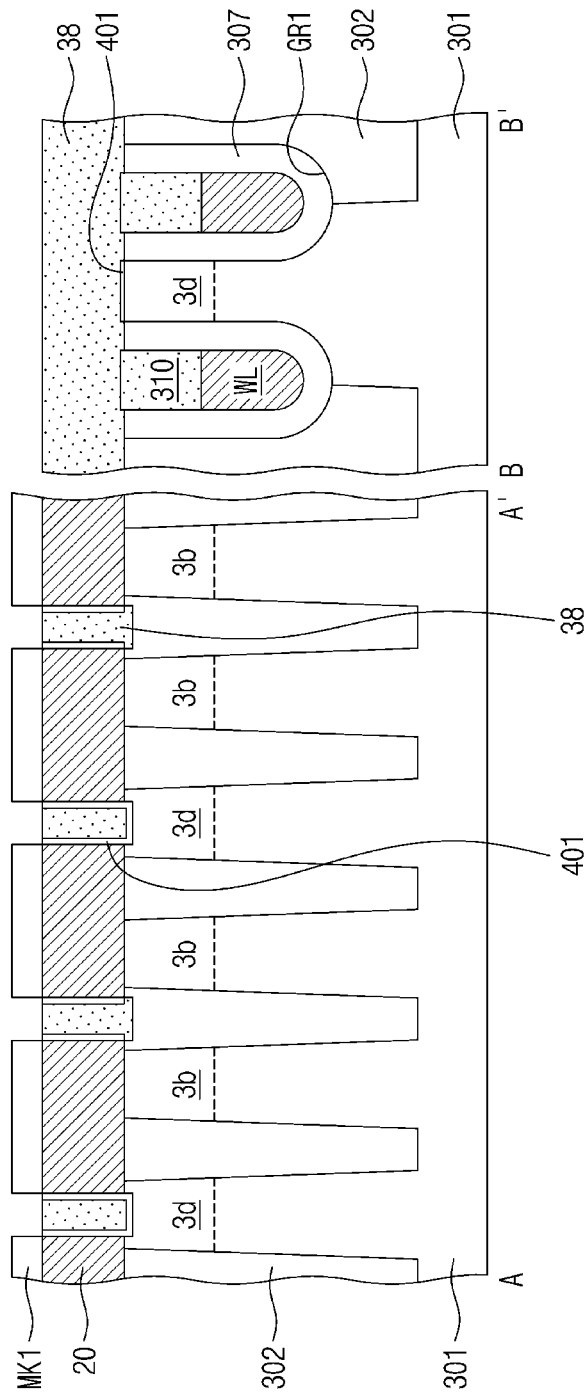
Figure 26A:
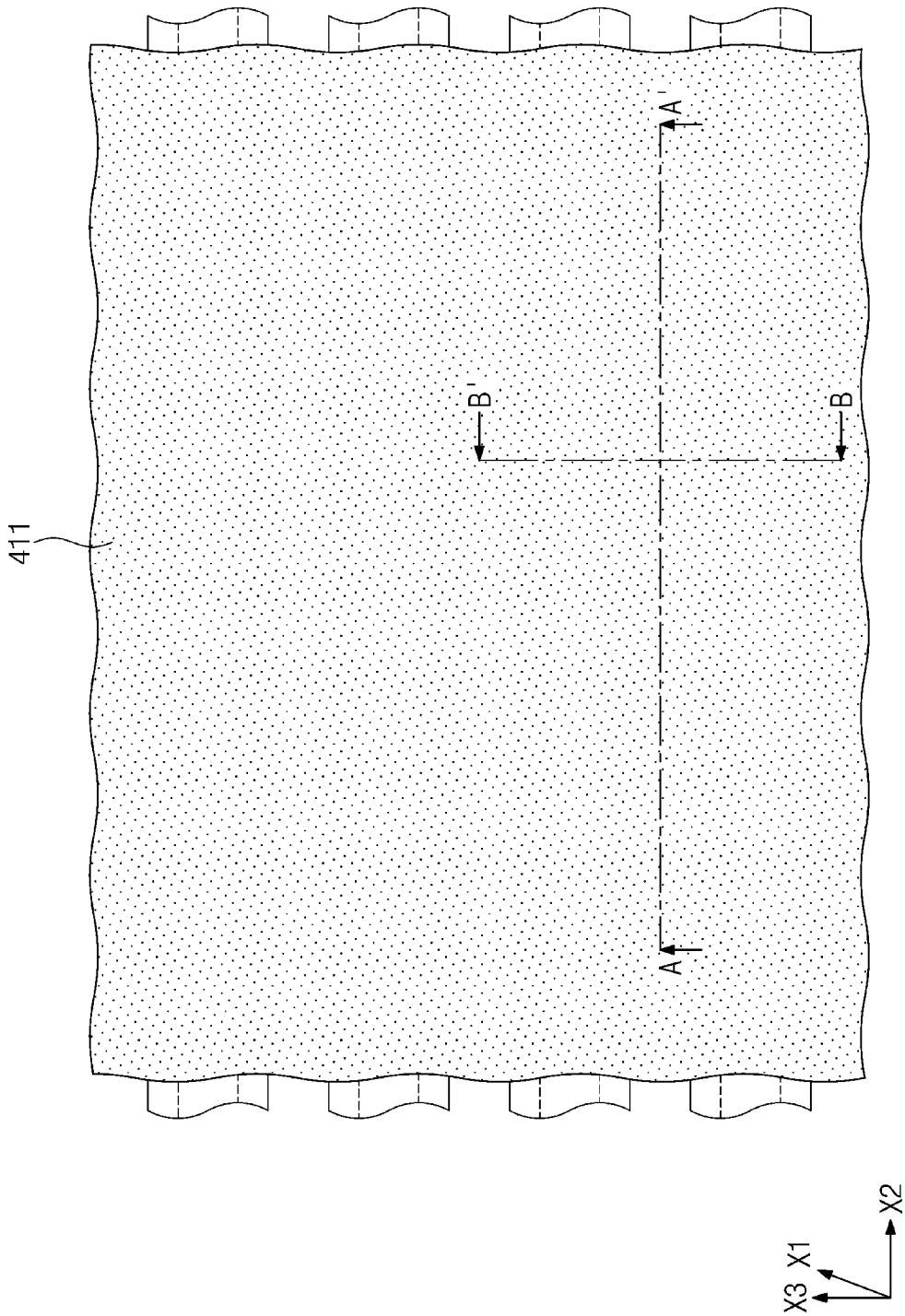
Figure 26B:
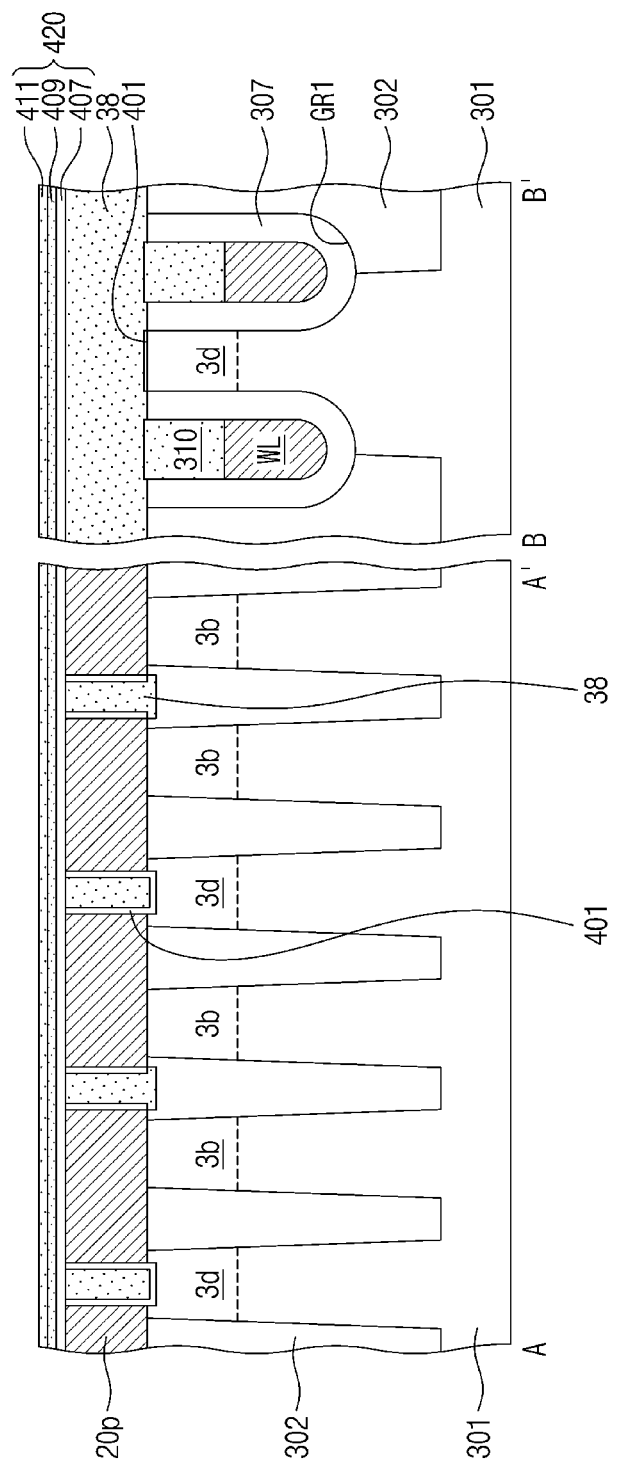

Referring to FIGS. 25A and 25B, a thermal oxidation process may be performed to form subsidiary dielectric patterns 401 on lateral surfaces of the conductive patterns 20p. The subsidiary dielectric patterns 401 may be formed on surfaces of the active sections ACT exposed to the gap regions GP. The subsidiary dielectric patterns 401 may be formed of silicon oxide. A pad separation layer may be formed to fill the gap regions GP, and the pad separation layer may then be etched back to form a pad separation pattern 38 in the gap regions GP. The pad separation pattern 38 may have a grid shape when viewed in plan.

As discussed in FIGS. 23A to 25B, the mask patterns MK1, which have rectangular shapes that constitute a two-dimensional array, may be used such that the conductive layer 20 may be etched once to form the pad separation pattern 38. In some embodiments, mask patterns may be formed to each have a linear shape elongated in the second direction X2, the conductive layer 20 may be etched to form preliminary conductive patterns that have linear shapes elongated in the second direction X2, and a line-shaped first pad separation pattern may be formed between the preliminary conductive patterns. Afterwards, an additional mask pattern having a linear shape elongated in the third direction X3 may be used to etch the preliminary conductive patterns and the first pad separation pattern to form the conductive patterns 20p having rectangular shapes that constitute a two-dimensional array, and then a grid-shaped pad separation pattern 38 may be eventually formed by forming a second pad separation pattern that fills between the conductive patterns 20p.

Referring to FIGS. 25A, 25B, 26A, and 26B, the mask patterns MK1 may be removed to expose top surfaces of the conductive patterns 20p. An interlayer dielectric layer 420 may be formed on the conductive patterns 20p and the pad separation pattern 38. The interlayer dielectric layer 420 may include first, second, and third interlayer dielectric layers 407, 409, and 411 that are sequentially stacked. For example, the first interlayer dielectric layer 407 may include or may be formed of silicon oxide, and the second interlayer dielectric layer 409 may include or may be formed of metal oxide. The third interlayer dielectric layer 411 may include or may be formed of silicon nitride.

Referring to FIGS. 26A, 26B, 27A, and 27B, the pad separation pattern 38 and the interlayer dielectric layer 420 on the first impurity regions 3d may be etched to form contact holes DCH that expose the first impurity regions 3d. At this step, the conductive patterns 20p adjacent to the pad separation pattern 38 may also be partially etched to form storage node pads XP. A first contact dielectric layer and a sacrificial layer may be conformally and sequentially formed on an entire surface of the substrate 301, and then may undergo an anisotropic etching process to form a first contact dielectric pattern 403 and a sacrificial pattern 404 that sequentially cover inner walls of the contact holes DCH. One of the first contact dielectric pattern 403 and the sacrificial pattern 404 may be formed of a material having etch selectivity with respect to the other of the first contact dielectric pattern 403 and the sacrificial pattern 404. For example, the first contact dielectric pattern 403 may include or may be formed of silicon nitride, and the sacrificial pattern 404 may include or may be formed of silicon oxide.

Figure 27A:
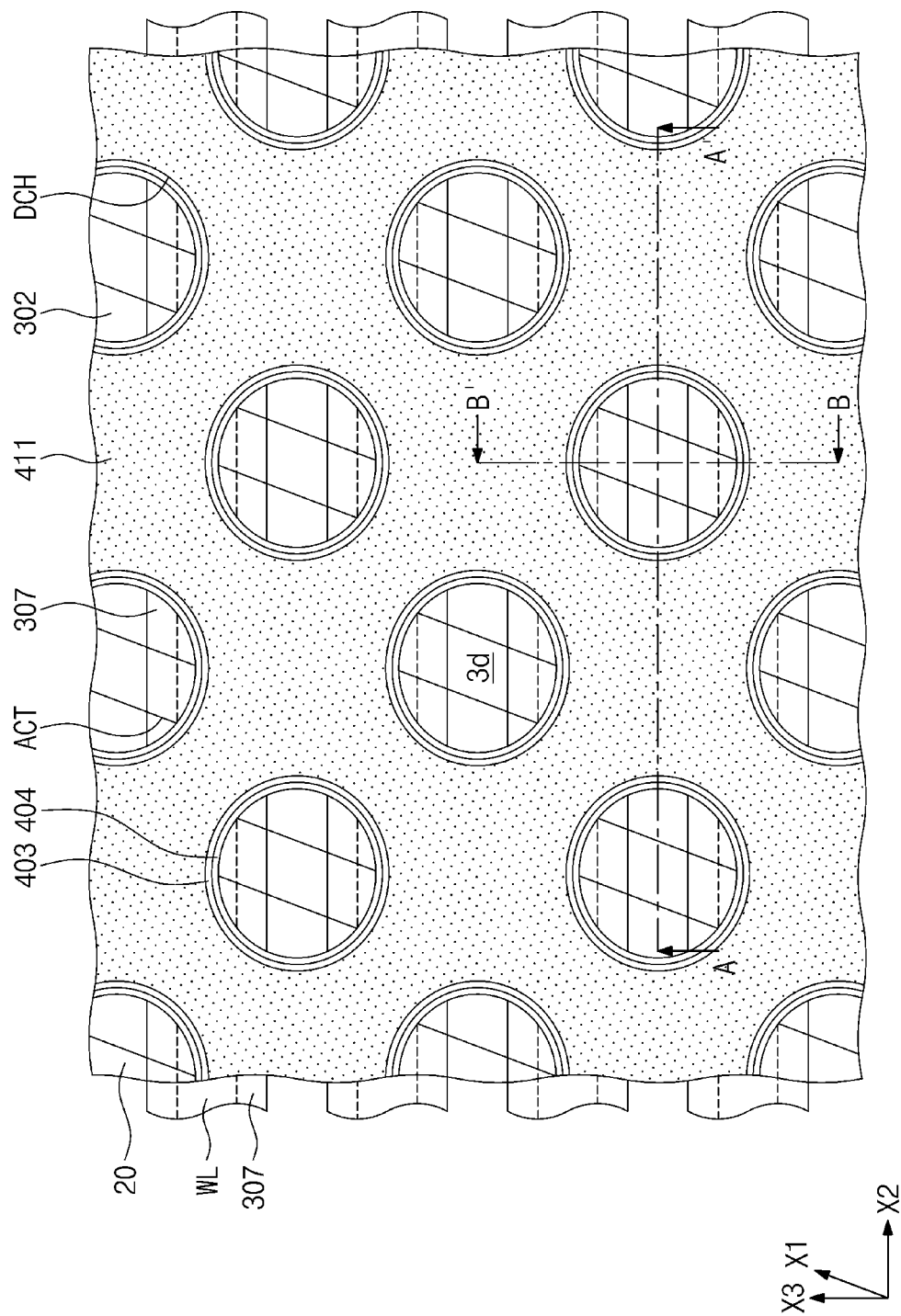
Figure 27B:
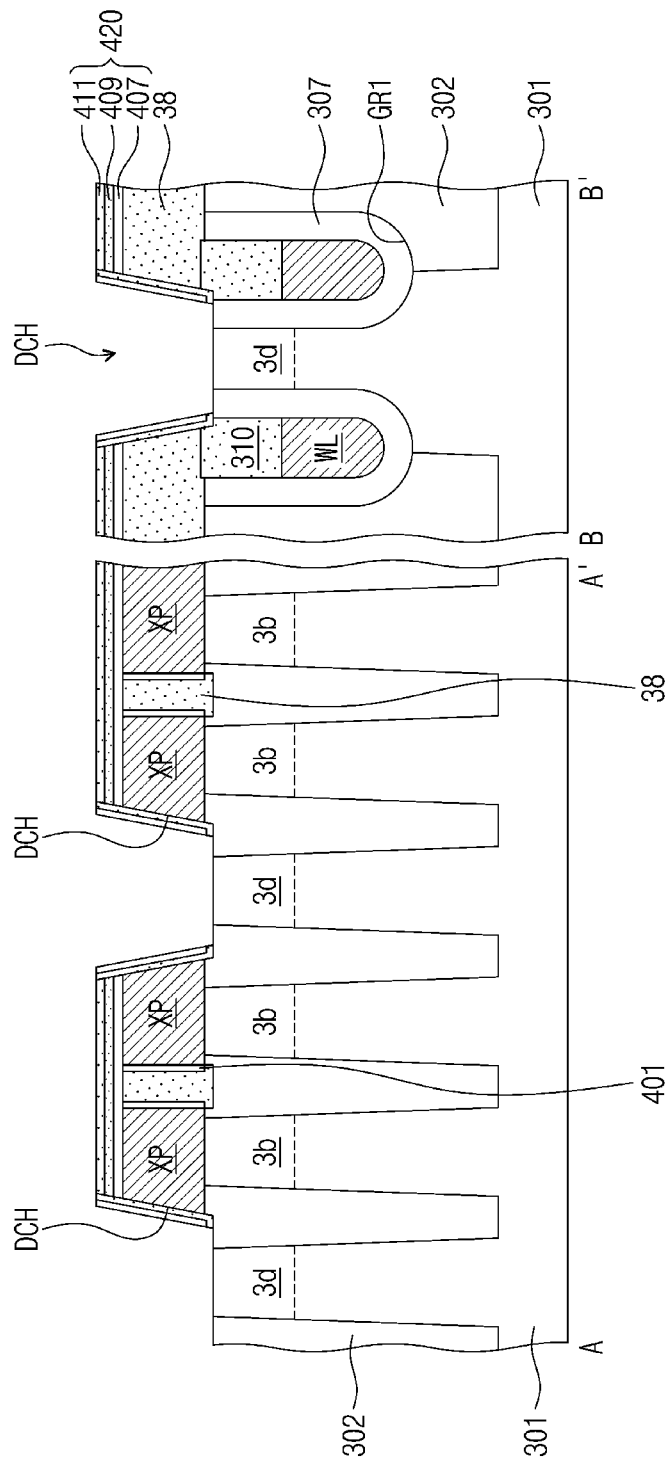
Figure 27C:
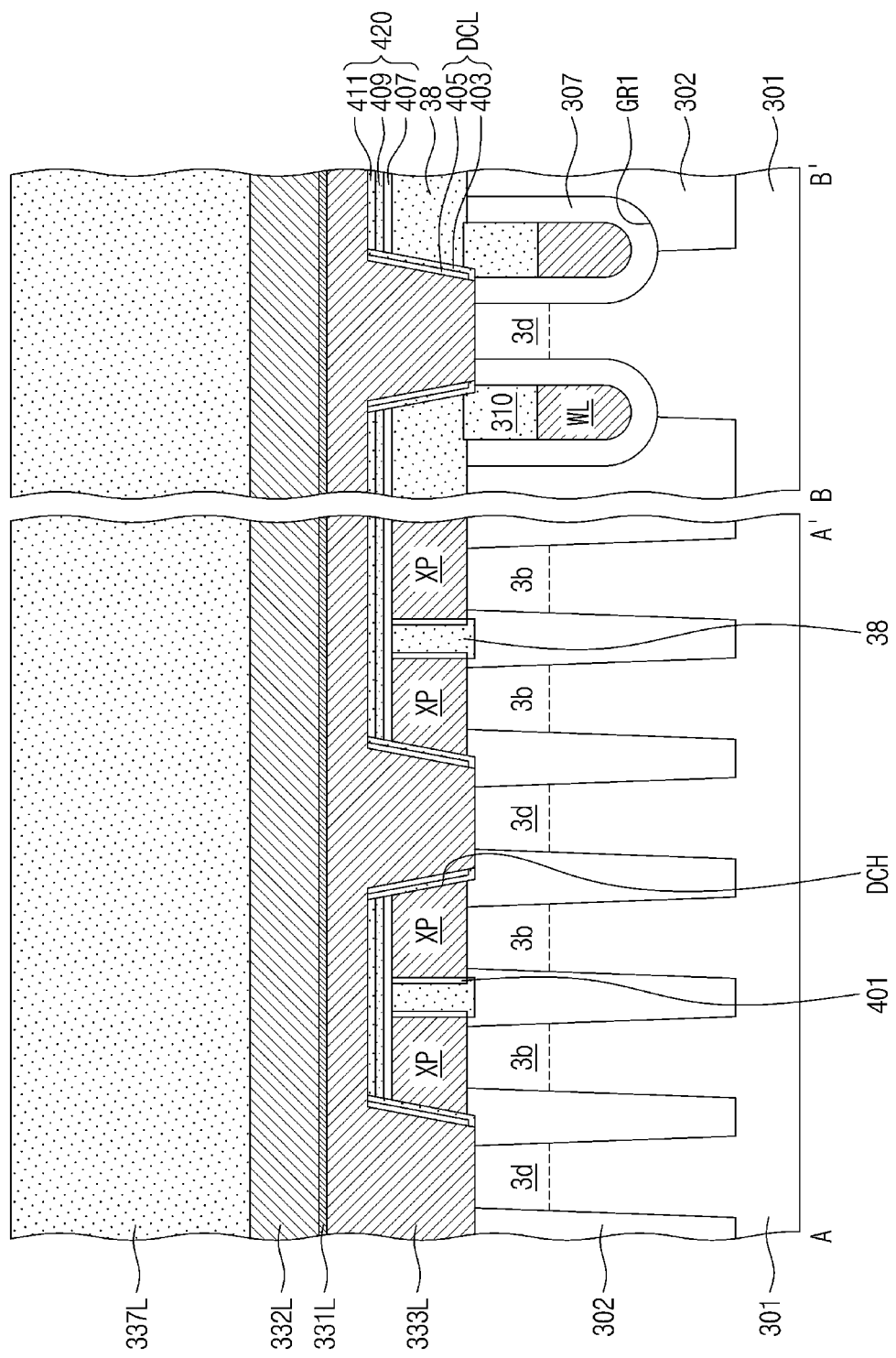

Referring to FIG. 27C, a polysilicon layer 333L, a bit-line diffusion barrier layer 331L, a bit-line wire layer 332L, and a bit-line capping layer 337L may be sequentially formed on the entire surface of the substrate 301. The polysilicon layer 333L may be doped with impurities. The polysilicon layer 333L may fill the contact holes DCH. After the polysilicon layer 333L is formed, a chemical mechanical polishing (CMP) process or an etch-back process may be performed on the polysilicon layer 333L to provide a flat top surface for the subsequent processes.

Figure 28A:
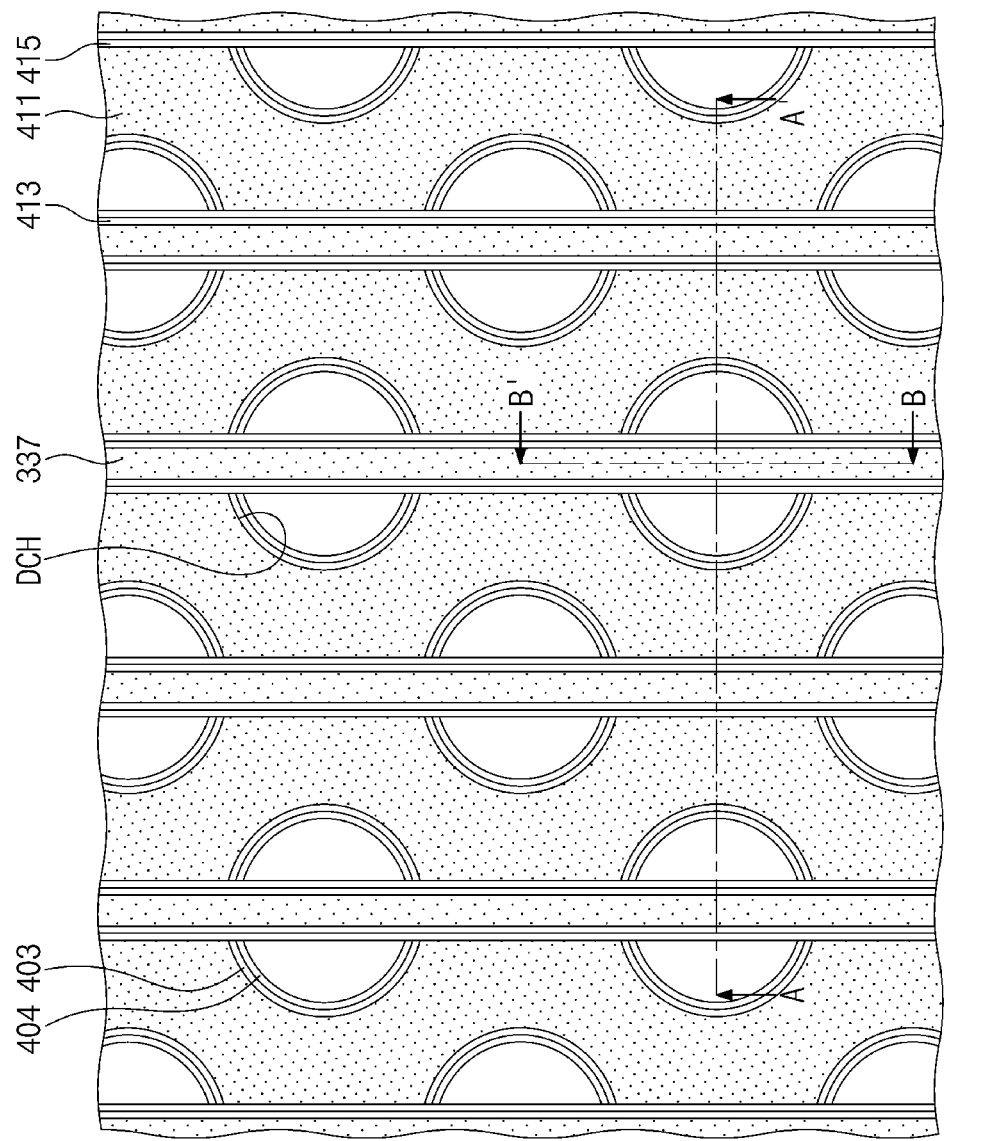
Figure 28B:
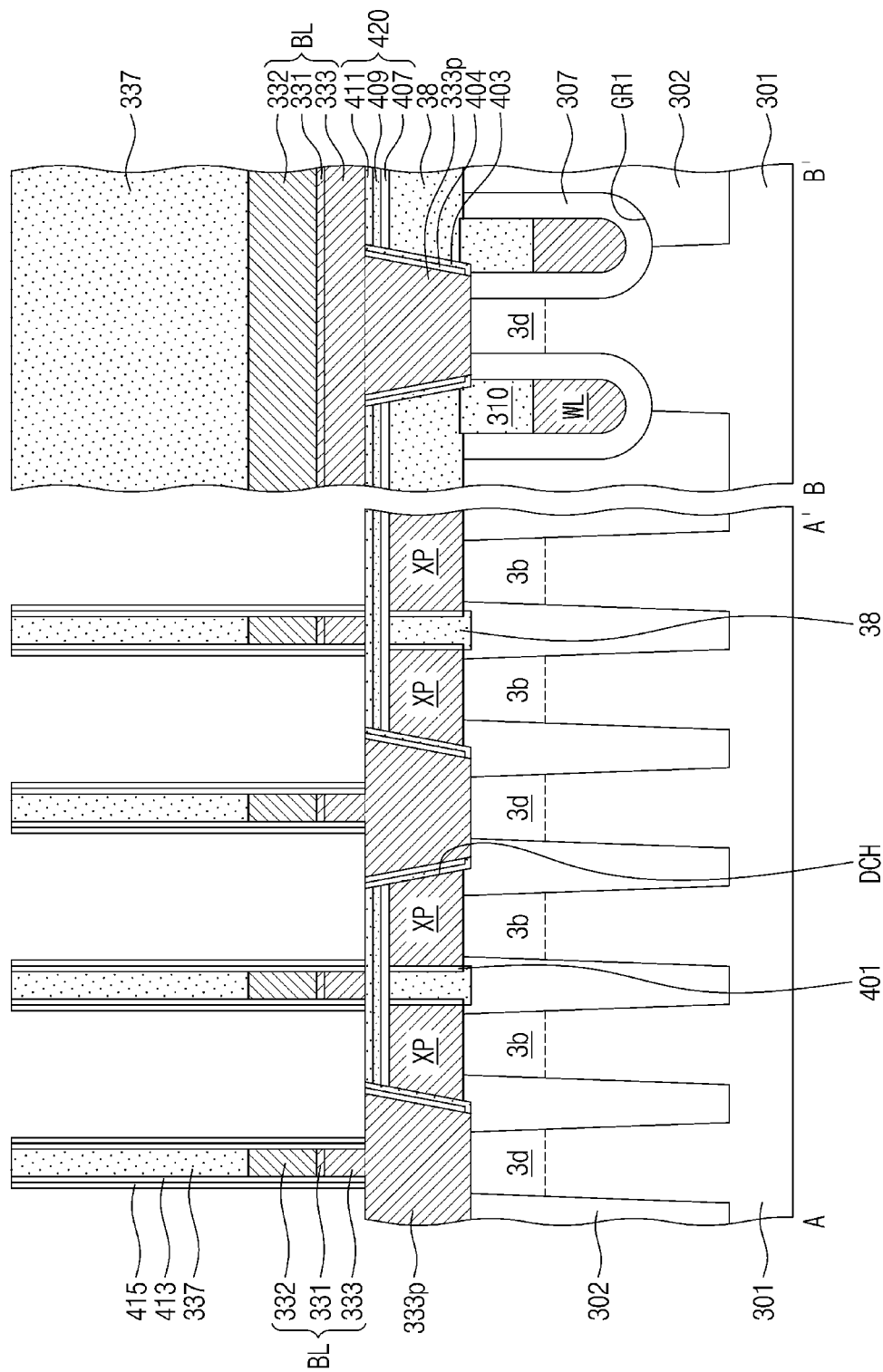
Figure 29A:
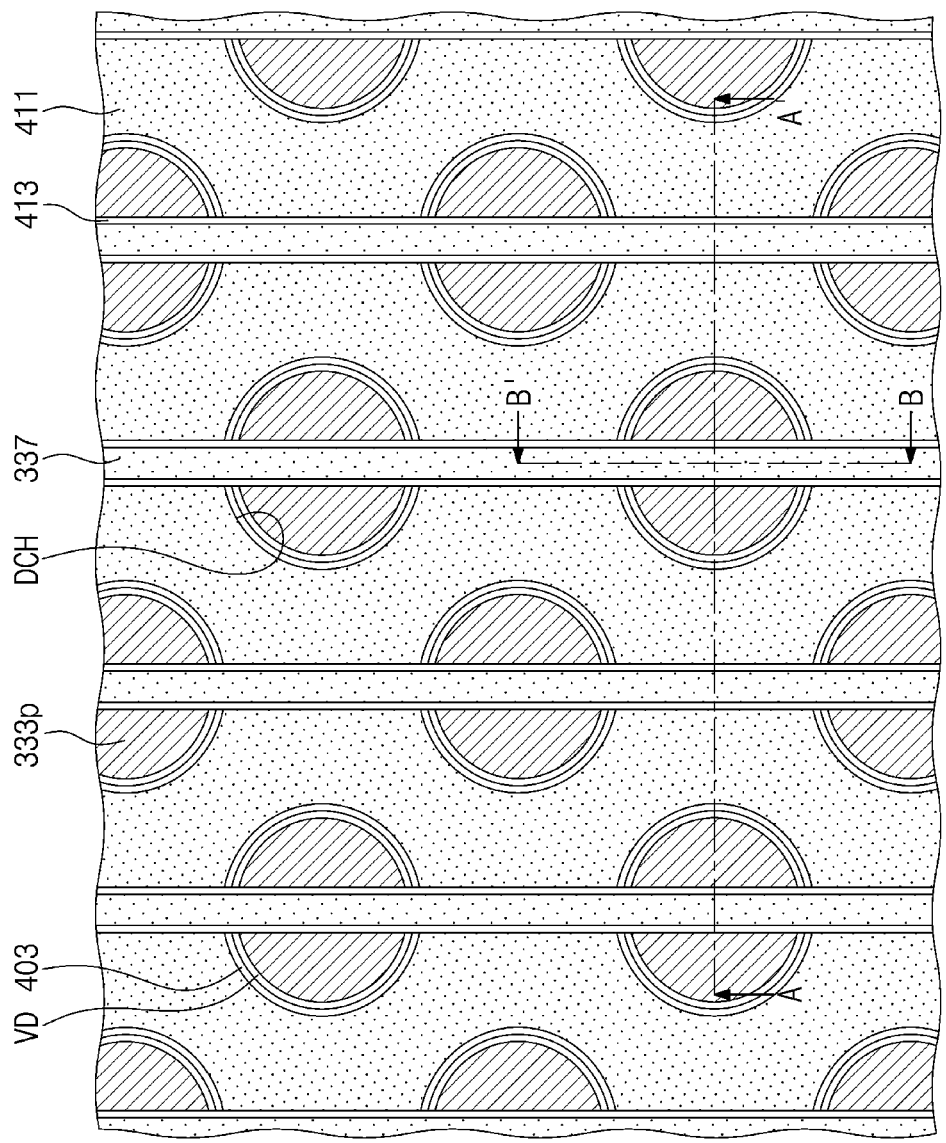
Figure 29B:
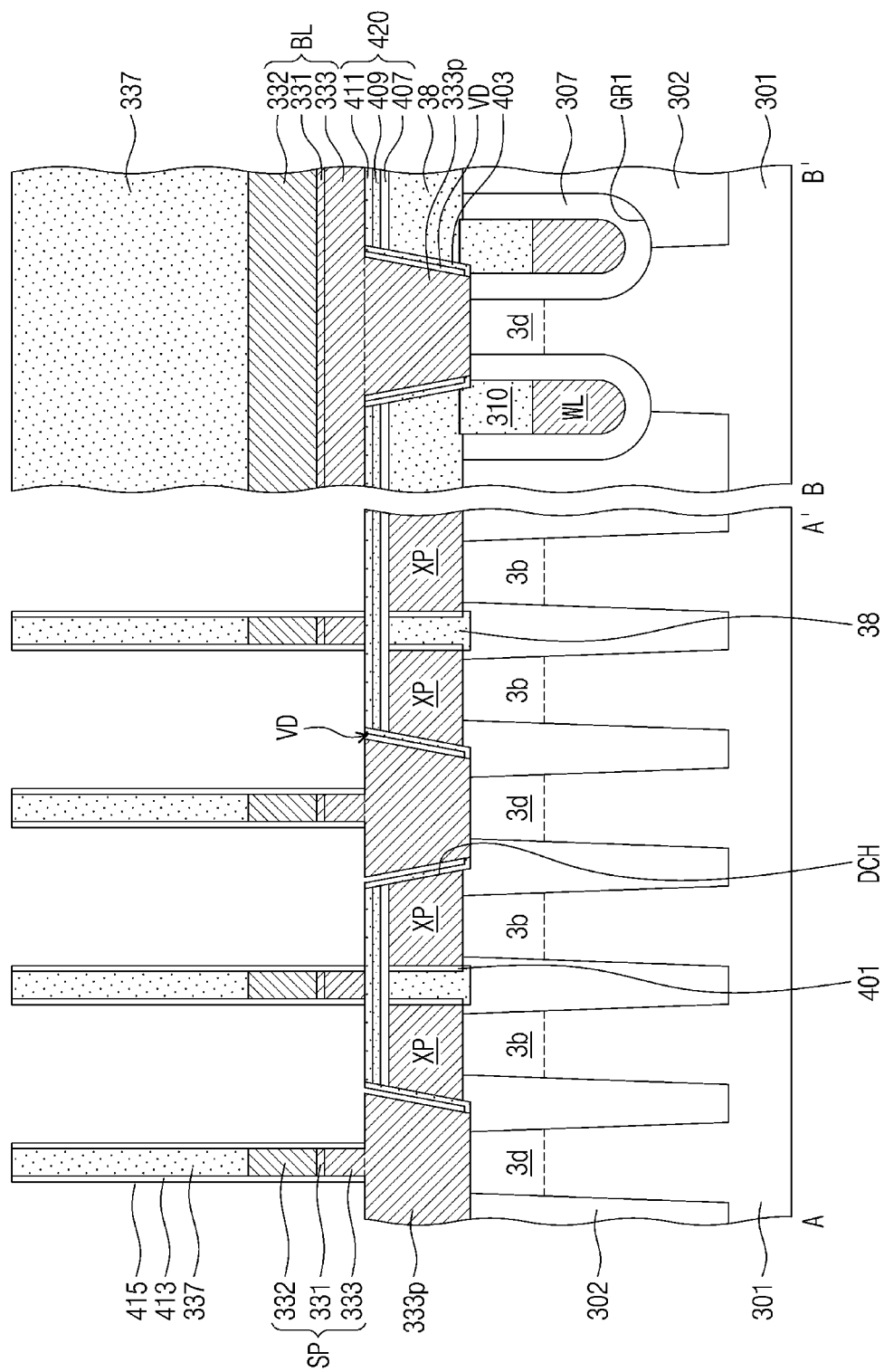
Figure 30A:
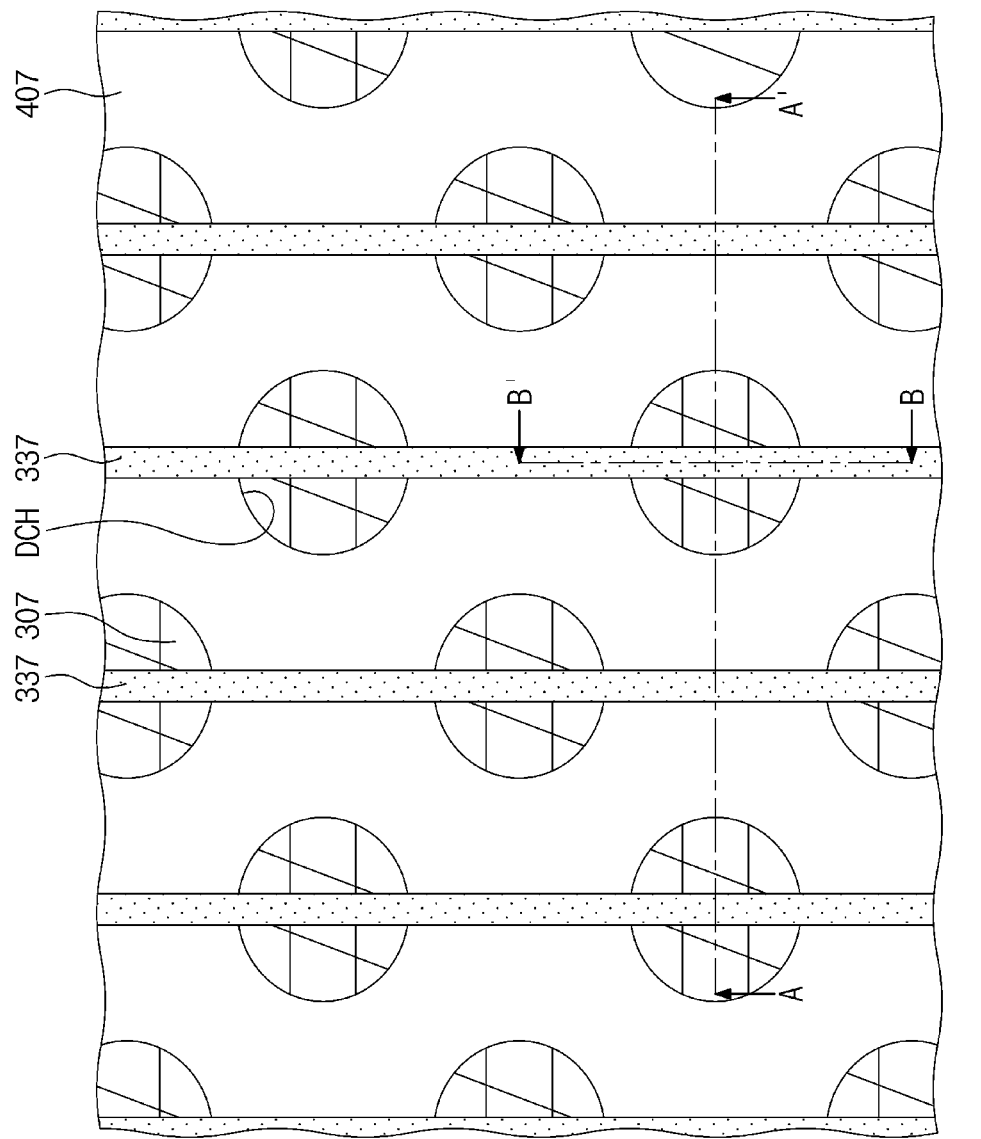
Figure 30B:
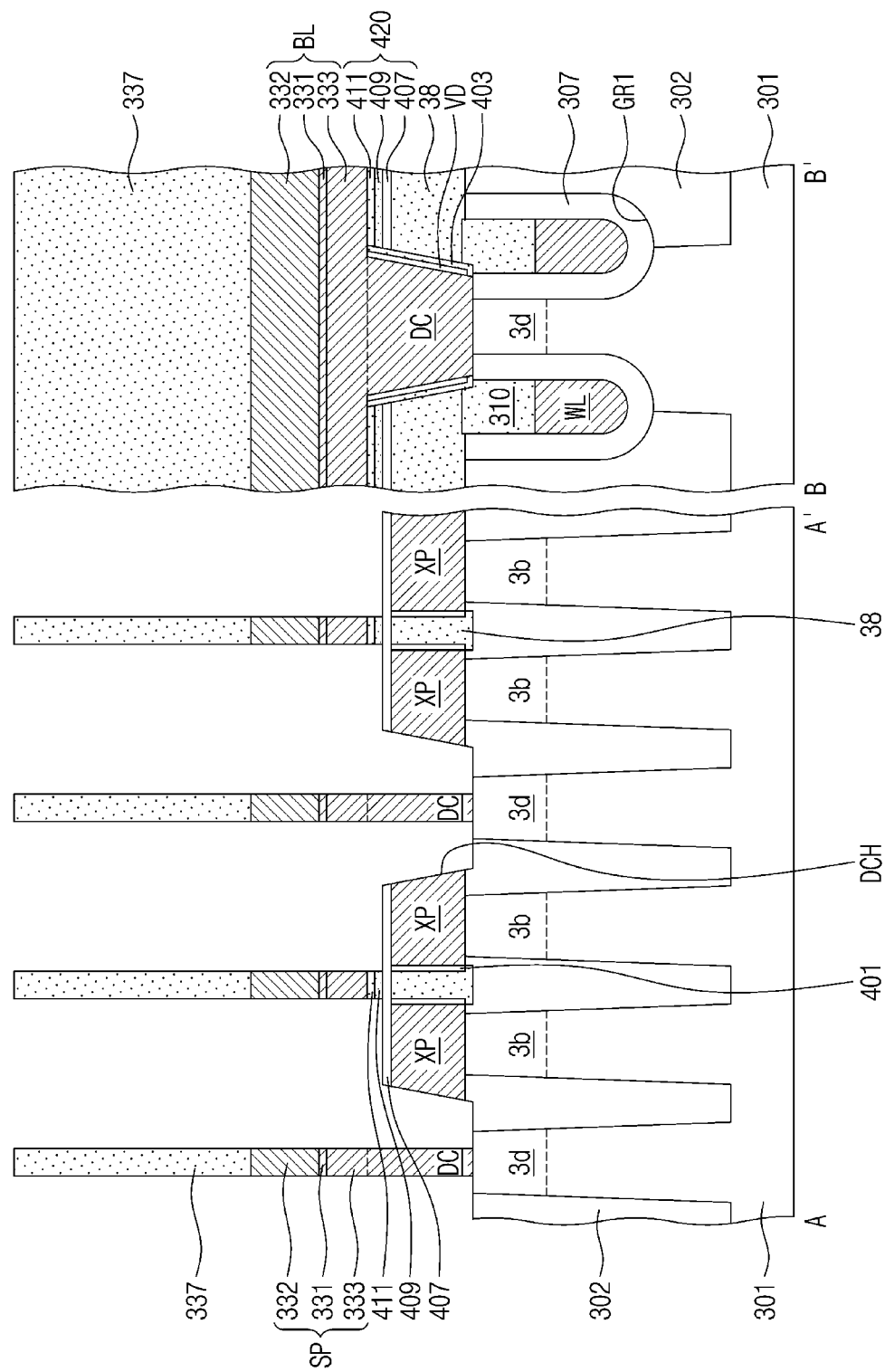

Referring to FIGS. 27C, 28A, and 28B, the bit-line capping layer 337L, the bit-line wire layer 332L, the bit-line diffusion barrier layer 331L, and the polysilicon layer 333L may be sequentially etched to expose a top surface of the interlayer dielectric layer 420 and simultaneously to form a bit-line capping pattern 337 and a bit line BL. The bit line BL may be provided thereunder with a preliminary bit-line contact 333p that fills the contact hole DCH. A first protective spacer 413 and a second protective spacer 415 may be formed to sequentially cover a sidewall of the bit-line capping pattern 337 and a sidewall of the bit line BL. One of the first and second protective spacers 413 and 415 may include or may be formed of a material having etch selectivity with respect to the other of the first and second protective spacers 413 and 415. The second protective spacer 415 may include or may be formed of the same material as that of the sacrificial pattern 404. The first protective spacer 413 may include or may be formed of a material having etch selectivity with respect to the bit-line capping pattern 337 and the third interlayer dielectric layer 411. The first protective spacer 413 may include or may be formed of, for example, SiOC.

Referring to FIGS. 28A, 28B, 29A, and 29B, the sacrificial pattern 404 may be removed to form a void region VD between the preliminary bit-line contact 333p and a first contact dielectric pattern 403. At this step, the second protective spacer 415 may also be removed which is formed of the same material as that of the sacrificial pattern 404. Therefore, the second protective spacer 415 may have an exposed sidewall. The first protective spacer 413 may protect the bit-line capping pattern 337 and the bit line BL. The void region VD may also be formed below the bit line BL.

Referring to FIGS. 29A, 29B, 30A, and 30B, the first protective spacer 413 may be removed. An etching process may be performed in which the bit-line capping pattern 337 may be used as an etching mask to etch the preliminary bit-line contact 333p to form a bit-line contact DC. An etchant that etches the preliminary bit-line contact 333p may be easily introduced through the void region VD into the contact hole DCH, and thus the bit-line contact DC may be formed to have a width that is uniform regardless of height. When the etching process is performed, the first contact dielectric pattern 403 may protect the storage node pad XP from being etched. The etching process may remove the first contact dielectric pattern 403 that covers a lateral surface of the storage node pad XP. In some embodiments, the first contact dielectric pattern 403 may remain on the lateral surface of the storage node pad XP. A structure of FIG. 22B may be formed. In the etching process, the third and second interlayer dielectric layers 411 and 409 of the interlayer dielectric layer 420 may be etched to expose a top surface of the first interlayer dielectric layer 407.

Figure 31A:
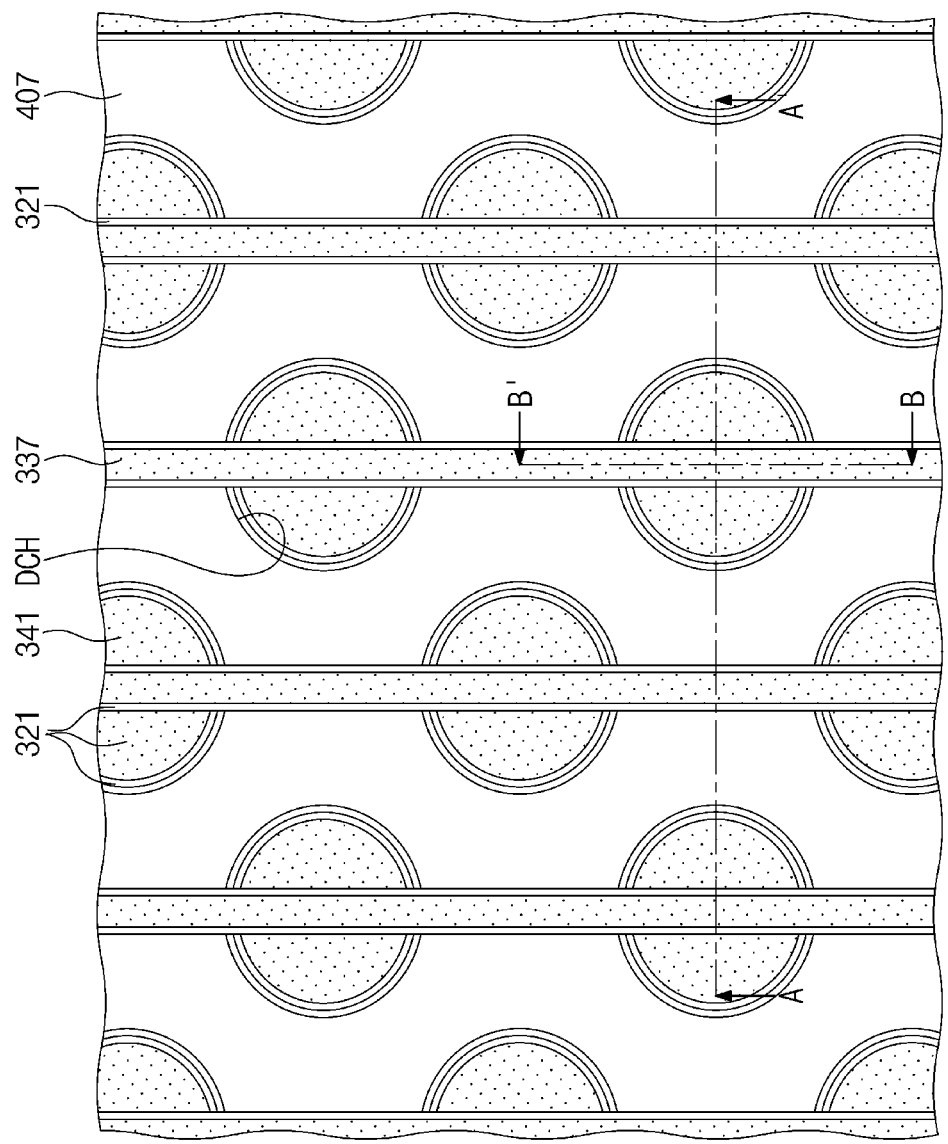
Figure 31B:
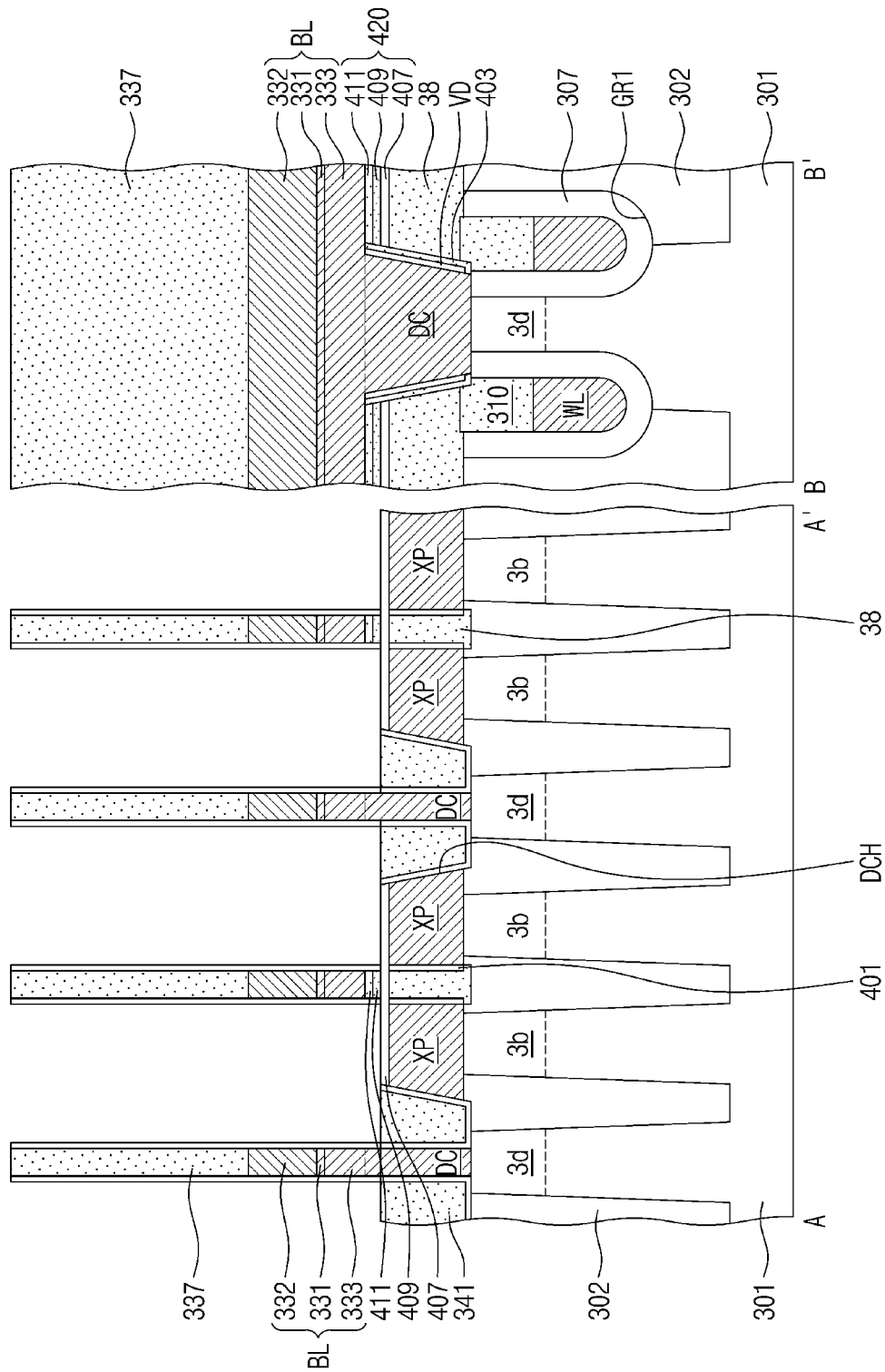

Referring to FIGS. 31A and 31B, a spacer liner 321 may be conformally formed on the entire surface of the substrate 301. A portion of the spacer liner 321 may fill the void region VD below the bit line BL to constitute a second contact dielectric pattern 405. A buried dielectric layer (not shown) may be formed on the spacer liner 321 to fill the contact hole DCH. The buried dielectric layer may undergo an etch-back process to form a buried dielectric pattern 341 in the contact hole DCH.

Figure 32A:
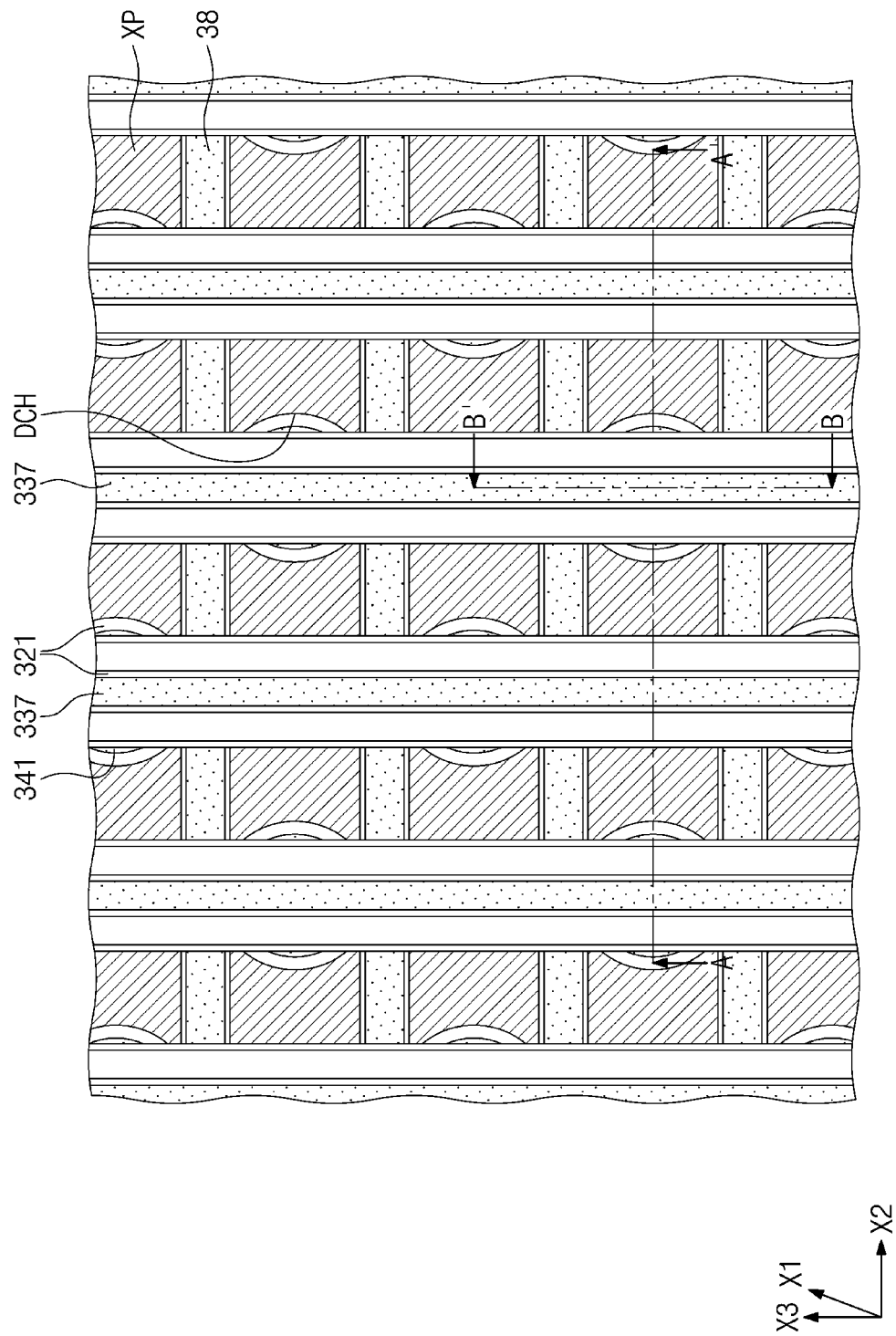
Figure 32B:
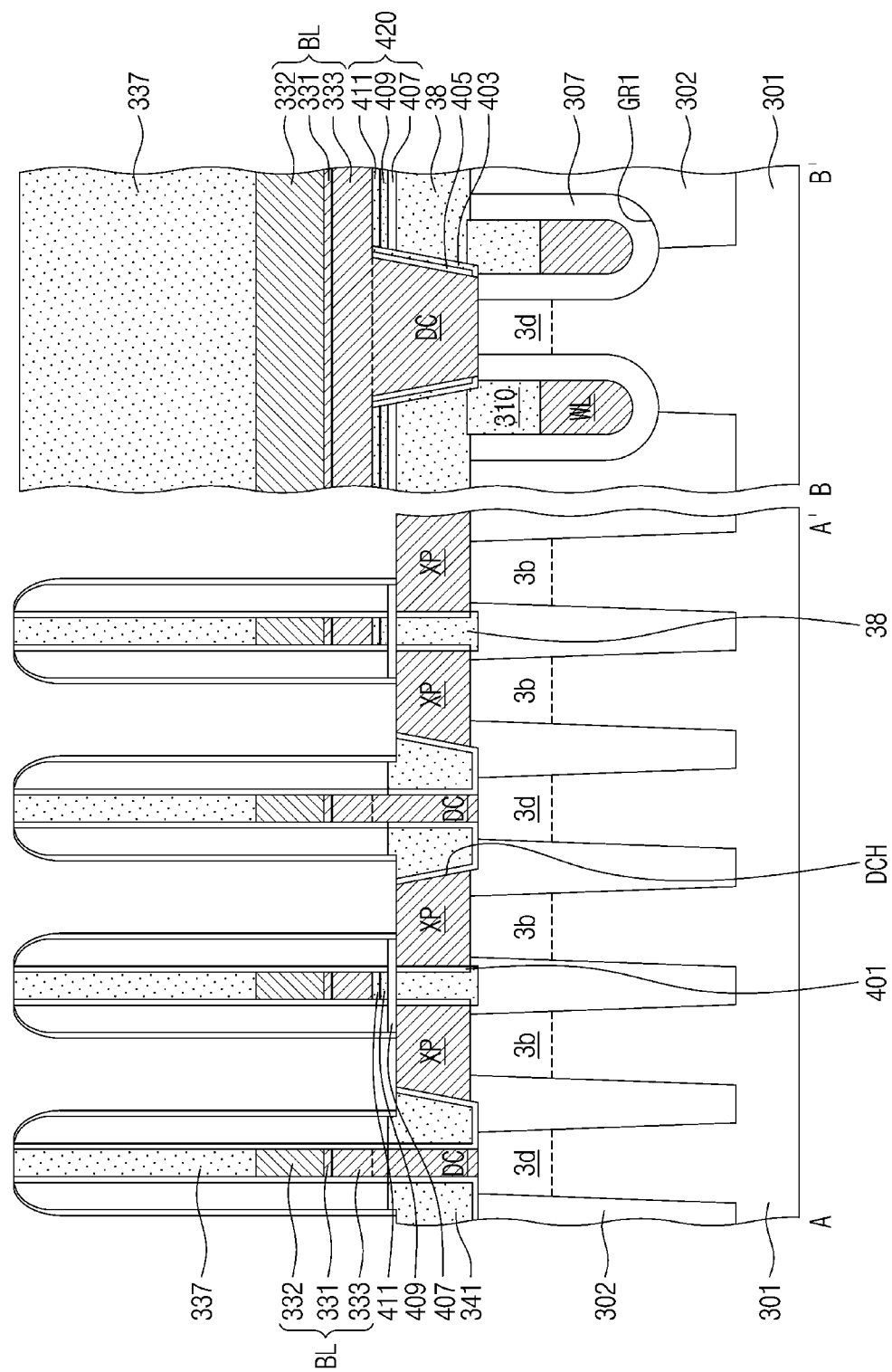

Referring to FIGS. 32A and 32B, a first spacer layer may be conformally formed on the entire surface of the substrate 301, and then the first spacer layer may be etched back to form a first spacer 323 that covers a sidewall of the spacer liner 321. At this step, the first interlayer dielectric layer 407 may also be etched to expose top surfaces of the storage node pads XP. The buried dielectric pattern 341 and the spacer liner 321 may also be partially exposed. A second spacer layer may be conformally formed on the entire surface of the substrate 301, and then the second spacer layer may be etched back to form a second spacer 325 that covers a sidewall of the first spacer 323. Therefore, a bit-line spacer SP may be formed.

Figure 33A:
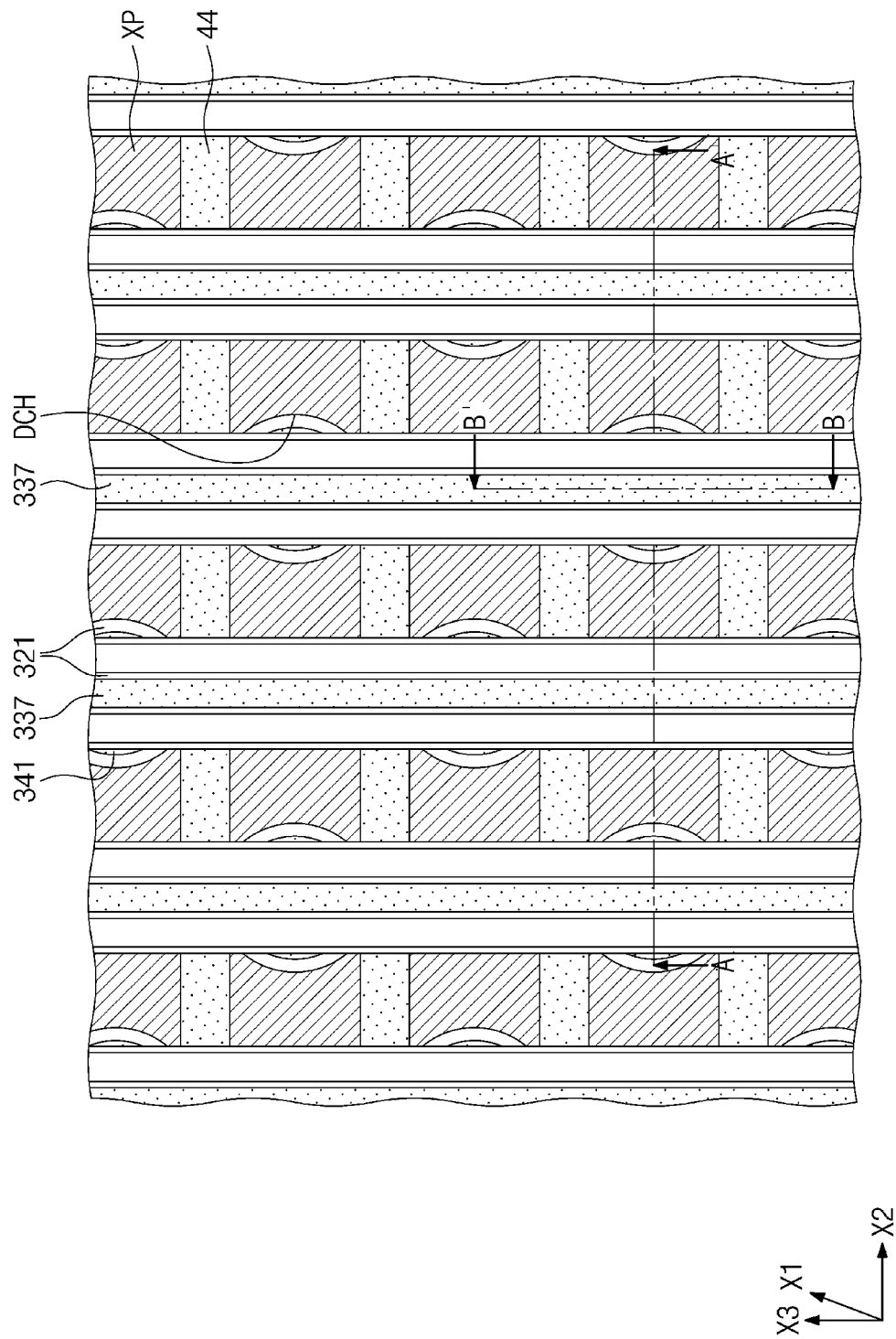
Figure 33B:
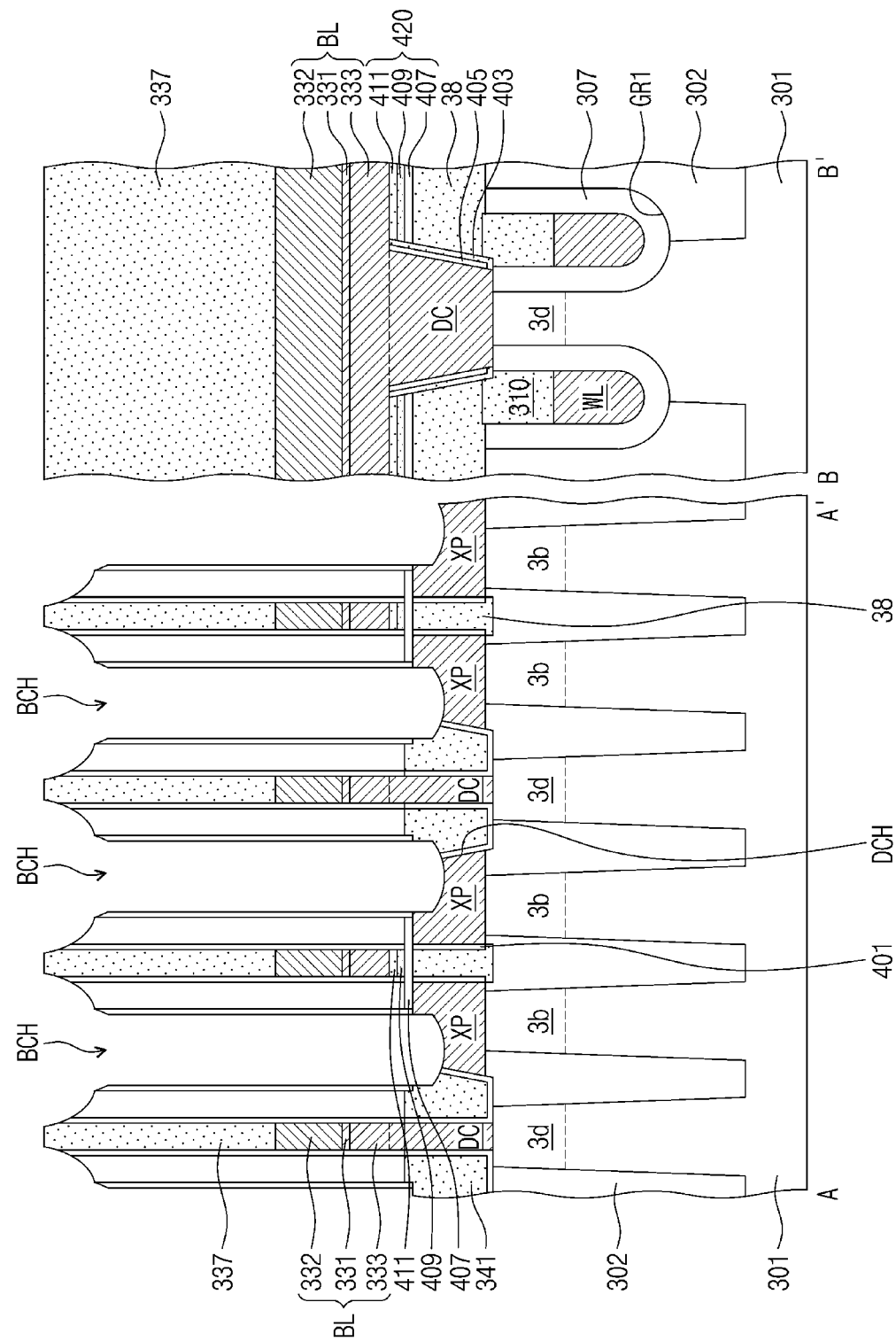

Referring to FIGS. 33A and 33B, sacrificial buried patterns 42 and node separation patterns 44 may be formed as discussed with reference to FIGS. 16A and 16B. The sacrificial buried patterns 42 may be removed to expose the buried dielectric patterns 341 and the storage node pads XP. An etching process may be performed to etch the buried dielectric pattern 341 and the storage node pad XP that are exposed between the bit lines BL to form a storage nod contact hole BCH that exposes the storage node pad XP. Subsequent processes may be identical or similar to those discussed with reference to FIGS. 1A and 1B.

Figure 34A:
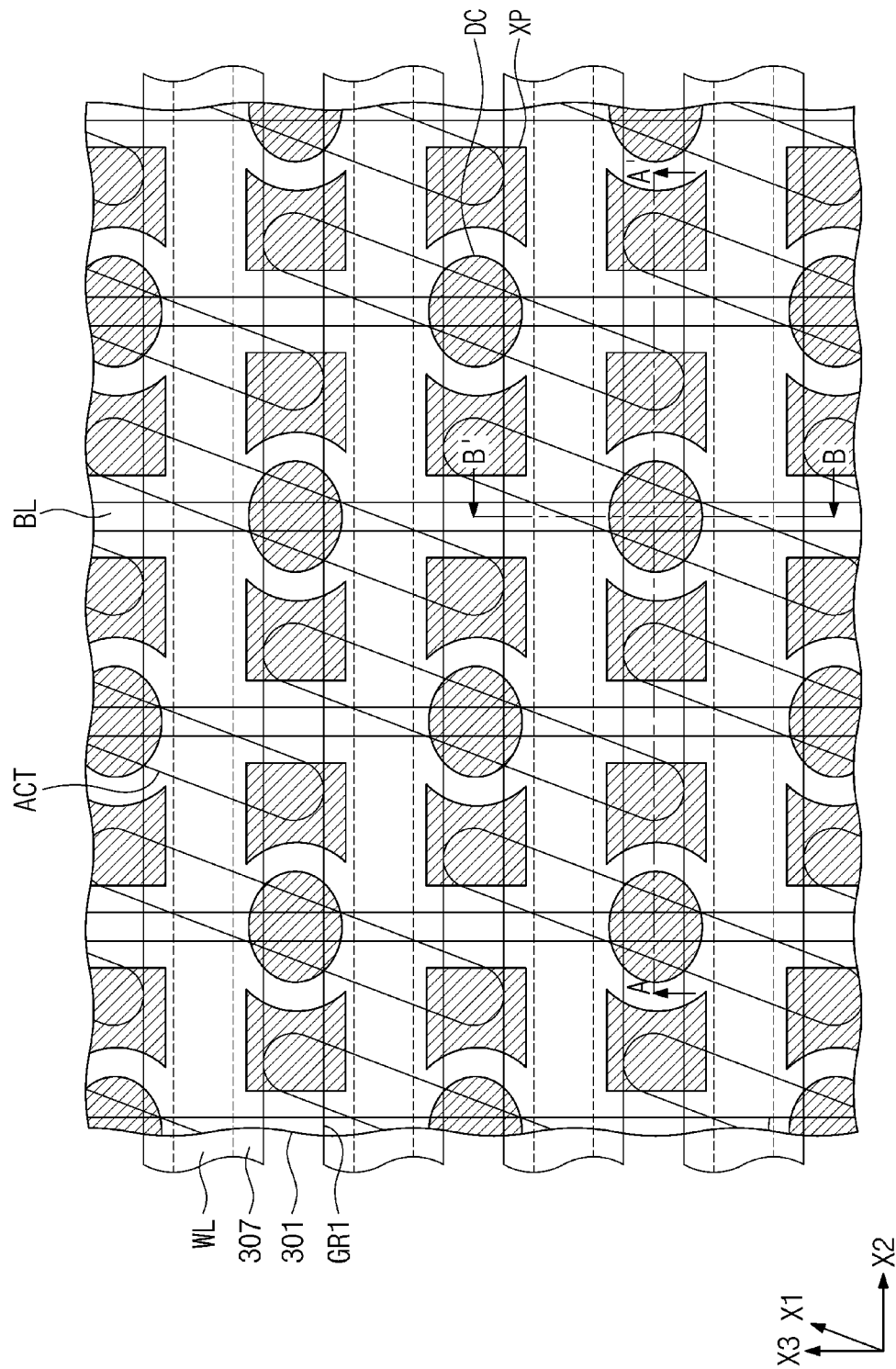
FIG. 34A illustrates a plan view showing a semiconductor memory device according to some embodiments of the present inventive concepts.
Figure 34B:
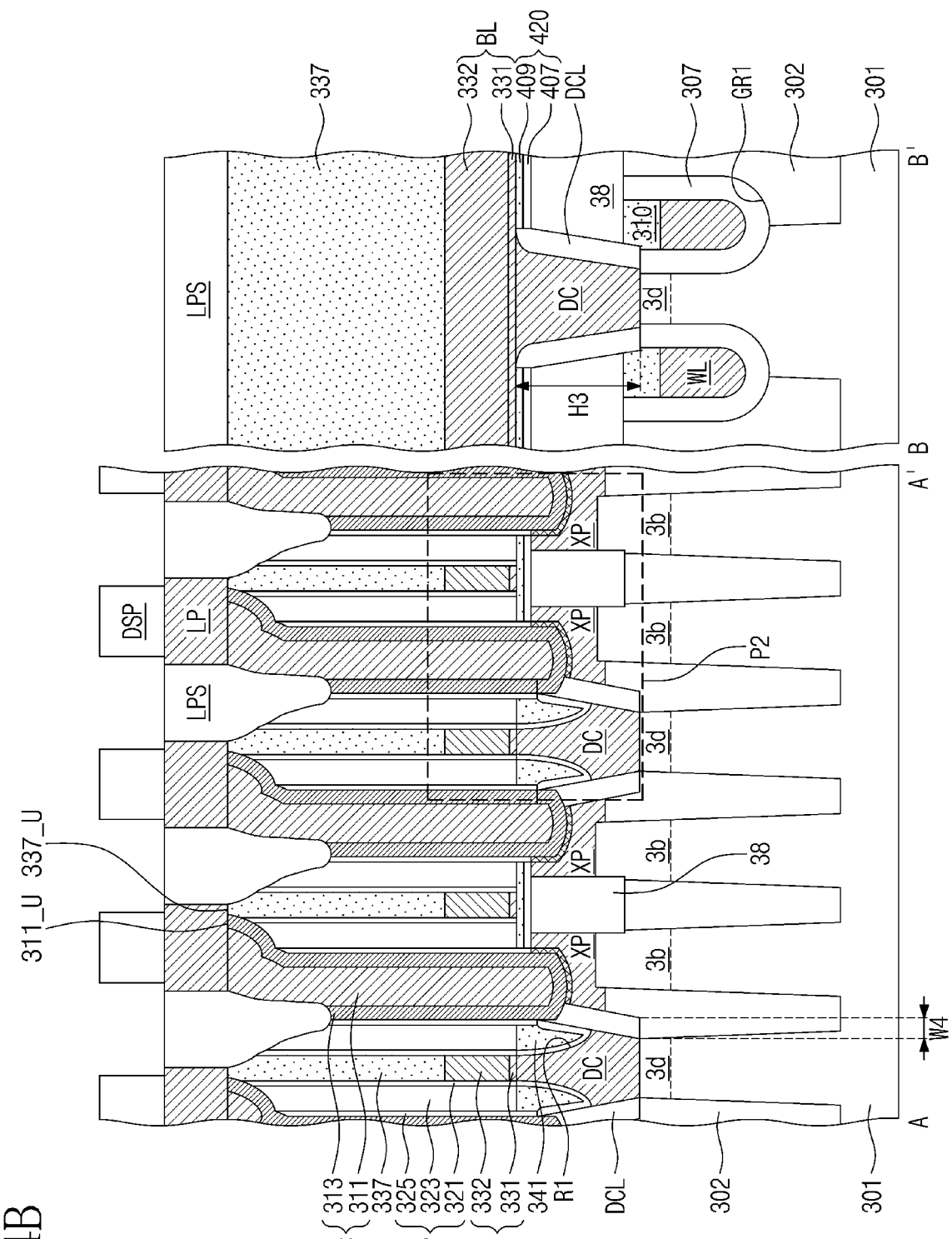
FIG. 34B illustrates a cross-sectional view taken along lines A-A' and B-B' of FIG. 34A.
Figure 35:
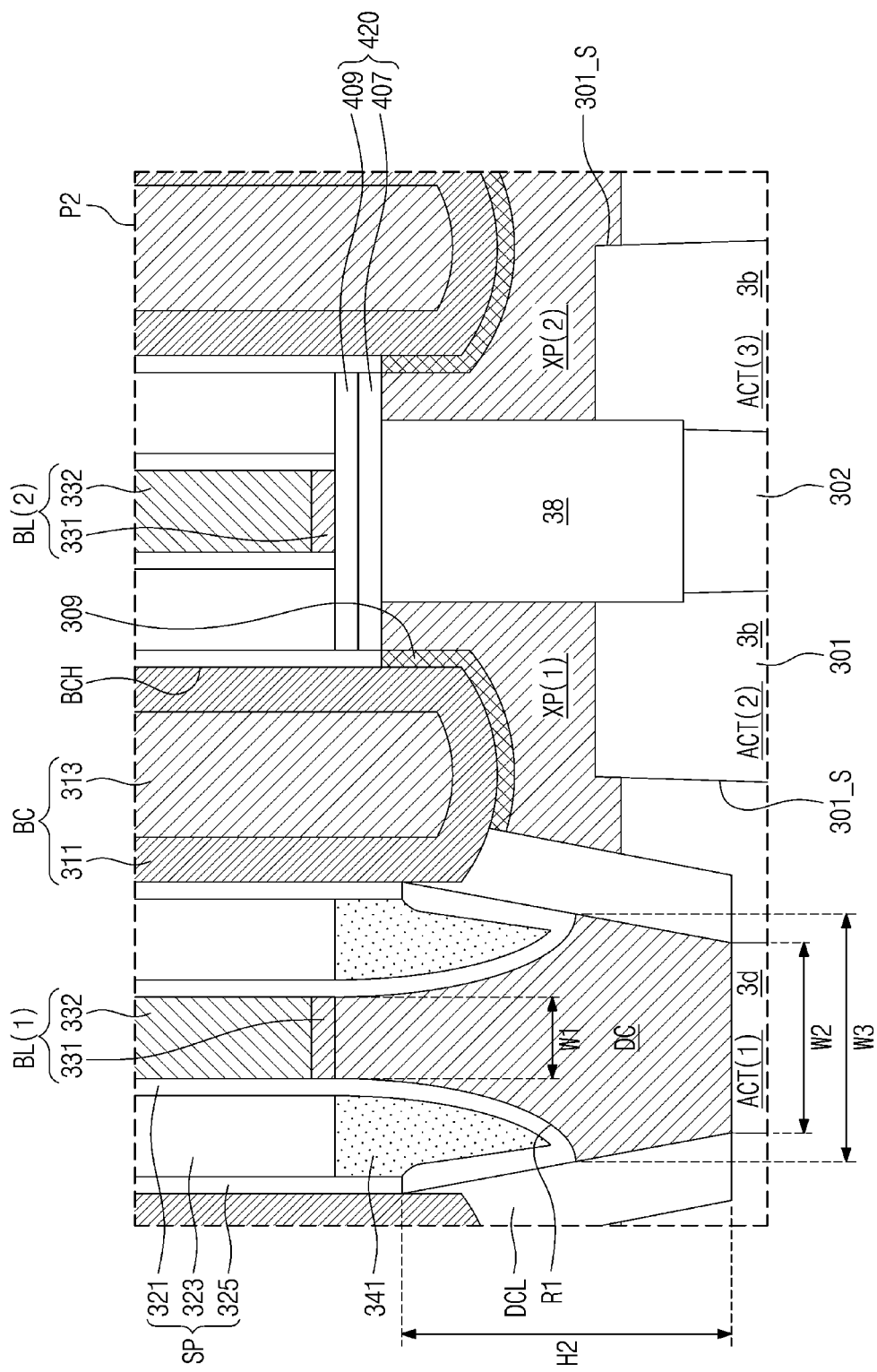
FIG. 35 illustrates an enlarged view showing section P2 of FIG. 34B.

FIG. 34A illustrates a plan view showing a semiconductor memory device according to some embodiments of the present inventive concepts. The landing pad LP is omitted from FIG. 34A. FIG. 34B illustrates a cross-sectional view taken along lines A-A' and B-B' of FIG. 34A. FIG. 35 illustrates an enlarged view showing section P2 of FIG. 34B.

Referring to FIGS. 34A, 34B, and 35, the bit-line contact DC may have a circular or oval shape when viewed in plan. A planar size of the storage node pad XP may be slightly different from that of the storage node pad XP discussed with reference to FIG. 1A. A shape of the storage node pad XP may be similar to that of the storage node pad XP discussed with reference to FIG. 1A.

Figure 37A:
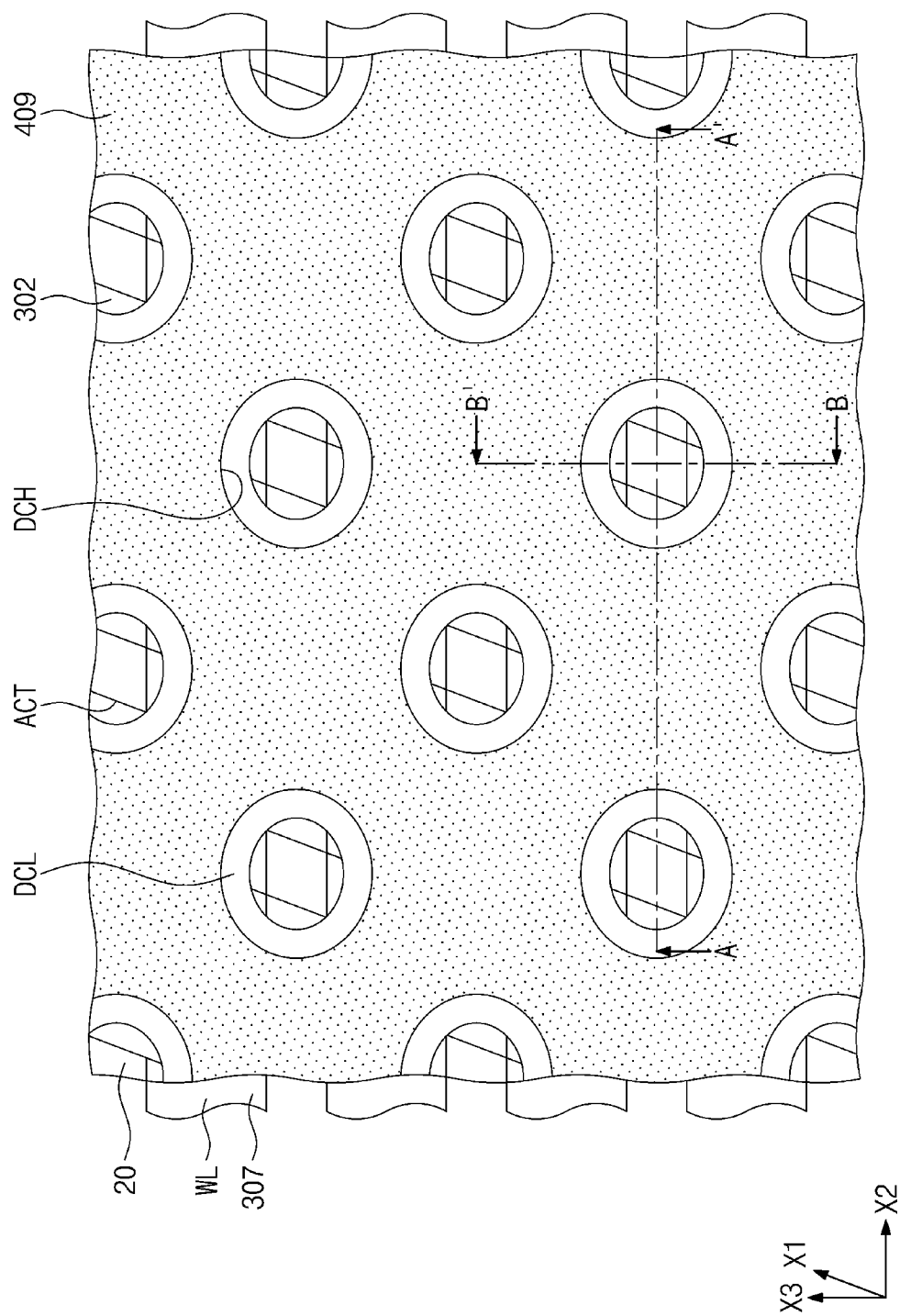

The contact dielectric pattern DCL may be interposed between the bit-line contact DC and the storage node pad XP. The contact dielectric pattern DCL may have a ring shape when viewed in plan as shown in FIG. 37A. The contact dielectric pattern DCL may surround the bit-line contact DC. The contact dielectric pattern DCL may have a second height H2 on a side of the bit line BL. Below the bit line BL, the contact dielectric pattern DCL may have a third height H3 greater than the second height H2.

The contact dielectric pattern DCL may include or may be formed of a material whose dielectric constant is less than that of silicon nitride. The contact dielectric pattern DCL with such small dielectric constant may be interposed between the bit-line contact DC and the storage node pad XP, which configuration may suppress BBD defects. The contact dielectric pattern DCL may have a fourth width W4. A value of about 4 nm to about 10 nm may be given as the fourth width W4 appropriate for suppressing BBD defects. If the contact dielectric pattern DCL may have width less than 4 nm, a coupling between the bit-line contact DC and the storage node pad XP increases such that BBD defects may occur. If the contact dielectric pattern DCL may have width greater than 10 nm, a width of the bit-line contact DC is to be narrower, which increases resistance of the bit-line contact DC.

An upper portion of the bit-line contact DC may have a first width W1. A lower portion of the bit-line contact DC may have a second width W2 greater than the first width W1. An intermediate portion of the bit-line contact DC may have a third width W3 greater than the second width W2. In some embodiment, a top surface of the bit-line contact DC may have the first width W1, and a bottom surface of the bit-line contact DC may have the second width W2. The intermediate portion of the bit-line contact DC may be a portion between the top and bottom surfaces of the bit-line contact DC, and the third width W3 may be greater than the second width W2.

The contact dielectric pattern DCL may extend to adjoin to a side of the upper portion of the bit-line contact DC. The buried dielectric pattern 341 may be interposed between the contact dielectric pattern DCL and the upper portion of the bit-line contact DC. The buried dielectric pattern 341 may have a width that decreases in a downward direction. For example, the buried dielectric pattern 341 may have a downwardly decreasing width.

The bit-line contact DC may have a bottom surface lower than those of the storage node pads XP. The bit-line contact DC may have a top surface higher than that of the pad separation pattern 38. The first storage node pad XP(1) may be in contact with one sidewall 301_S of the second active section ACT(2). A second storage node pad XP(2) may be in contact with one sidewall 301_S of the third active section ACT(3).

The interlayer dielectric layer 420 may be interposed between the pad separation pattern 38 and the bit line BL. The interlayer dielectric layer 420 may include first and second interlayer dielectric layers 407 and 409 that are sequentially stacked. The first and second interlayer dielectric layers 407 and 409 may include materials different from each other. For example, the first interlayer dielectric layer 407 may include or may be formed of silicon oxide. The second interlayer dielectric layer 409 may include or may be formed of silicon nitride. The interlayer dielectric layer 420 may have a sidewall aligned with that of the first spacer 323. Other configurations may be identical or similar to those discussed with reference to FIGS. 1A to 3B.

Figure 36A:
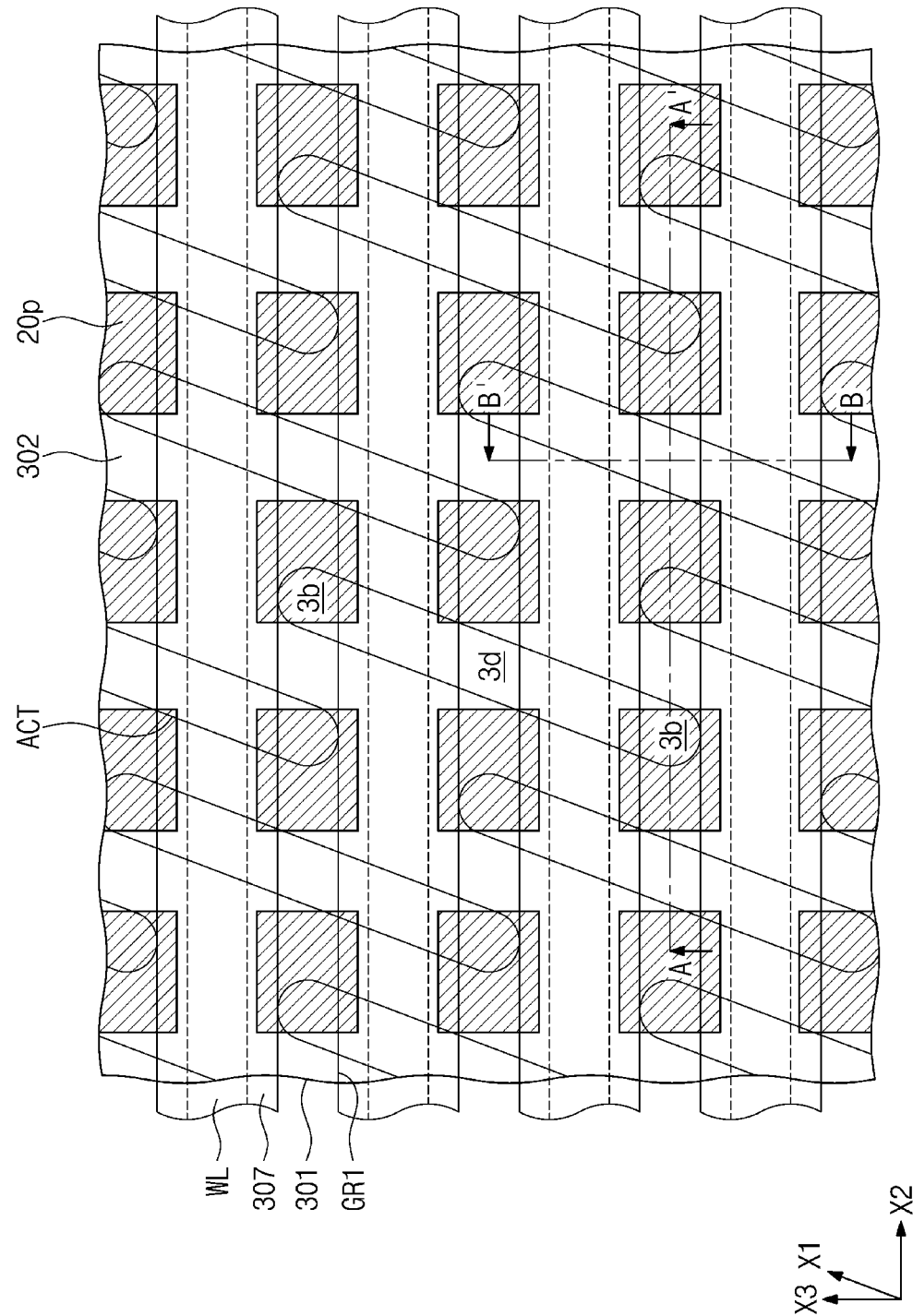
FIGS. 36A and 37A illustrate plan views showing a method of fabricating a semiconductor memory device having the plan view of FIG. 34A.
Figure 36B:
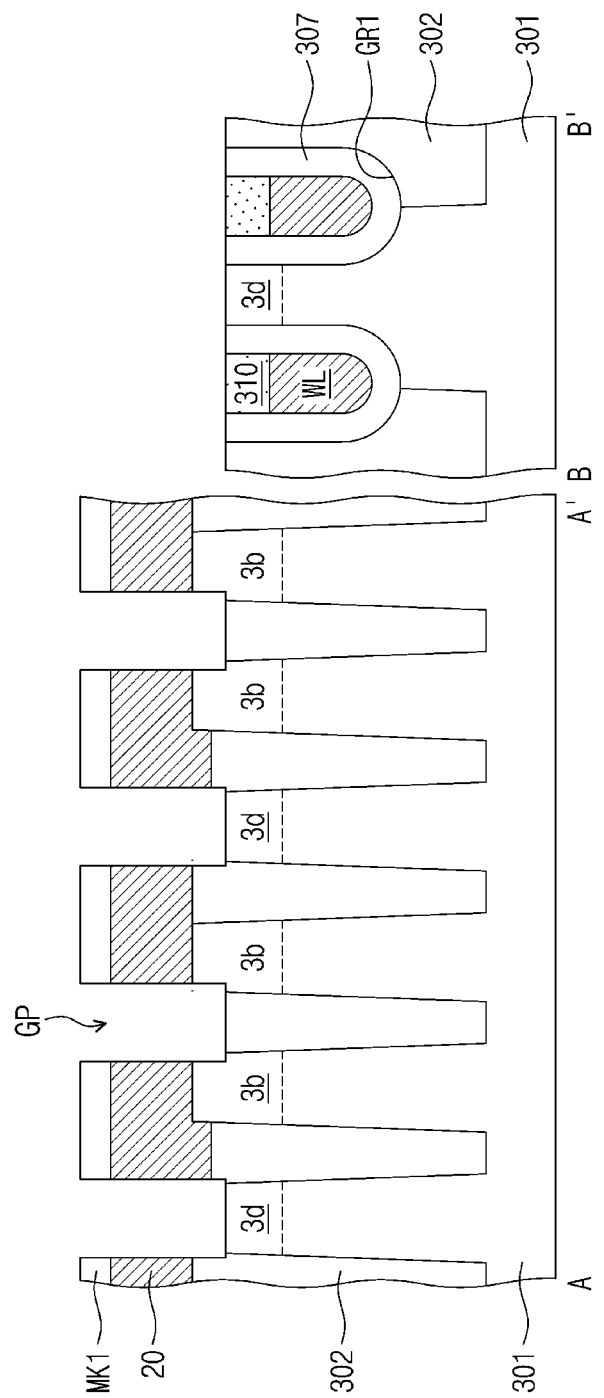
FIGS. 36B, 36C, and 37B to 37F illustrate cross-sectional views showing a method of fabricating a semiconductor memory device having the cross-sectional view of FIG. 34B.

FIGS. 36A and 37A illustrate plan views showing a method of fabricating a semiconductor memory device having the plan view of FIG. 34A. FIGS. 36B, 36C, and 37B to 37F illustrate cross-sectional views showing a method of fabricating a semiconductor memory device having the cross-sectional view of FIG. 34B. FIGS. 36B and 37B correspond to cross-sectional views taken along lines A-A' and B-B' of FIGS. 36A and 36A, respectively.

Referring to FIGS. 36A and 36B, as discussed in FIG. 4C, a process may be performed in which an upper portion of the device isolation pattern 302 is selectively removed to form a conductive layer 20 on an entire surface of the substrate 301 in a state that the sidewalls 301_S of the active sections ACT (or of the substrate 301) is exposed. Mask patterns MK1 may be formed on the conductive layer 20. The mask patterns MK1 may be used as an etching mask to etch the conductive layer 20 to form conductive patterns 20p and a gap region GP between the conductive patterns 20p. The etching process may partially etch the device isolation pattern 302 and the substrate 301. A planar shape of the conductive pattern 20p may be identical or similar to that depicted in FIG. 24A, but a size or position of the conductive pattern 20p may be slightly different from that shown in FIG. 24A.

Figure 36C:
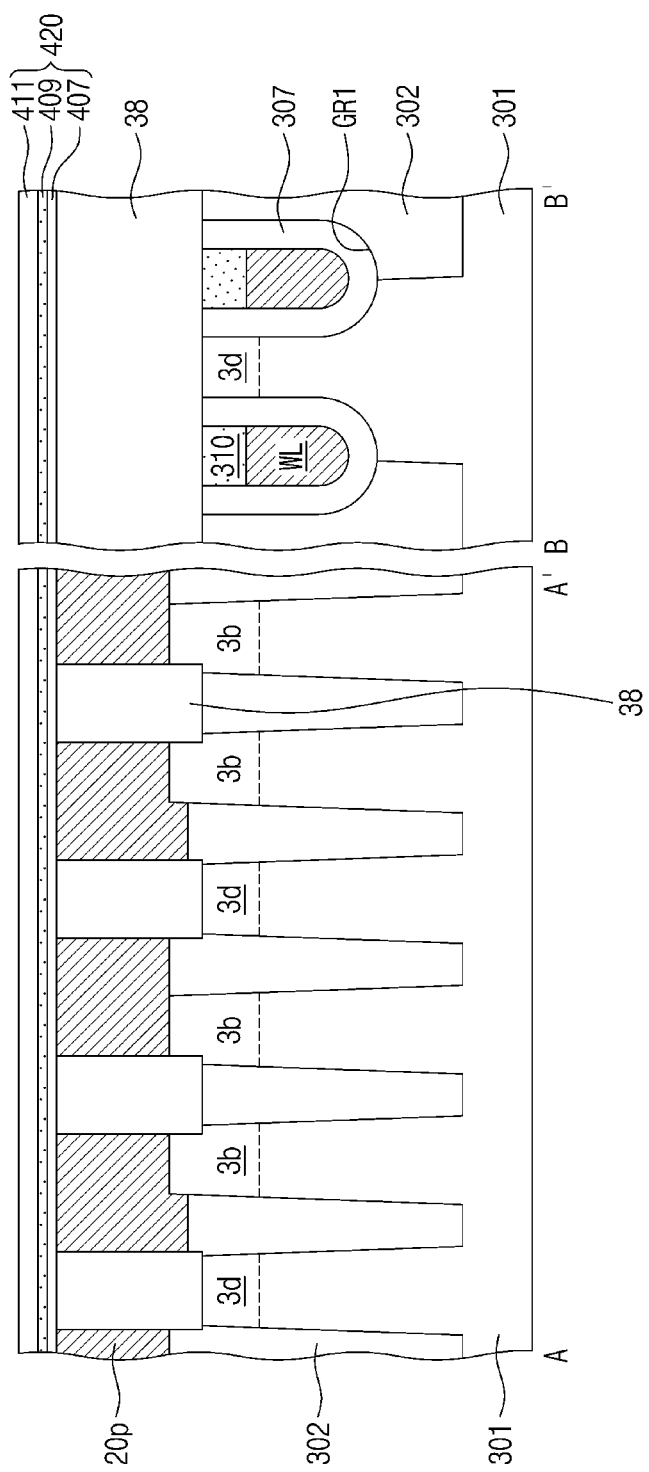
Figure 37B:
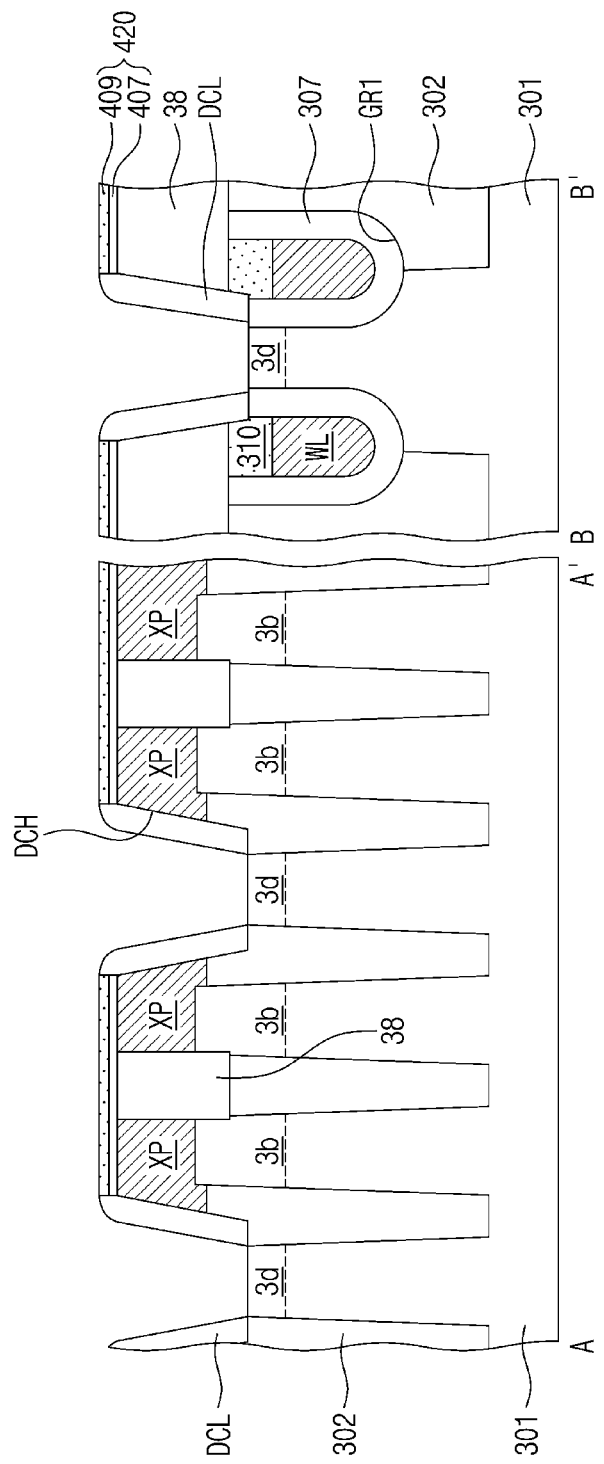

Referring to FIGS. 36B and 36C, a pad separation layer may be formed to fill the gap regions GP, and may then be etched back to form a pad separation pattern 38 in the gap regions GP. The pad separation pattern 38 may have a grid shape when viewed in plan. The pad separation pattern 38 may be formed of silicon nitride, silicon oxide, or silicon oxynitride. The pad separation pattern 38 may have a grid shape when viewed in plan.

The mask patterns MK1 may be removed to expose top surfaces of the conductive patterns 20p. An interlayer dielectric layer 420 may be formed on the conductive patterns 20p and the pad separation pattern 38. The interlayer dielectric layer 420 may include first, second, and third interlayer dielectric layers 407, 409, and 411 that are sequentially stacked. For example, the first interlayer dielectric layer 407 and the third interlayer dielectric layer 411 may include or may be formed of silicon oxide, and the second interlayer dielectric layer 409 may include or may be formed of silicon nitride.

Referring to FIGS. 36C, 37A, and 37B, the pad separation pattern 38 and the interlayer dielectric layers 420 on the first impurity regions 3d may be etched to form contact holes DCH that expose the first impurity regions 3d. At this step, the conductive patterns 20p adjacent to the pad separation pattern 38 may also be partially etched to form storage node pads XP. A contact dielectric layer may be conformally formed on an entire surface of the substrate 301, and then an anisotropic etching process may be performed in which the contact dielectric layer may be anisotropically etched to form contact dielectric patterns DCL in the contact holes DCH and to expose the first impurity regions 3d. The anisotropic etching process may remove the third interlayer dielectric layer 411 and to expose a top surface of the second interlayer dielectric layer 409. The contact dielectric pattern DCL may include or may be formed of, for example, silicon oxide.

Figure 37C:
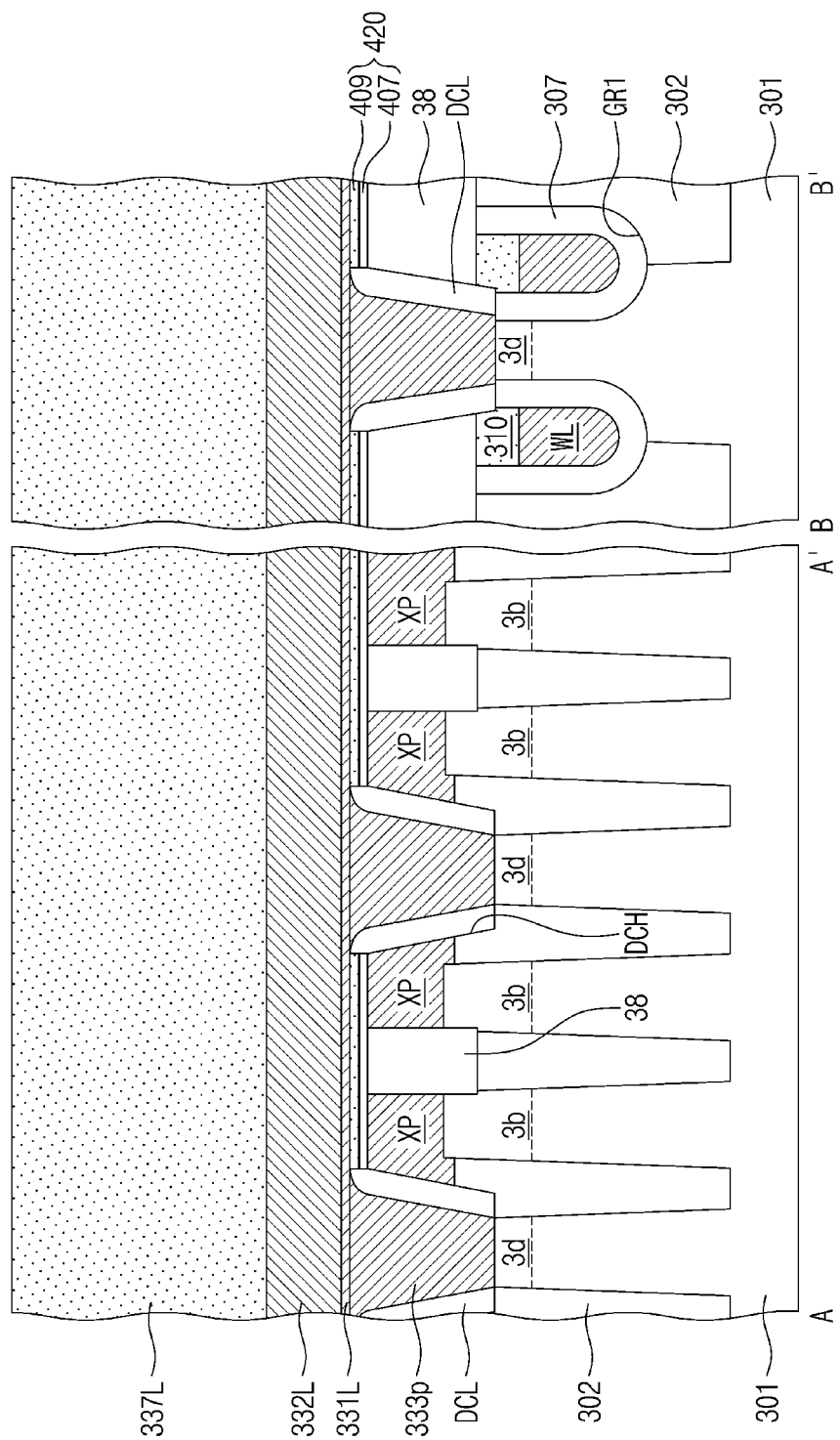

Referring to FIG. 37C, a polysilicon layer may be formed to fill the contact holes DCH, and may then be etched back to expose the top surface of the second interlayer dielectric layer 409 and simultaneously to form preliminary bit-line contacts 333p in the contact holes DCH. A bit-line diffusion barrier layer 331L, a bit-line wire layer 332L, and a bit-line capping layer 337L may be sequentially formed on the entire surface of the substrate 301.

Figure 37D:
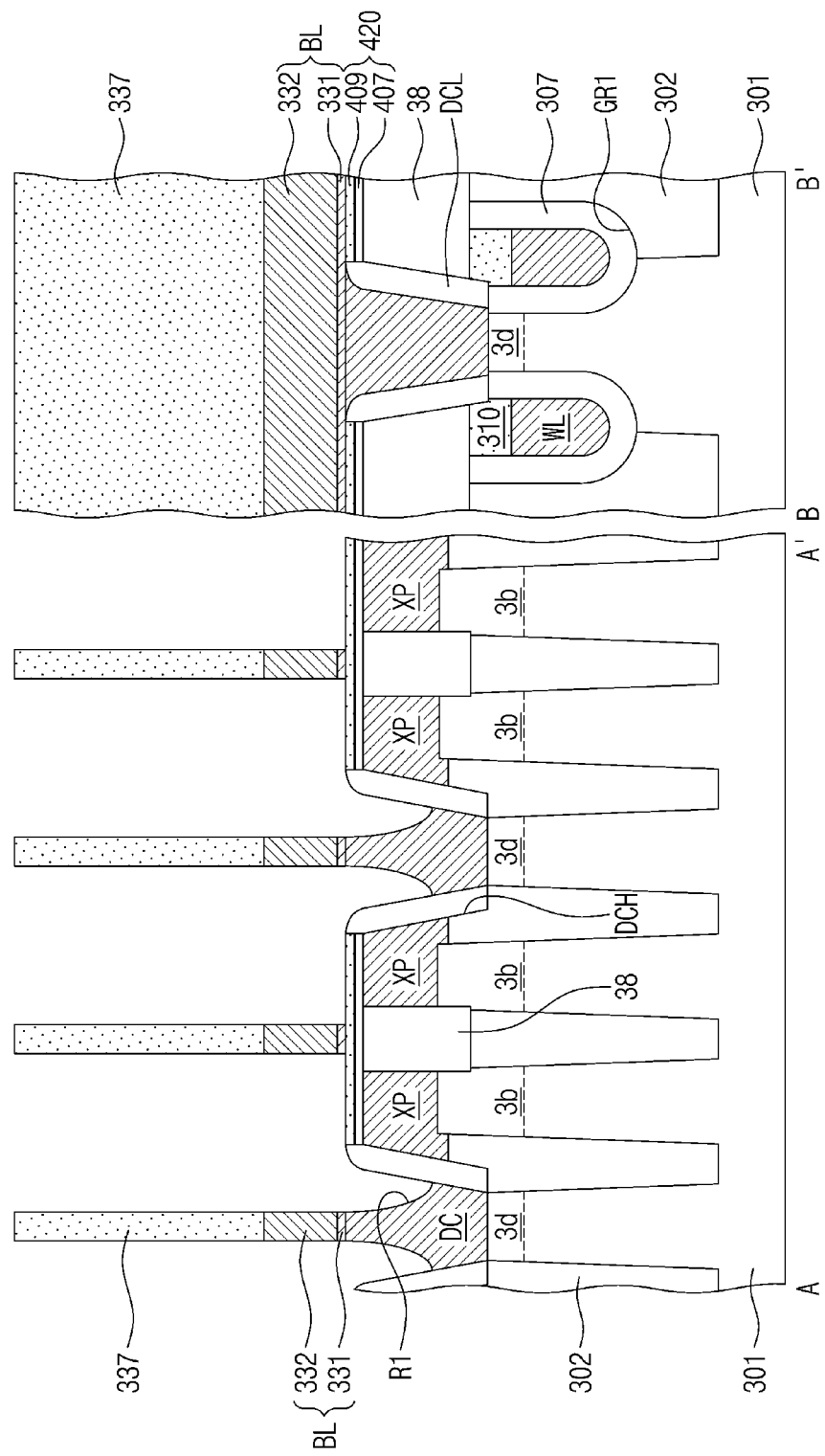

Referring to FIGS. 37C and 37D, the bit-line capping layer 337L, the bit-line wire layer 332L, and the bit-line diffusion barrier layer 331L may be sequentially etched to expose a top surface of the interlayer dielectric layer 420 and simultaneously to form a bit-line capping pattern 337 and a bit line BL. The preliminary bit-line contact 333p may be etched to form a bit-line contact DC below the bit line BL. At this step, on a side of the bit line BL, the bit-line contact DC may be formed to have a lower portion in contact with the contact dielectric pattern DCL. A recess region R1 may be formed on a side of the bit-line contact DC.

Figure 37E:
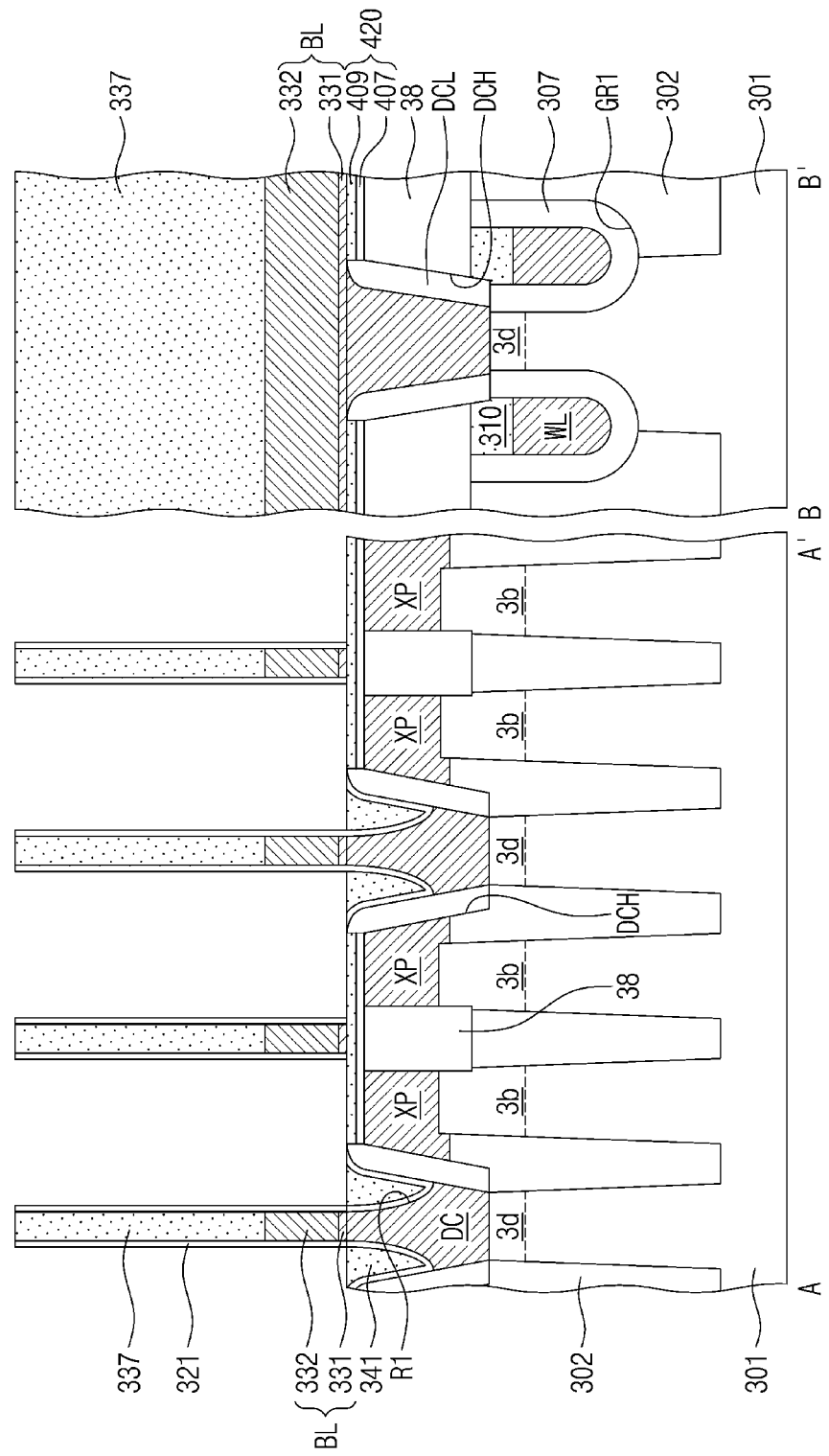

Referring to FIGS. 37D and 37E, a spacer liner 321 may be conformally formed on the entire surface of the substrate 301. A buried dielectric layer (not shown) may be formed on the spacer liner 321 to fill the recess region R1. The buried dielectric layer may undergo an etch-back process to form a buried dielectric pattern 341 in the contact hole DCH.

Figure 37F:
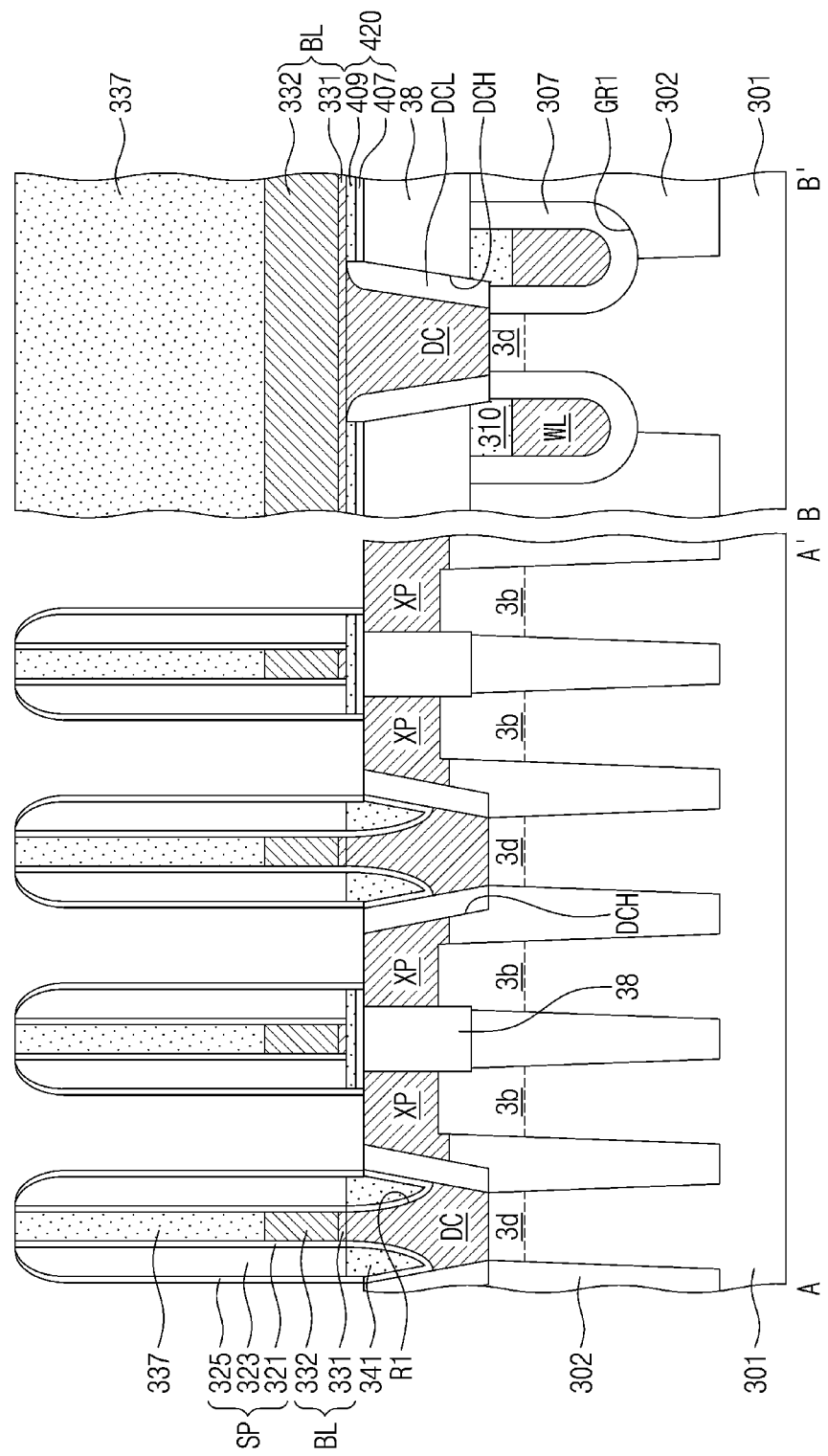

Referring to FIGS. 37E and 37F, a first spacer layer may be conformally formed on the entire surface of the substrate 301, and may then be etched back to form a first spacer 323 that covers a sidewall of the spacer liner 321. At this step, the interlayer dielectric layer 420 may also be etched to expose top surfaces of the storage node pads XP. The buried dielectric pattern 341 may also be partially exposed. A second spacer layer may be conformally formed on the entire surface of the substrate 301, and then the second spacer layer may be etched back to form a second spacer 325 that covers a sidewall of the first spacer 323. Therefore, a bit-line spacer SP may be formed. Subsequent processes may be identical or similar to those discussed with reference to FIGS. 33A, 33B, 1A, and 1B.

A semiconductor memory device according to the present inventive concepts may be configured such that an ohmic layer is rounded at its bottom surface in contact with a storage node pad, and thus a contract area may be increased to reduce an electrical resistance. Therefore, it may be possible to suppress tRDL defects. A storage node contact adjacent to the storage node pad may not include polysilicon and include metal whose electrical resistance is low, and accordingly tRDL defects may be effectively suppressed.

In a semiconductor memory device according to the present inventive concepts, a substrate may protrude more than a device isolation pattern, and thus a contact area may be increased between the substrate and each of a bit-line pattern and a storage node pattern. Therefore, a contact resistance may be reduced, and the semiconductor memory device may operate at high speeds and low powers. A spacer liner that covers a sidewall of a bit line may include silicon dioxide, and thus a bit-line spacer may increase in insulating properties. As a result, the semiconductor memory device may increase in reliability.

For a semiconductor memory device according to some embodiments of the present inventive concepts, silicon oxide may be included in a contact dielectric pattern interposed between the storage node pad and a bit-line contact, and thus BBD defects may be suppressed. For a semiconductor memory device according to other embodiments of the present inventive concepts, the bit-line contact may have a width that is uniform regardless of height, and thus an interval between the bit-line contact and the storage node pad may be increased to suppress BBD defects.

In a method of fabricating a semiconductor memory device according to the present inventive concepts, a device isolation pattern may be etched to expose lateral surfaces of a substrate. Thus, a contact area may be increased between a bit-line pattern and the lateral surfaces of the substrate and between a storage node pattern and the lateral surfaces of the substrate. For this reason, a storage node contact may be formed to exclude polysilicon and to include metal, and accordingly a high-temperature annealing process may not be required, which may result in prevention of process defects. A storage node pad may be formed to have an area greater than that of a second impurity region, and a storage node contact hole may be formed to expose the storage node pad. Therefore, it may be possible to securely obtain a misalignment margin when the storage node contact hole is formed. In conclusion, process defects may be reduced.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor memory device, comprising:
    a device isolation pattern on a substrate and defining a first active section;
    a first storage node pad on the first active section;
    a word line in the substrate and extending across the first active section;
    a bit line on the first storage node pad and crossing over the word line;
    a storage node contact on one side of the bit line and adjacent to the first storage node pad; and
    an ohmic contact layer between the storage node contact and the first storage node pad,
    wherein a bottom surface of the storage node contact is rounded,
    wherein a bottom surface of the ohmic contact layer is rounded, and
    wherein the ohmic contact layer directly contacts the first storage node pad and directly contacts only a partial portion of the bottom surface of the storage node contact.

2. The semiconductor memory device of claim 1, further comprising:
    a second active section defined by the device isolation pattern and adjacent to the first active section;
    a second storage node pad on the second active section;
    a pad separation pattern between the first storage node pad and the second storage node pad; and
    a word-line capping pattern on the word line,
    wherein the pad separation pattern directly contacts a topmost surface of the word-line capping pattern.

3. The semiconductor memory device of claim 2, further comprising:
    a first subsidiary dielectric pattern between the first storage node pad and the pad separation pattern; and
    a second subsidiary dielectric pattern between the second storage node pad and the pad separation pattern,
    wherein the pad separation pattern is between the first subsidiary dielectric pattern and the second subsidiary dielectric pattern, and
    wherein each of the first subsidiary dielectric pattern and the second subsidiary dielectric pattern includes a material different from a material of the pad separation pattern.

4. The semiconductor memory device of claim 2, wherein the pad separation pattern contacts a top surface of the first storage node pad and a top surface of the second storage node pad.

5. The semiconductor memory device of claim 4, further comprising:
    a bit-line contact between the bit line and the second active section,
    wherein the second active section is below the bit line, and
    wherein a top surface of the bit-line contact is at a level that is the same as a level of a top surface of the pad separation pattern.

6. The semiconductor memory device of claim 2, wherein a topmost surface of the first storage node pad, a topmost surface of the second storage node pad, and a topmost surface of the pad separation pattern are at a same level as each other.

7. The semiconductor memory device of claim 2, wherein the bit line crosses over the pad separation pattern,
    wherein the semiconductor memory device further comprises:
        a first spacer that covers a sidewall of the bit line; and
        a first dielectric layer, a second dielectric layer, and a third dielectric layer that are sequentially interposed between the pad separation pattern and the bit line,
    wherein the first dielectric layer directly contacts the pad separation pattern,
    wherein the second dielectric layer and the third dielectric layers are between the first dielectric layer and the bit line,
    wherein a sidewalls of the second dielectric layer and a sidewall of the third dielectric layers are aligned with-a the sidewall of the bit line, and
    wherein a sidewall of the first dielectric layer is aligned with a sidewall of the first spacer.

8. The semiconductor memory device of claim 1, wherein the storage node contact is formed of a metal and a metal nitride.

9. The semiconductor memory device of claim 1, further comprising:
    a second active section defined by the device isolation pattern and adjacent to the first active section, the second active section being below the bit line; and
    a bit-line contact between the bit line and the second active section, wherein the device isolation pattern exposes a first lateral surface of the second active section of the substrate, and wherein the bit-line contact is in contact with the first lateral surface of the second active section.

10. The semiconductor memory device of claim 9, wherein the second active section of the substrate has a second lateral surface that is exposed by the device isolation pattern and is opposite to the first lateral surface, and
wherein the bit-line contact is further in contact with the second lateral surface of the second active section.

11. The semiconductor memory device of claim 1, further comprising:
a second active section defined by the device isolation pattern and adjacent to the first active section, the second active section being below the bit line; and
a bit-line contact between the bit line and the second active section,
wherein a bottom surface of the bit-line contact has a first width, and a top surface of the bit-line contact has a second width, the first width being greater than the second width.

12. The semiconductor memory device of claim 11, wherein an intermediate portion of the bit-line contact is a portion of the bit-line contact between the bottom surface of the bit-line contact and the top surface of the bit-line contact, and
wherein a third width of the intermediate portion of the bit-line contact is greater than the first width of the bottom surface of the bit-line contact.

13. The semiconductor memory device of claim 1, further comprising:
a second active section defined by the device isolation pattern and adjacent to the first active section, the second active section being below the bit line; and
a bit-line contact between the bit line and the second active section,
wherein a bottom end of the first storage node pad is at a level-a as same as or higher than a level of a bottom end of the bit-line contact.

14. The semiconductor memory device of claim 1, wherein the device isolation pattern exposes a first lateral surface of the first active section of the substrate, and
wherein the first storage node pad is in contact with the first lateral surface of the first active section.

15. The semiconductor memory device of claim 14, wherein the first active section of the substrate has a second lateral surface that is exposed by the device isolation pattern and is opposite to the first lateral surface of the first active section, and
wherein the first storage node pad is in contact with the second lateral surface of the first active section.

16. The semiconductor memory device of claim 1, further comprising:
a second active section defined by the device isolation pattern and adjacent to the first active section, the second active section being below the bit line;
a bit-line contact between the bit line and the second active section; and
a contact dielectric pattern between the first storage node pad and a lower portion of the bit-line contact,
wherein the contact dielectric pattern includes a material whose dielectric constant is less than a dielectric constant of silicon nitride.

17. The semiconductor memory device of claim 16, further comprising:

a buried dielectric pattern between the contact dielectric pattern and an upper portion of the bit-line contact,
wherein the buried dielectric pattern has a downwardly-decreasing width.

18. The semiconductor memory device of claim 16, wherein
wherein the contact dielectric pattern extends downwardly below the bit line,
wherein the contact dielectric pattern has a first height between the bit-line contact and the first storage node pad, and
wherein the contact dielectric pattern has a second height below the bit line, the second height being greater than the first height.

19. A semiconductor memory device, comprising:
a device isolation pattern on a substrate and defining a first active section;
a first storage node pad on the first active section;
a word line in the substrate and extending across the first active section;
a bit line on the first storage node pad and crossing over the word line;
a storage node contact on one side of the bit line and adjacent to the first storage node pad; and
an ohmic contact layer between the storage node contact and the first storage node pad,
wherein the storage node contact includes:
a contact metal pattern; and
a contact diffusion barrier pattern that surrounds a sidewall of the contact metal pattern and a bottom surface of the contact metal pattern,
wherein a bottom surface of the contact diffusion barrier pattern is rounded, and
wherein the ohmic contact layer directly contacts the first storage node pad and directly contacts only a partial portion of the bottom surface of the contact diffusion barrier pattern.

20. A semiconductor memory device, comprising:
at least one device isolation pattern on a substrate and defining a first active section, a second active section, and a third active sections that are adjacent to each other side by side in a first direction;
a first impurity region, a second impurity region, and a third impurity region on the first active section, the second active section, and the third active section, respectively;
a word line in the substrate and extending across the first and second active sections;
a word-line capping pattern on the word line;
a bit-line contact on the first active section;
a bit line on the bit-line contact and crossing over the word line;
a first storage node pad on the second active section;
a first ohmic contact layer on and directly contacts only a partial portion of a top surface of the first storage node pad;
a second storage node pad on the third active section;
a second ohmic contact layer on and directly contacts only a partial portion of a top surface of the second storage node pad;
a pad separation pattern between the first storage node pad and the second storage node pad;
a buried dielectric pattern between the first storage node pad and an upper portion of the bit-line contact; and
a contact dielectric pattern between the first storage node pad and a lower portion of the bit-line contact, wherein the contact dielectric pattern includes a material whose dielectric constant is less than a dielectric constant of silicon nitride, and wherein the contact dielectric pattern has a width between about 4 nm and about 10 nm.

\* \* \* \* \*